United States Patent
Shen et al.

(10) Patent No.: US 7,062,700 B2
(45) Date of Patent: Jun. 13, 2006

(54) 16 QAM AND 16 APSK TTCM (TURBO TRELLIS CODED MODULATION) WITH MINIMUM BANDWIDTH EFFICIENCY OF 3 BIT/S/HZ USING A RATE 2/4 CONSTITUENT ENCODER

(75) Inventors: Ba-Zhong Shen, Irvine, CA (US); Kelly Brian Cameron, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 319 days.

(21) Appl. No.: 10/636,008

(22) Filed: Aug. 7, 2003

(65) Prior Publication Data

US 2004/0261003 A1   Dec. 23, 2004

Related U.S. Application Data

(63) Continuation-in-part of application No. 10/264,486, filed on Oct. 4, 2002.

(60) Provisional application No. 60/480,519, filed on Jun. 20, 2003, provisional application No. 60/384,698, filed on May 31, 2002.

(51) Int. Cl.
    *H03M 13/03*   (2006.01)

(52) U.S. Cl. .................................. 714/792; 375/265

(58) Field of Classification Search ........ 714/790–792, 714/796, 786, 755; 375/265, 295, 298, 316, 375/279, 308, 329; 370/412, 465
    See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,534,828 A * | 7/1996 | Okada et al. | ............... 332/103 |
| 5,563,897 A | 10/1996 | Pyndiah et al. | |
| 5,949,796 A * | 9/1999 | Kumar | ...................... 370/529 |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,865,188 B1 * | 3/2005 | Stirling et al. | .............. 370/460 |

FOREIGN PATENT DOCUMENTS

| | | |
|---|---|---|
| EP | 0 735 696 A2 | 10/1996 |
| EP | 0 735 696 A3 | 1/1999 |
| FR | 91 05278 A1 | 10/1992 |

* cited by examiner

*Primary Examiner*—Guy J. Lamarre
(74) *Attorney, Agent, or Firm*—Garlick Harrison & Markison LLP; Shayne X. Short

(57) ABSTRACT

16 QAM (Quadrature Amplitude Modulation) and 16 APSK (Asymmetric Phase Shift Keying) TTCM (Turbo Trellis Coded Modulation) with minimum bandwidth efficiency of 3 bit/s/Hz (bits per second per Hertz) using a rate 2/4 constituent encoder. Various encoder designs are presented that are operable to generate a signal whose modulation may vary as frequently as on a symbol by symbol basis while providing relatively very high throughput. Rate control sequences including RCs (Rate Controls), arranged in a period, govern the manner in which symbols of a signal are generated. The RCs correspond to various modulations that may each have a unique constellation and corresponding mapping. Different RCs may be included within a rate control sequence that correspond to 16 QAM, 16 APSK, QPSK (Quadrature Phase Shift Key), or even other modulation types. In addition, 1 or more uncoded bits may be used to generate the symbols of the coded signal.

57 Claims, 36 Drawing Sheets

HDTV (High Definition Television) communication system

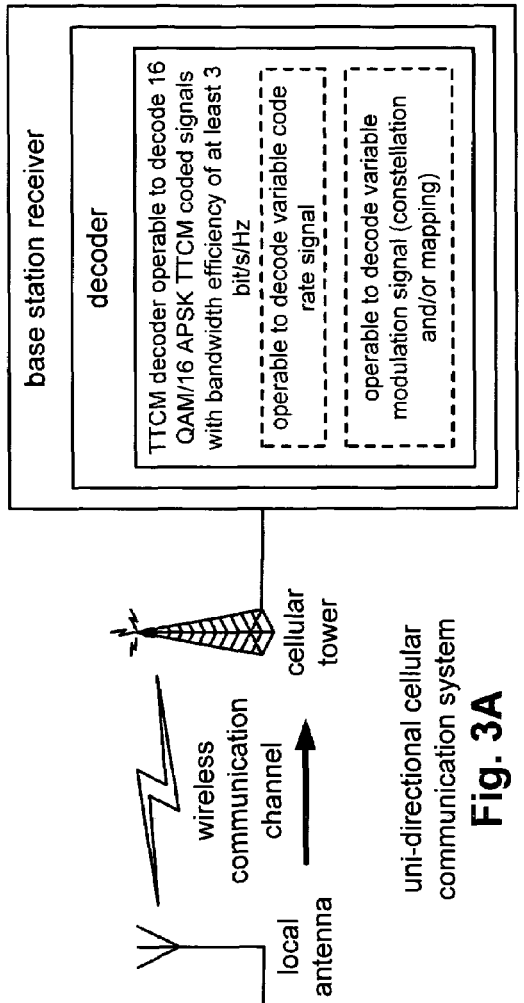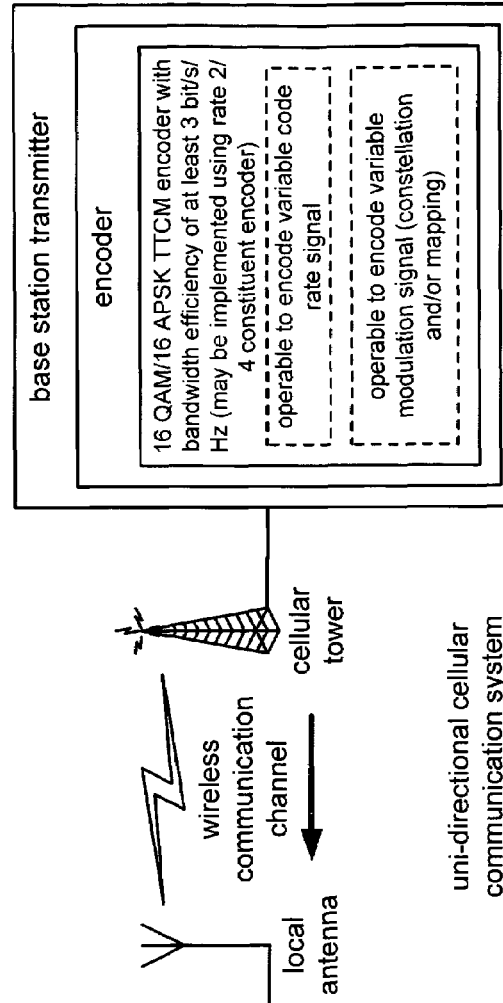

bi-directional cellular communication system uni-directional microwave communication system bi-directional microwave communication system uni-directional point-to-point radio communication system bi-directional point-to-point radio communication system uni-directional communication system one to many communication system fiber-optic communication system satellite receiver STB (Set Top Box) system dual interleaver embodiment of TTCM (Turbo Trellis Coded Modulation) encoder rate 1/2 recursive convolutional encoder with non-systematic output rate 2/4 prototype encoder rate 2/4 prototype encoder supporting multiple encoders RC (Rate Control) governed symbol mapping to various constellations RC (Rate Control) governed symbol mapping to various constellations rate 2/4 prototype encoder supporting RCs Q4, A4 (each having 2 uncoded bits)

RC (Rate Control) governed symbol mapping to various constellations

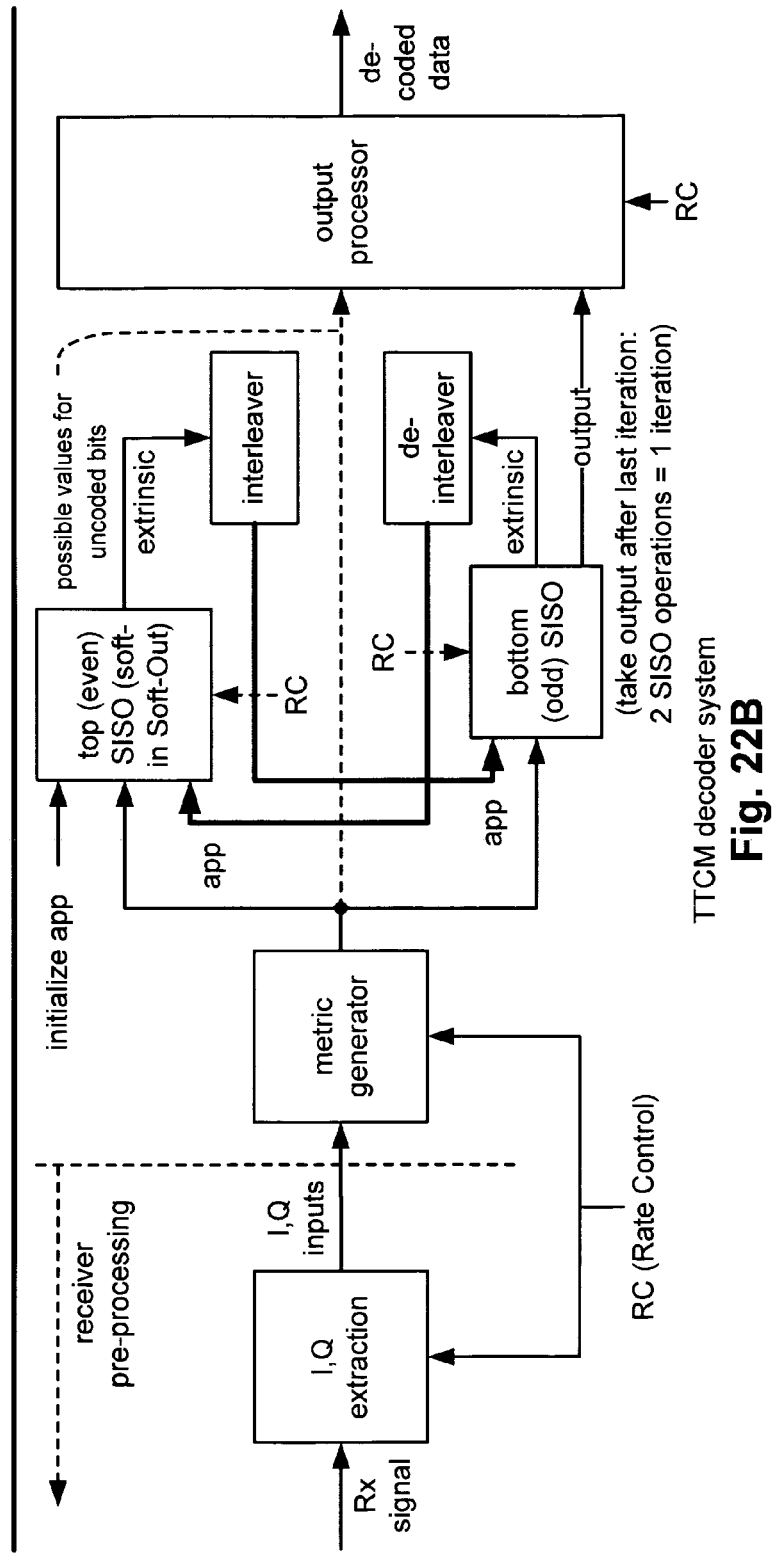

alternative TTCM decoder system that recycles single SISO (receiving I,Q inputs)

I,Q (In-phase, Quadrature) extraction

Rx I,Q mapping based on RC metric calculation performed by metric generator (shown for RC Q3 embodiment)

metric mapping functionality final output of decoding metric generator computation to accommodate RCs Q4 and A4 dual rate 2/4 prototype encoders supporting RCs (Q5 Q5) or (A5 A5)

RC (Rate Control) governed symbol mapping to various constellations

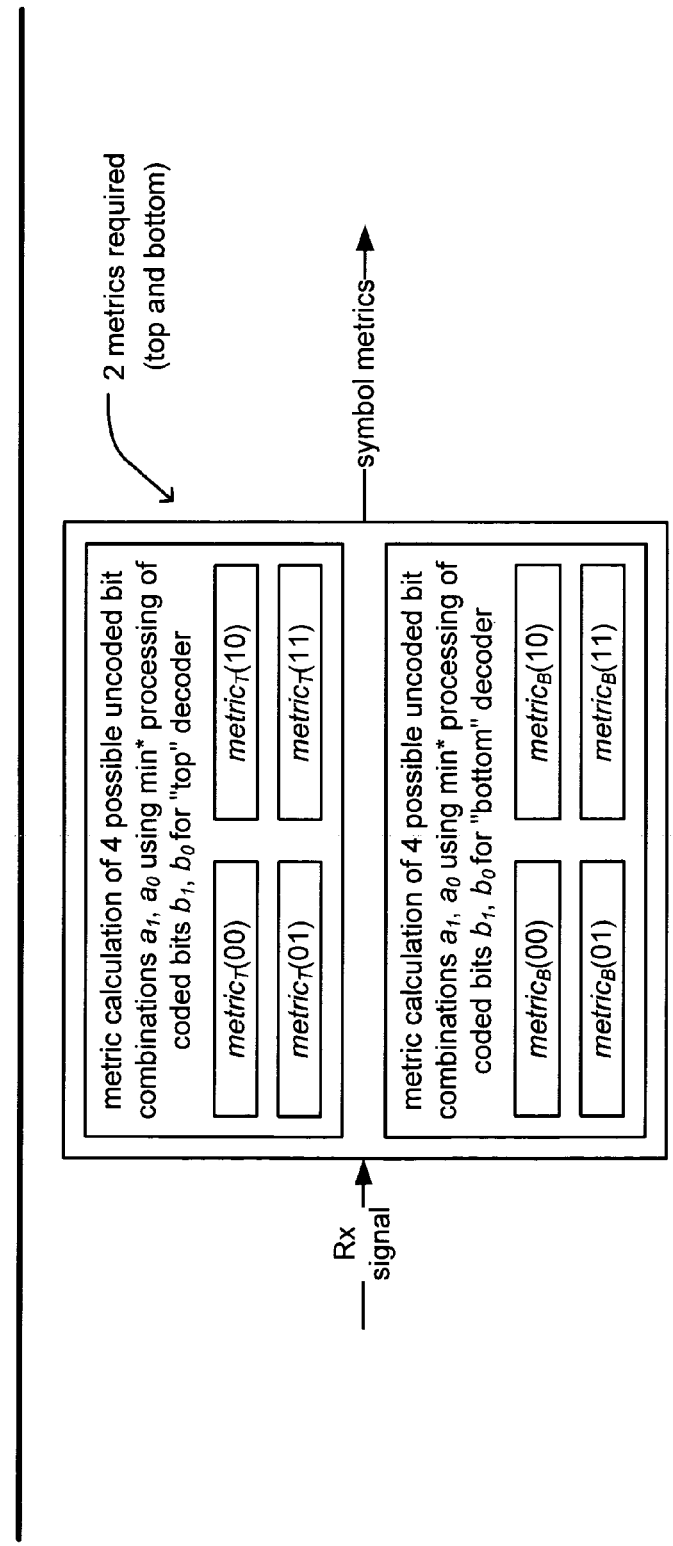

performance of 3.33 bit/s/Hz 16 QAM TTCM (shown with 4 decoding iterations)

performance of 3.5 bit/s/Hz 16 QAM TTCM (shown with 4 decoding iterations)

| bandwidth efficiency | a period of a sequence for 16 QAM (period 9) | a period of a sequence for 16 APSK (period 9) |
|---|---|---|
| 3.0 bit/s/Hz | Q4 Q0 Q0 Q0 Q0 Q0 Q0 Q0 Q0, or (Q5 Q5) Q0 Q0 Q0 Q0 Q0 Q0 Q0 Q3 | A4 A0 A0 A0 A0 A0 A0 A0 A0, or (A5 A5) A0 A0 A0 A0 A0 A0 A0 A3 |
| 3.11 bit/s/Hz | Q4 Q0 Q0 Q0 Q4 Q0 Q0 Q0 Q0, or (Q5 Q5) Q0 Q0 Q0 (Q5 Q5) Q0 Q0 Q0 Q3 | A4 A0 A0 A0 A4 A0 A0 A0 A0, or (A5 A5) A0 A0 A0 (A5 A5) A0 A0 A0 A3 |
| 3.33 bit/s/Hz | Q4 Q4 Q0 Q0 Q4 Q4 Q0 Q0 Q0 Q3, or (Q5 Q5) (Q5 Q5) Q0 Q0 (Q5 Q5) (Q5 Q5) Q0 Q0 Q3 | A4 A4 A0 A0 A4 A4 A0 A0 A0 A3, or (A5 A5) (A5 A5) A0 A0 (A5 A5) (A5 A5) A0 A0 A3 |

RC sequences include combined 16 QAM and QPSK (Q3) modulations

RC sequences include combined 16 APSK and QPSK (A3) modulations

Fig. 32 combined modulation periodic RC sequences supporting TTCM supporting bandwidth efficiencies of at least 3 bit/s/Hz performance of 3.0 bit/s/Hz 16 APSK TTCM (shown with 4 decoding iterations)

performance of 3.33 bit/s/Hz 16 APSK TTCM (shown with 4 decoding iterations)

TTCM (Turbo Trellis Coded Modulation) encoding method

TTCM (Turbo Trellis Coded Modulation) encoding method

16 QAM AND 16 APSK TTCM (TURBO TRELLIS CODED MODULATION) WITH MINIMUM BANDWIDTH EFFICIENCY OF 3 BIT/S/HZ USING A RATE 2/4 CONSTITUENT ENCODER

CROSS REFERENCE TO RELATED PATENTS/PATENT APPLICATIONS

The present U.S. Utility Patent Application claims priority pursuant to 35 U.S.C. § 119(e) to the following U.S. Provisional patent application which is hereby incorporated herein by reference in its entirety and made part of the present U.S. Utility patent application for all purposes:

1. U.S. Provisional Application Ser. No. 60/480,519, "16 QAM and 16 APSK TTCM (Turbo Trellis Coded Modulation) with minimum bandwidth of 3 bit/s/Hz using a rate 2/4 constituent encoder," filed Jun. 20, 2003 (Jun. 20, 2003), pending.

The present U.S. Utility Patent Application is also a continuation-in-part (CIP) of the following U.S. Utility patent application which is hereby incorporated herein by reference in its entirety and made part of the present U.S. Utility patent application for all purposes:

1. U.S. Utility application Ser. No. 10/264,486, entitled "Variable code rate and signal constellation turbo trellis coded modulation codec," filed Oct. 4, 2002 (Oct. 4, 2002), pending, which claims priority pursuant to 35 U.S.C. § 119(e) to U.S. Provisional Patent Application Ser. No. 60/384,698, entitled "Variable code rate and signal constellation turbo trellis coded modulation codec," filed May 31, 2002 (May 31, 2002).

BACKGROUND OF THE INVENTION

1. Technical Field of the Invention

The invention relates generally to communication systems; and, more particularly, it relates to coding of signals within such communication systems.

2. Description of Related Art

Turbo code and variants thereof have been the focus of a great deal of interest in the recent years. One of the primary directives in this area of development has been to try continually to lower the BER (Bit Error Rate) floor for communication channel's having a given SNR (Signal to Noise Ratio). The SNR is oftentimes referred to in terms of the $E_b/N_o$ (ratio of energy per bit $E_b$ to the Spectral Noise Density $N_o$) waterfall part within such a communication system that supports a given BER.

In designing such communication systems and codes employed therein, the ideal goal has been to try reach Shannon's limit in a communication channel. Shannon's limit (sometimes referred to as the communication channel's capacity) may be viewed as being the data rate that is used in a communication channel, having a particular SNR, which will achieve error free transmission through the channel; that is to say, the Shannon's limit is a particular SNR of the communication channel that will support precisely 0.0 BER. In other words, the Shannon limit is the theoretical bound for channel capacity for a given modulation and code rate. The code rate is the ratio of information bits over the total number of bits transmitted within the communication system. In the turbo code context, it is common to refer to code rate (or sometimes referred to simply as "rate") of n/m, where n is the number of information bits and m is the total number of bits, and where m>n. The difference between m and n typically is referred to as the number of redundancy bits (or parity bits) of an encoded symbol within the signal. Turbo codes typically introduce a degree of redundancy to at least a portion of data prior to transmission through a communication channel. This is oftentimes generally referred to as FEC (Forward Error Correction) coding.

Although there has been much development within the context of turbo code and related coding applications with increased interest recently, this focus has been primarily towards achieving very low BERs across relatively noisy communication channels. As such, these prior art turbo codes largely operate at relatively low rates across relatively noisy communication channels. However, the area of turbo code and variants thereof is still an area of relative immaturity in the technological developmental sense. While there has no doubt been a great amount of progress achieved this far, there still remains a great deal of development and improvement that can be done. This is a technology area where industry-wide consensus has certainly not yet been achieved, and there are many competing viewpoints within the industry as to which direction future developmental effort should be made.

The use of turbo codes providing such low error, while operating at relatively low rates, has largely been in the context of communication systems having a large degree of noise within the communication channel and where substantially error free communication is held at the highest premium. Some of the earliest application arenas for turbo coding were space related where accurate (in fact, ideally, error free) communication is often deemed an essential design criterion.

Relatively recently, the direction of development has moved towards developing terrestrial-applicable and consumer-related applications. Still, the focus of effort here has continued to be achieving low error floors, and not specifically towards reaching higher throughput.

As such, a need continues to exist in the art to develop turbo code related coding that is operable to support higher amounts of throughput while still preserving the relatively low error floors offered within the turbo code context. Whereas the development of turbo code related technology has primarily been directed towards relatively low rates across noisy communication channels, there exists a need to overcome the many hurdles that prevent the application of turbo code to higher data rate applications. In doing so, these higher data rate applications may benefit from the low BERs offered by turbo codes.

BRIEF SUMMARY OF THE INVENTION

Various aspects of the invention can be found in any number of devices that perform TTCM coding (including encoding and/or decoding) in accordance with invention. The TTCM coding may be employed according to a rate control sequence including 1 or more RCs (Rate Controls) arranged in a period. The encoded signal may include symbols whose code rate and/or modulation may vary as frequently as on a symbol by symbol basis.

In one embodiment, a TTCM encoder may be implemented according to the invention that includes two separate encoding paths. The top path includes a top interleaver operably coupled selectively to interleave at least some input bits of the plurality of input bits. The top path also includes a top rate 2/4 constituent trellis encoder, communicatively coupled to the top interleaver and operable to receive selectively interleaved bits there from, that is operable to encode the selectively interleaved bits that have been interleaved by the top interleaver.

The bottom path includes a bottom interleaver operably coupled selectively to interleave at least some input bits of the plurality of input bits. The bottom path also includes a bottom rate ⅔ constituent trellis encoder, communicatively coupled to the bottom interleaver and operable to receive selectively interleaved bits there from, that is operable to encode the selectively interleaved bits that have been interleaved by the bottom interleaver.

The outputs from both the top rate ⅔ constituent trellis encoder and the bottom rate ⅔ constituent trellis encoder are provided to a MUX (Multiplexor). The MUX alternatively selects encoded bits that are output from the top rate ⅔ constituent trellis encoder and the bottom rate ⅔ constituent trellis encoder to produce a first plurality of multiplexed bits and a second plurality of multiplexed bits.

When the MUX selects the output from the top path (e.g., from the top rate ⅔ constituent trellis encoder), this output is provided to a puncturing functional block that is operable selectively to puncture the first plurality of multiplexed bits output from the MUX according to a first RC (Rate Control) of a rate control sequence to produce a first encoded symbol.

When the MUX selects the output from the bottom path (e.g., from the bottom rate ⅔ constituent trellis encoder), this output is provided to the puncturing functional block that is operable selectively to puncture the second plurality of multiplexed bits output from the MUX according to a second RC of the rate control sequence to produce a second encoded symbol.

When the MUX selects the output from the top path, the first encoded symbol is provided to a symbol mapper that maps the first encoded symbol according to the first RC thereby generating a first mapped symbol.

When the MUX selects the output from the top path, the second encoded symbol is provided to symbol mapper that maps the second encoded symbol according to the second RC thereby generating a second mapped symbol.

The first mapped symbol and the second mapped symbol form an encoded signal that has a bandwidth efficiency that is greater than approximately 3 bit/s/Hz (bits per second per Hertz).

In some embodiments, the first RC of the rate control sequence corresponds to a first modulation that includes a first mapping of either a first 16 QAM (Quadrature Amplitude Modulation) constellation or a first 16 APSK (16 Asymmetric Phase Shift Keying) constellation, and the second RC of the rate control sequence corresponds to a second modulation that includes a second mapping of either a second 16 QAM constellation or a second 16 APSK constellation.

The rate control sequence may also include RCs that correspond to different types of modulation (each having their corresponding constellation and mappings). For examples, a rate control sequence may include a first RC corresponding to a 16 QAM modulation (or a 16 APSK modulation) and also a second RC corresponding to a QPSK modulation.

The TTCM encoder may also include a rate control sequencer that provides the first RC and the second RC of the rate control sequence to the puncturing functional block and to the symbol mapper. Either one or both of the first encoded symbol and the second encoded symbol may be formed using 1 or more uncoded bits.

Moreover, either one or both of the top rate ⅔ constituent trellis encoder and the bottom rate ⅔ constituent trellis encoder may be implemented using a dual rate ⅔ prototype encoder that itself include 2 separate rate ⅔ prototype encoders. More specifically, a dual rate ⅔ prototype encoder that is implemented as the top rate ⅔ constituent trellis encoder may include a "top" rate ⅔ prototype encoders and a "bottom" rate ⅔ prototype encoders. Similarly, a dual rate ⅔ prototype encoder that is implemented as the bottom rate ⅔ constituent trellis encoder may also include a "top" rate ⅔ prototype encoders and a "bottom" rate ⅔ prototype encoders.

The selection of the RCs for the rate control sequences may be performed to provide for improved performance and also for increased bandwidth efficiency signals even further above 3 bit/s/Hz (e.g., as high as even 3.11 bit/s/Hz, 3.33 bit/s/Hz, 3.5 bit/s/Hz).

Such an encoder and/or a decoder built according to the invention may be implemented within a variety of types of communication device that may be implemented within any number of types of communication systems. Some examples of such communications systems include a satellite communications system, a HDTV (High Definition Television) communication system, a cellular communication system, a and microwave communication system, a point-to-point communication system, a uni-directional communication system, a bi-directional communication system, a one to many communication system, and a fiber optic communication system. The invention envisions any type of communication system that supports the functionality and/or processing described herein. Moreover, various types of methods may be performed to support the functionality described herein without departing from the scope and spirit of the invention.

BRIEF DESCRIPTION OF THE SEVERAL VIEWS OF THE DRAWINGS

FIG. 3A and FIG. 3B are system diagrams illustrating embodiments of uni-directional cellular communication systems that are built according to the invention.

FIG. 22A is a diagram illustrating an embodiment of periodic RC (Rate Control) sequences of TTCM supporting bandwidth efficiencies of at least 3 bit/s/Hz according to the invention.

FIG. 22B is a diagram illustrating an embodiment of a TTCM decoder system that is built according to the invention.

FIG. 29A is a diagram illustrating another embodiment of periodic RC (Rate Control) sequences of TTCM supporting bandwidth efficiencies of at least 3 bit/s/Hz according to the invention.

FIG. 29B is a diagram illustrating an embodiment of metric generator computation to accommodate RCs (Q5 Q5) and (A4 A4) according to the invention.

FIG. 32 is a diagram illustrating another embodiment of combined modulation periodic RC (Rate Control) sequences of TTCM supporting bandwidth efficiencies of at least 3 bit/s/Hz according to the invention.

DETAILED DESCRIPTION OF THE INVENTION

Various aspects of the invention may be found in any number of devices that perform coding (including encoding and/or decoding) of TTCM (Turbo Trellis Coded Modulation) coded signals. The TTCM coding may be performed to support variable modulation signals whose modulation may vary as frequently as on a symbol by symbol basis. Each modulation includes a constellation and a mapping unique to that constellation. Examples of modulations include, but are not limited to, 16 QAM (16 Quadrature Amplitude Modulation), 16 APSK (16 Asymmetric Phase Shift Keying) modulation, QPSK (Quadrature Phase Shift Key) modulation, and 8 PSK (8 Phase Shift Key) modulation. Two separate modulations having the same constellation shape may be distinguished by each having a unique mapping for the constellation points of that particular constellation. Rate control sequences, that include 1 or more RC (Rate Control) arranged in a period, may be employed to direct the manner in which a signal is to be coded. Each RC corresponds to a particular modulation (having a constellation and a mapping).

Various system embodiments are described below where any of the various aspects of the invention may be implemented. In general, any device that performs encoding and/or decoding of TTCM coded signals may benefit from the invention.

Figure 1:
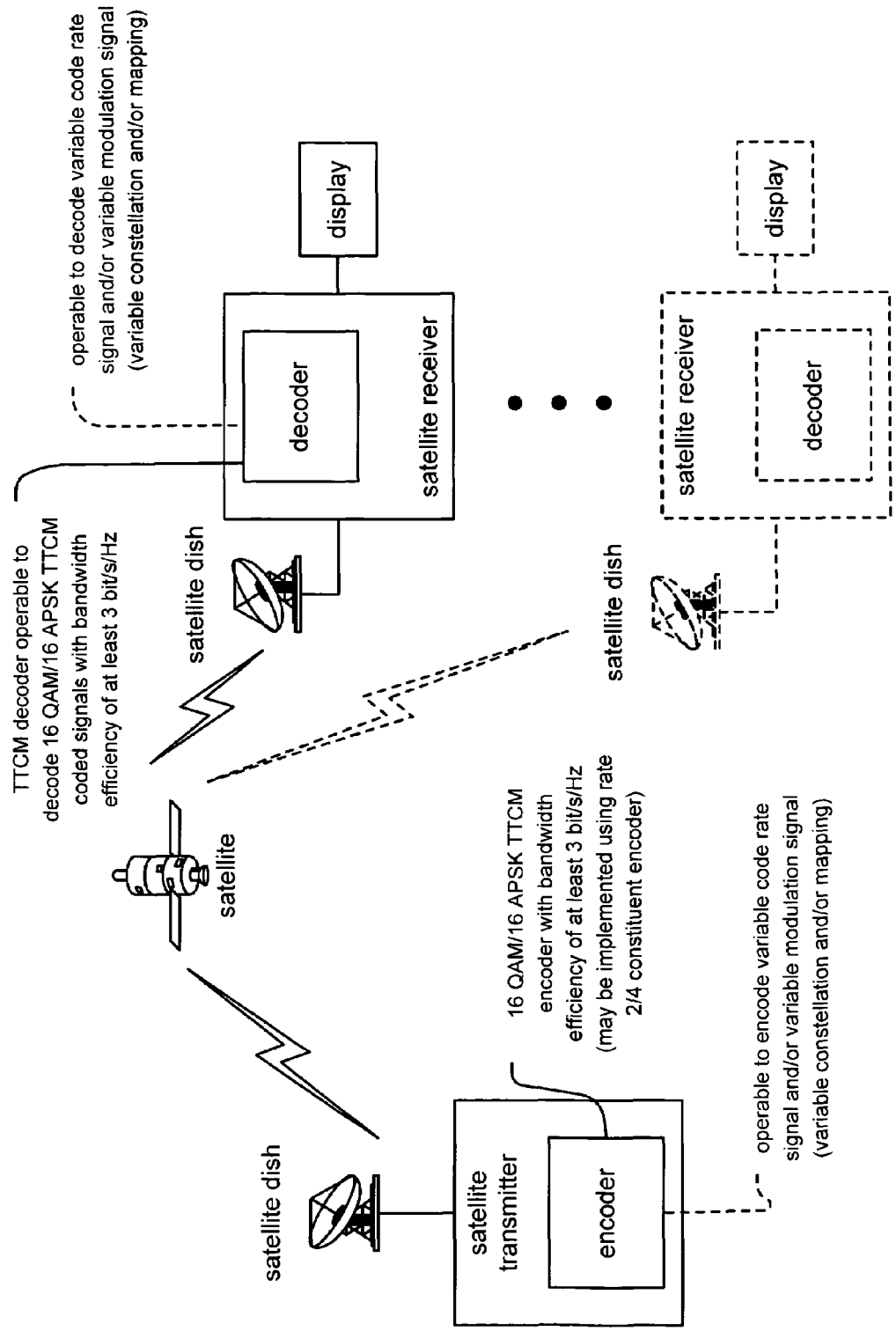
FIG. 1 is a system diagram illustrating an embodiment of a satellite communication system that is built according to the invention.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, and/or other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). The encoder may be implemented to perform encoding using 16 QAM/16 APSK TTCM encoding that provides a bandwidth efficiency of at least 3 bit/s/Hz (bits per second per Hertz). The TTCM encoding may be performed to generate a signal whose code rate and/or modulation may vary as frequently as on a symbol by symbol basis. With respect to the modulation of the signal varying as frequently as on a symbol by symbol basis, either one or both of the constellation and mapping of the symbols within the signal may vary as frequently as on a symbol by symbol basis. This TTCM encoding of the signal is supported using a rate control sequence having 1 or more RCs arranged in a period. A single rate control sequence may include RCs corresponding to different modulations such as 16 QAM (or 16 APSK) and QPSK.

The decoders within the satellite receivers may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 1 shows just one of the many embodiments where one or more of the various aspects of the invention may be found.

Figure 2:
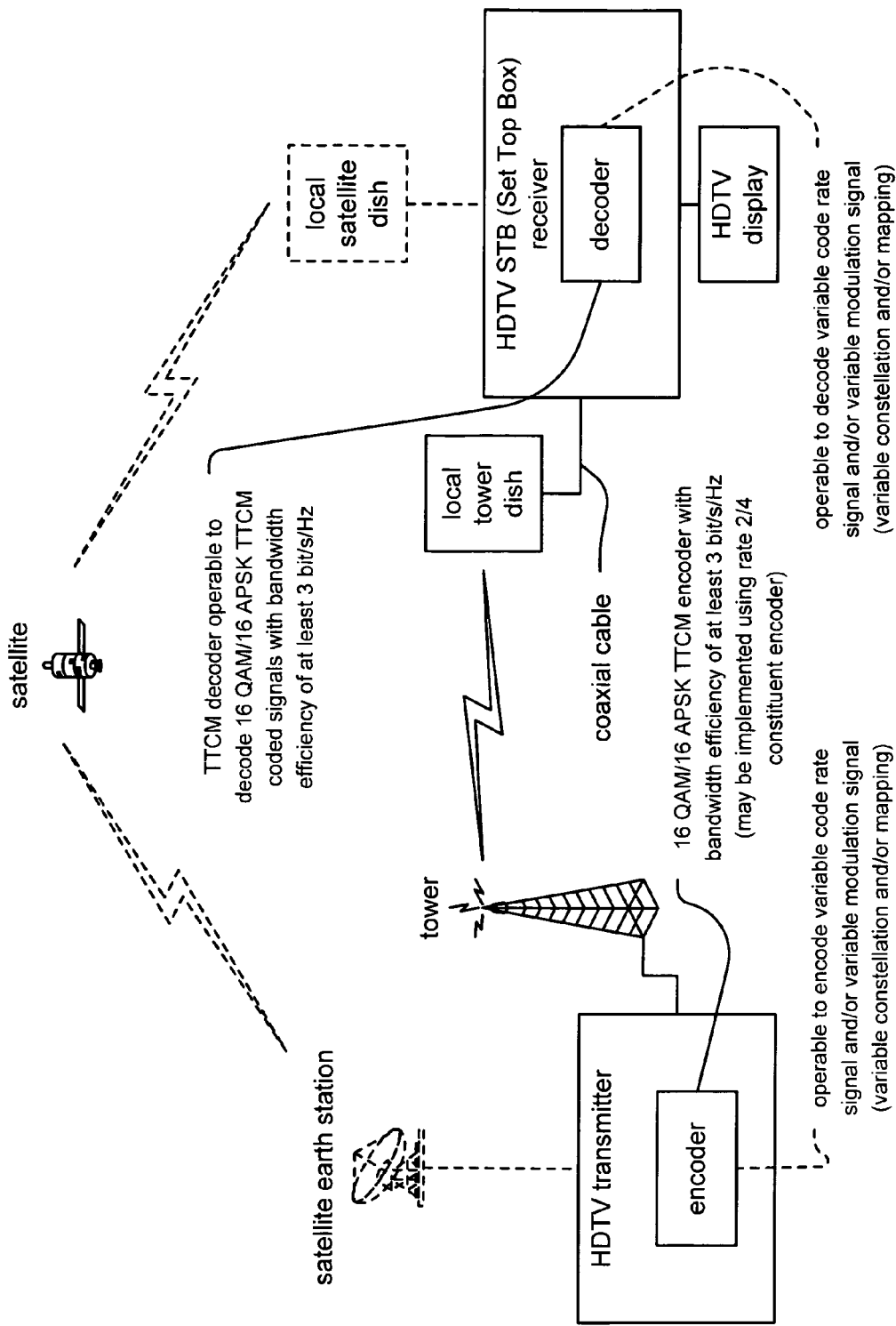
FIG. 2 is a system diagram illustrating an embodiment of an HDTV (High Definition Television) communication system that is built according to the invention.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish; this may include any transformation and/or down-converting that may be needed to accommodate any up-converting that may have been performed before and during transmission of the signal from the HDTV transmitter and its tower to transform the signal into a format that is compatible with the communication channel across which it is transmitted.

The HDTV STB receiver is also communicatively coupled to an HDTV display that is able to display the demodulated and decoded wireless transmitted signals received by the HDTV STB receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is destined for the HDTV STB receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and whichever signal path the HDTV transmitter employs to communicate with the HDTV STB receiver, the HDTV STB receiver is operable to receive communication transmissions from the HDTV transmitter.

The HDTV transmitter is operable to encode information (using an encoder) that is to be transmitted to the HDTV STB receiver; the HDTV STB receiver is operable to decode the transmitted signal (using a decoder).

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 2 shows yet another embodiment where one or more of the various aspects of the invention may be found.

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmit functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder).

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 3A shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder).

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 3B shows yet another embodiment where one or more of the various aspects of the invention may be found.

Figure 4:
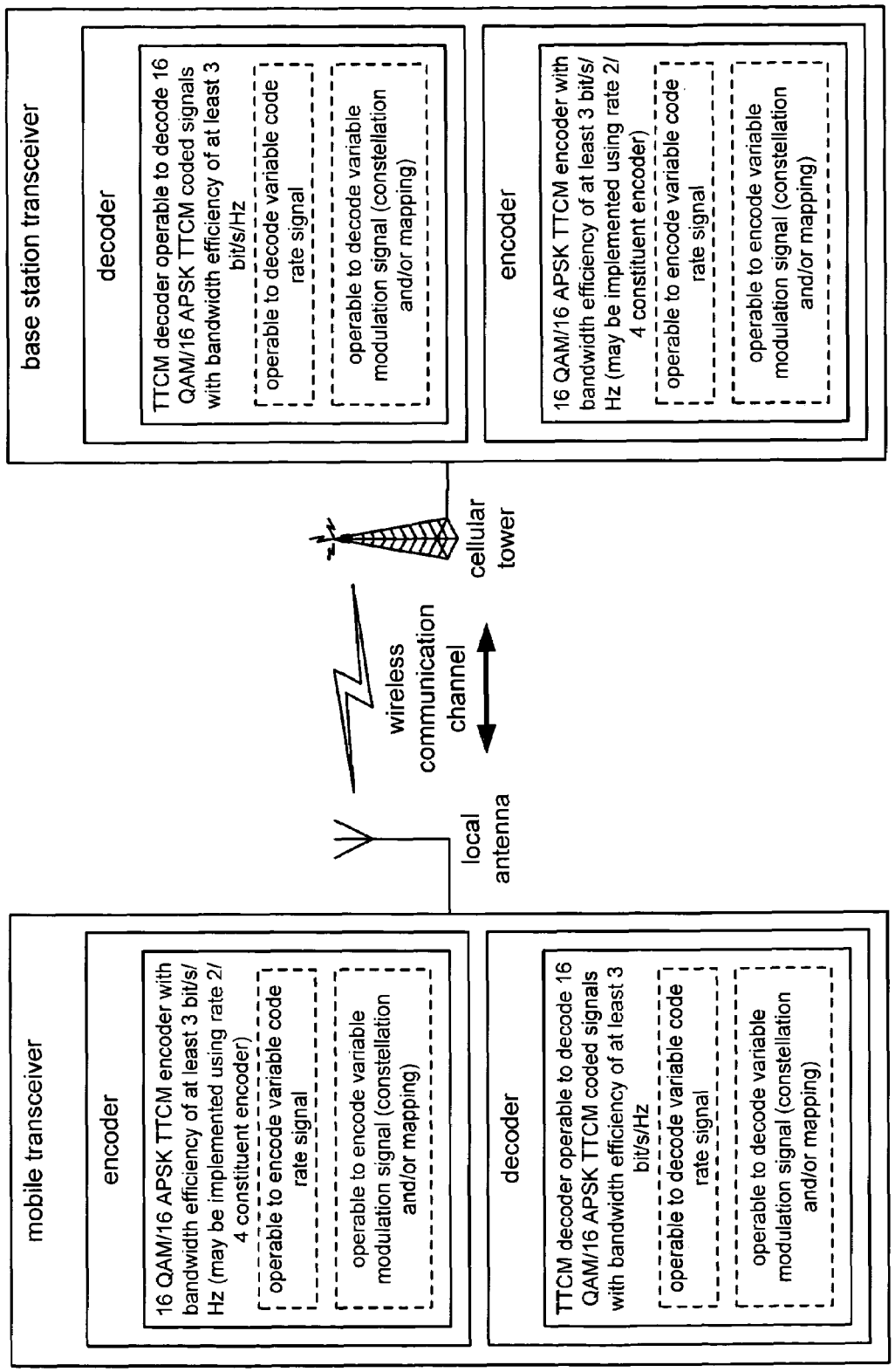
FIG. 4 is a system diagram illustrating an embodiment of a bi-directional cellular communication system that is built according to the invention.

FIG. 4 is a system diagram illustrating an embodiment of a bi-directional cellular communication system, that is built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver; the mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder of either of the base station transceiver or the mobile transceiver may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 4 shows yet another embodiment where one or more of the various aspects of the invention may be found.

Figure 5:
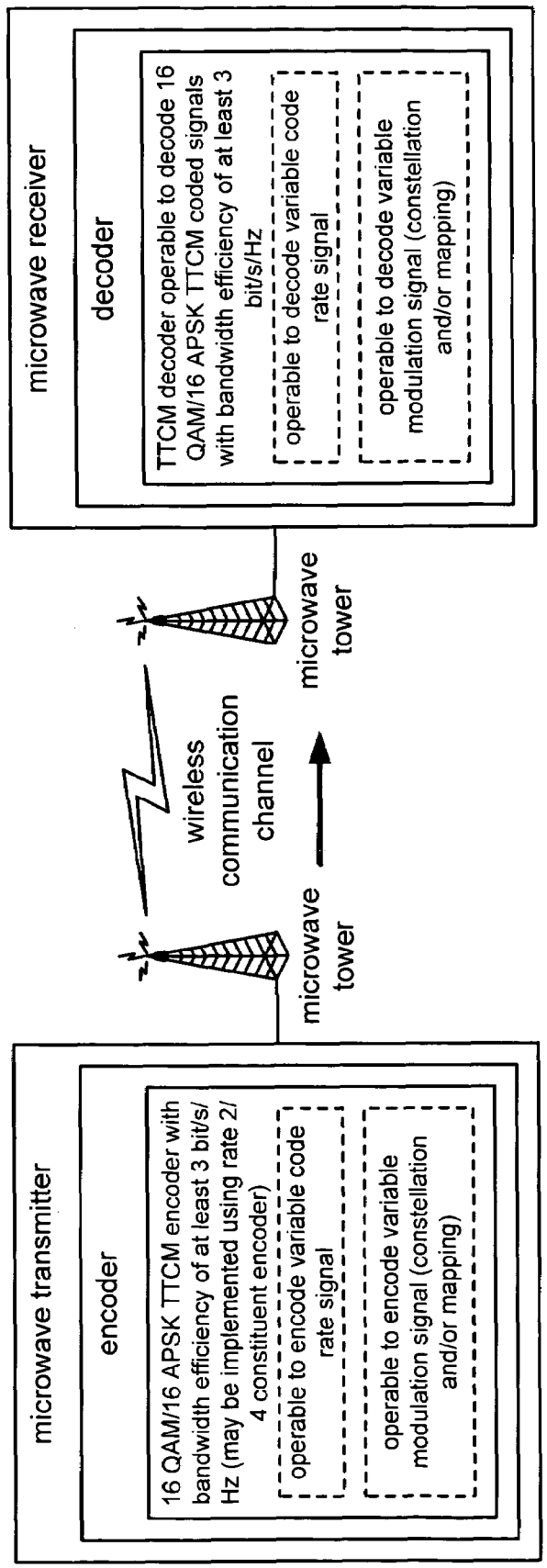
FIG. 5 is a system diagram illustrating an embodiment of a uni-directional microwave communication system that is built according to the invention.

FIG. 5 is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder).

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 5 shows yet another embodiment where one or more of the various aspects of the invention may be found.

Figure 6:
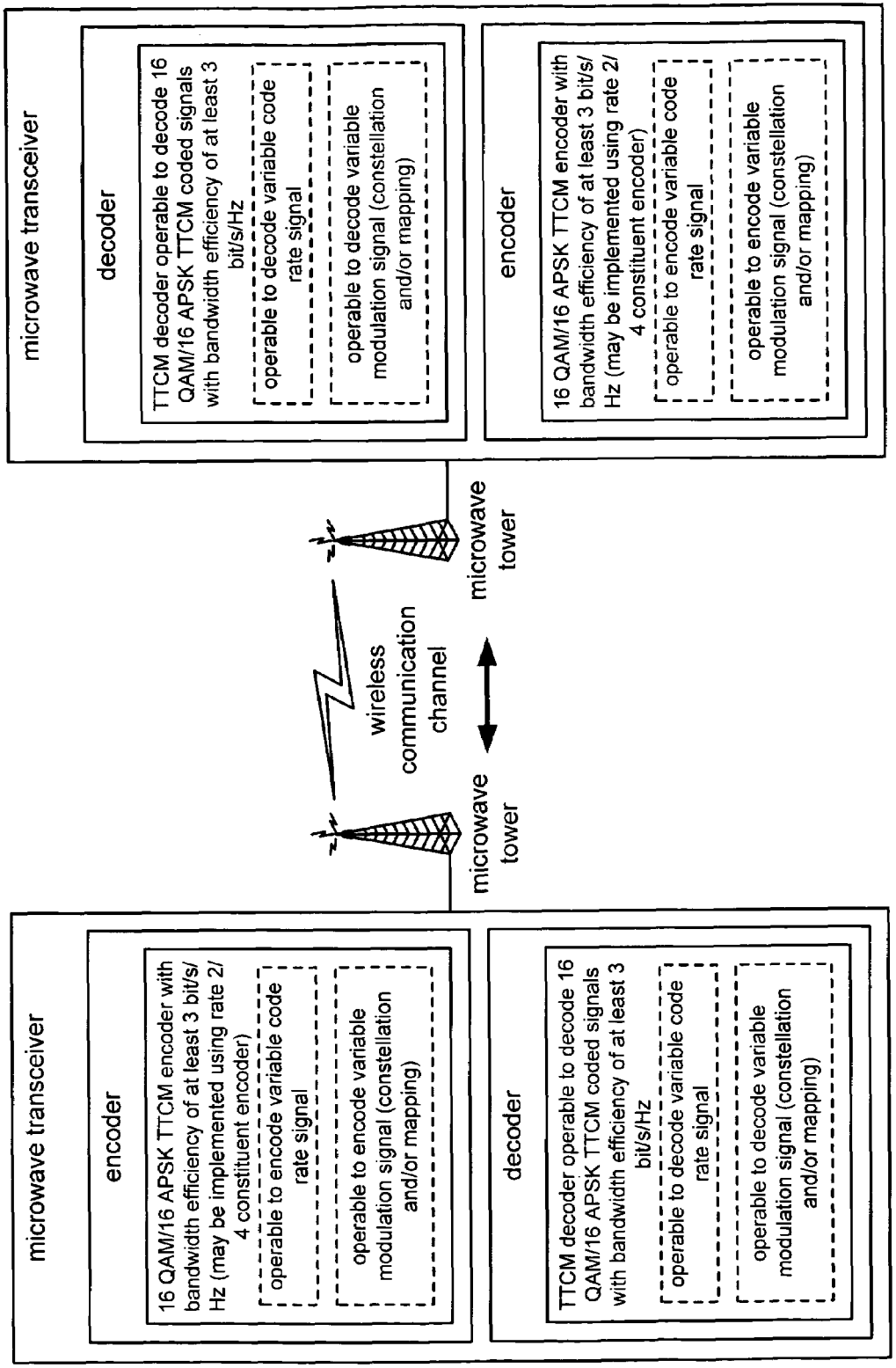
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within the FIG. 6, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder.

As within other embodiments that employ an encoder and a decoder, the encoder of either of the microwave transceivers may be may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder of either of the microwave transceivers may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 6 shows yet another embodiment where one or more of the various aspects of the invention may be found.

Figure 7:
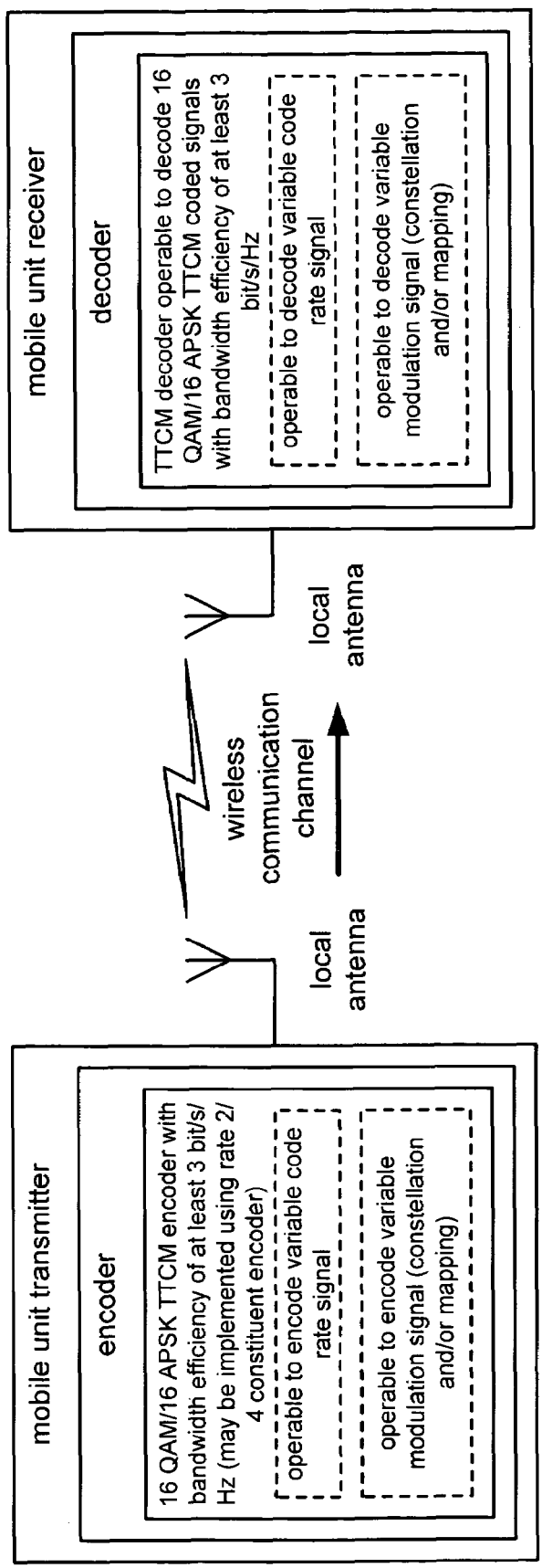
FIG. 7 is a system diagram illustrating an embodiment of a uni-directional point-to-point radio communication system that is built according to the invention.

FIG. 7 is a system diagram illustrating an embodiment of a uni-directional point-to-point radio communication system, that is built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder).

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 7 shows yet another embodiment where one or more of the various aspects of the invention may be found.

Figure 8:
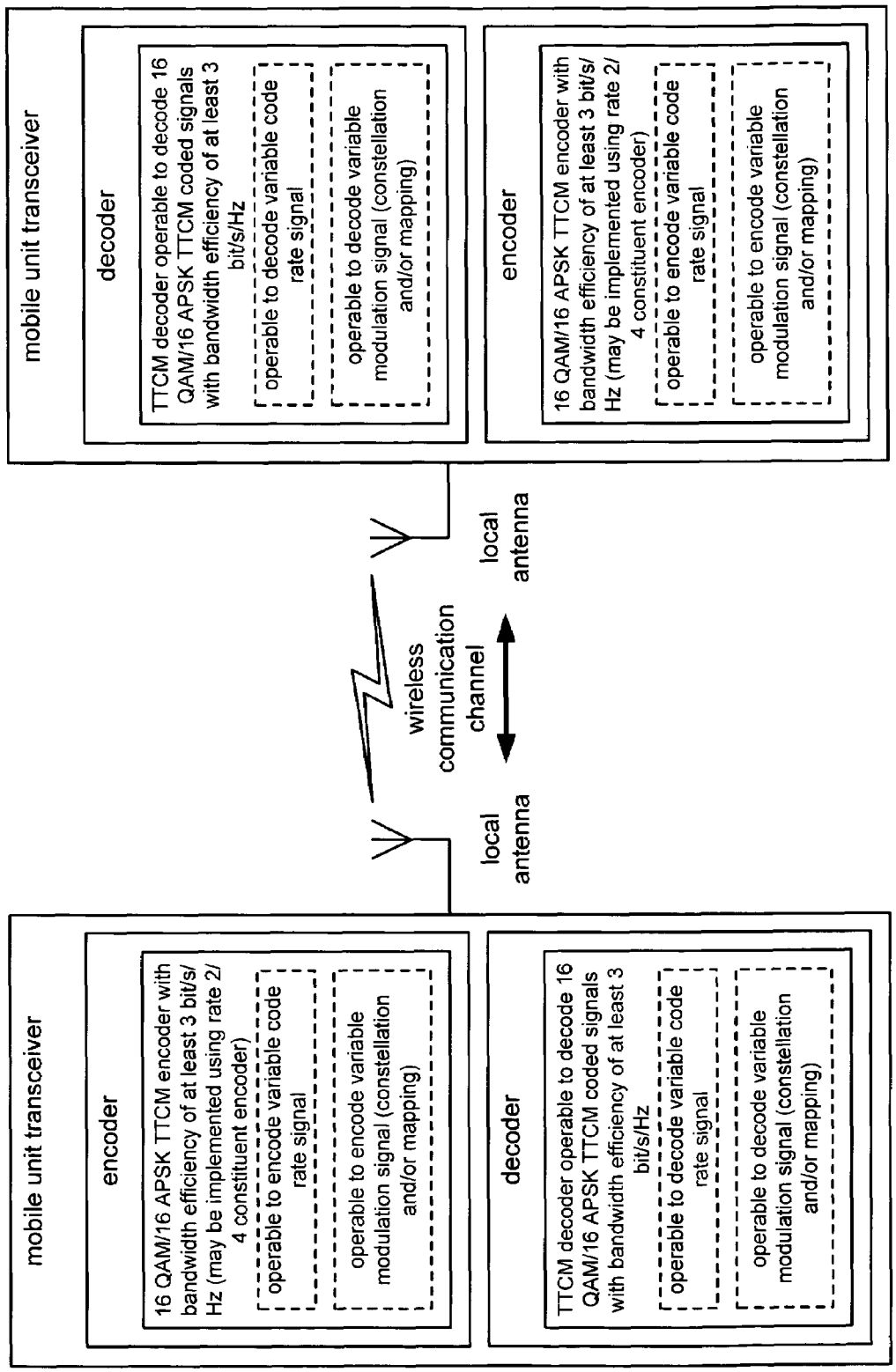
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. Within the FIG. 8, a first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using its corresponding encoder) that is to be transmitted to the other mobile unit transceiver; each mobile unit transceiver is operable to decode the transmitted signal (using its corresponding decoder) that it receives.

As within other embodiments that employ an encoder and a decoder, the encoder of either of the mobile unit transceivers may be may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder of either of the mobile unit transceivers may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 8 shows yet another embodiment where one or more of the various aspects of the invention may be found.

Figure 9:
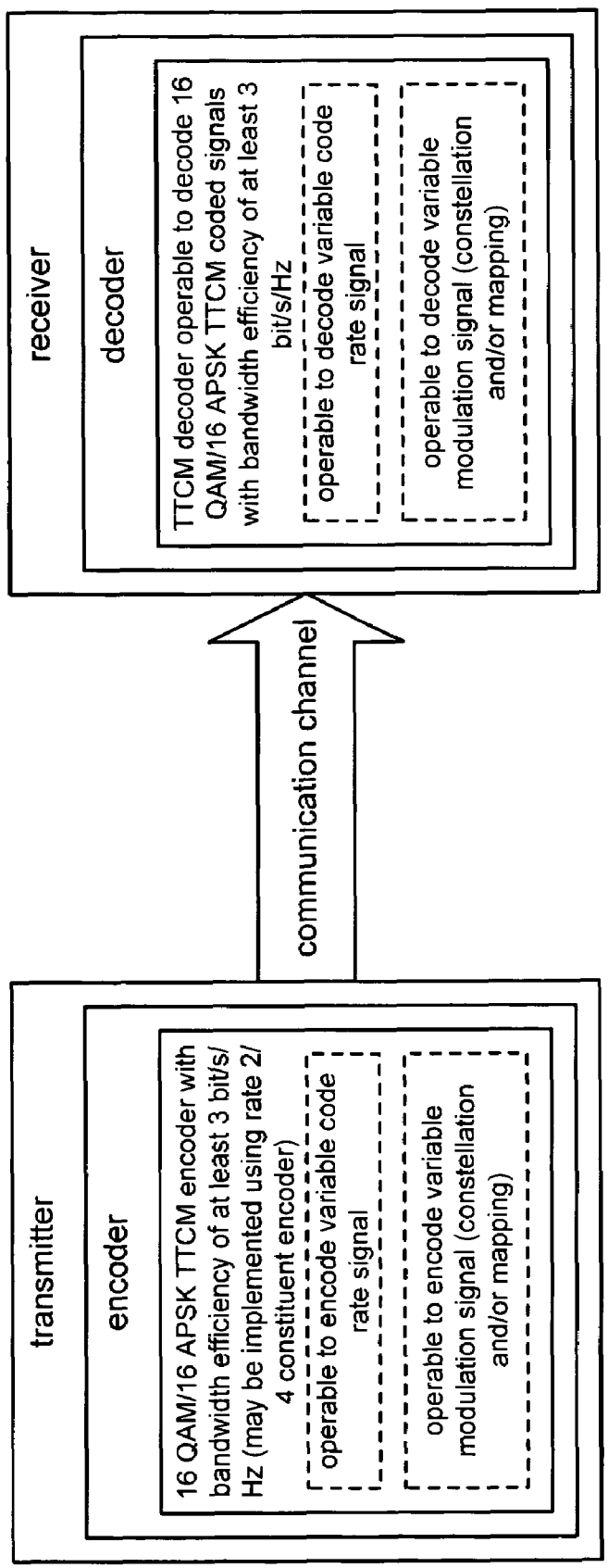
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder).

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 9 shows yet another embodiment where one or more of the various aspects of the invention may be found.

Figure 10:
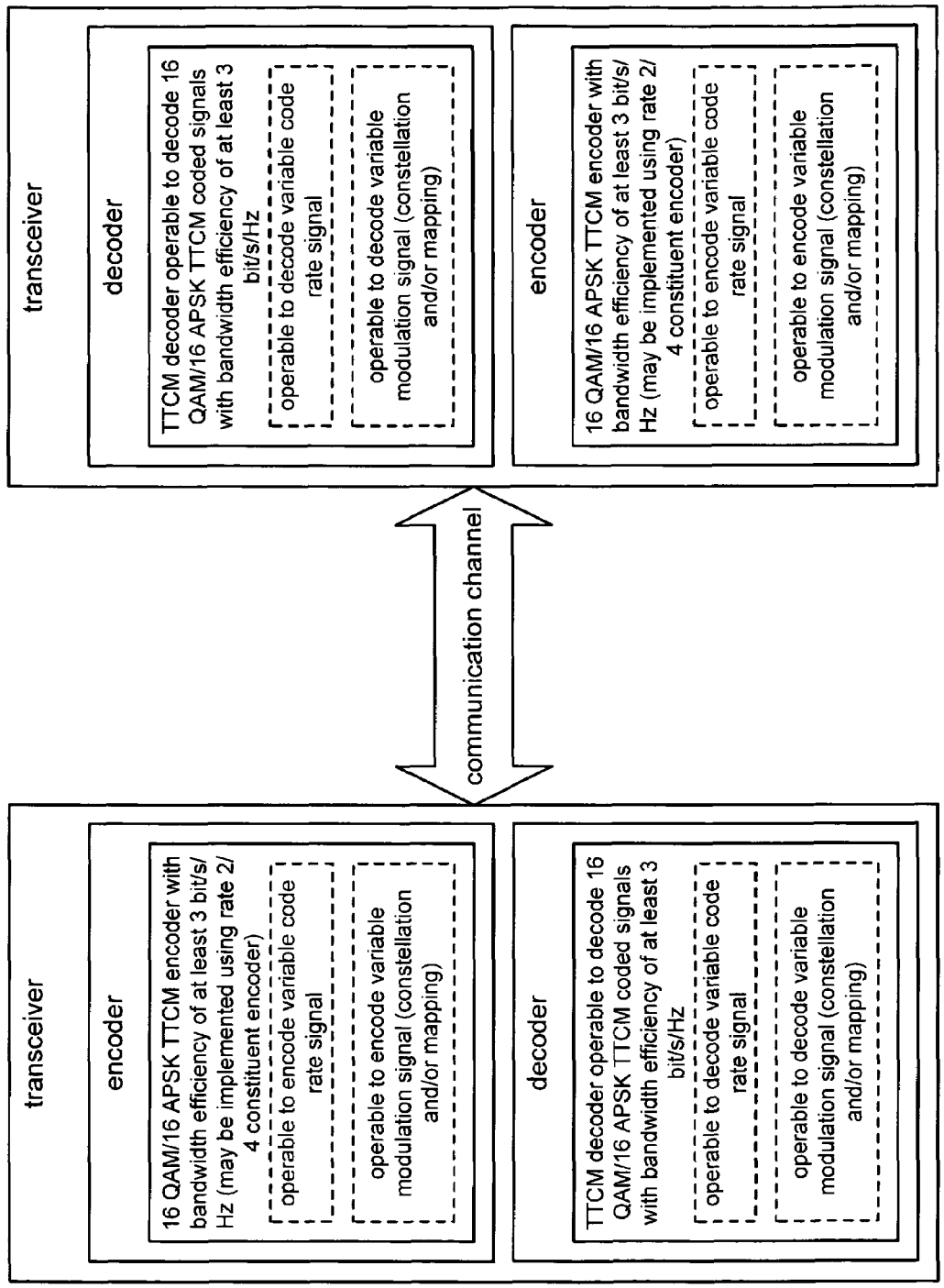
FIG. 10 is a system diagram illustrating an embodiment of a bi-directional communication system that is built according to the invention.

FIG. 10 is a system diagram illustrating an embodiment of a bi-directional communication system that is built according to the invention. Within the FIG. 10, a first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted to the other transceiver; each transceiver is operable to decode the transmitted signal (using its corresponding decoder) that it receives.

As within other embodiments that employ an encoder and a decoder, the encoder of either of the transceivers may be may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder of either of the transceivers may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 10 shows yet another embodiment where one or more of the various aspects of the invention may be found.

Figure 11:
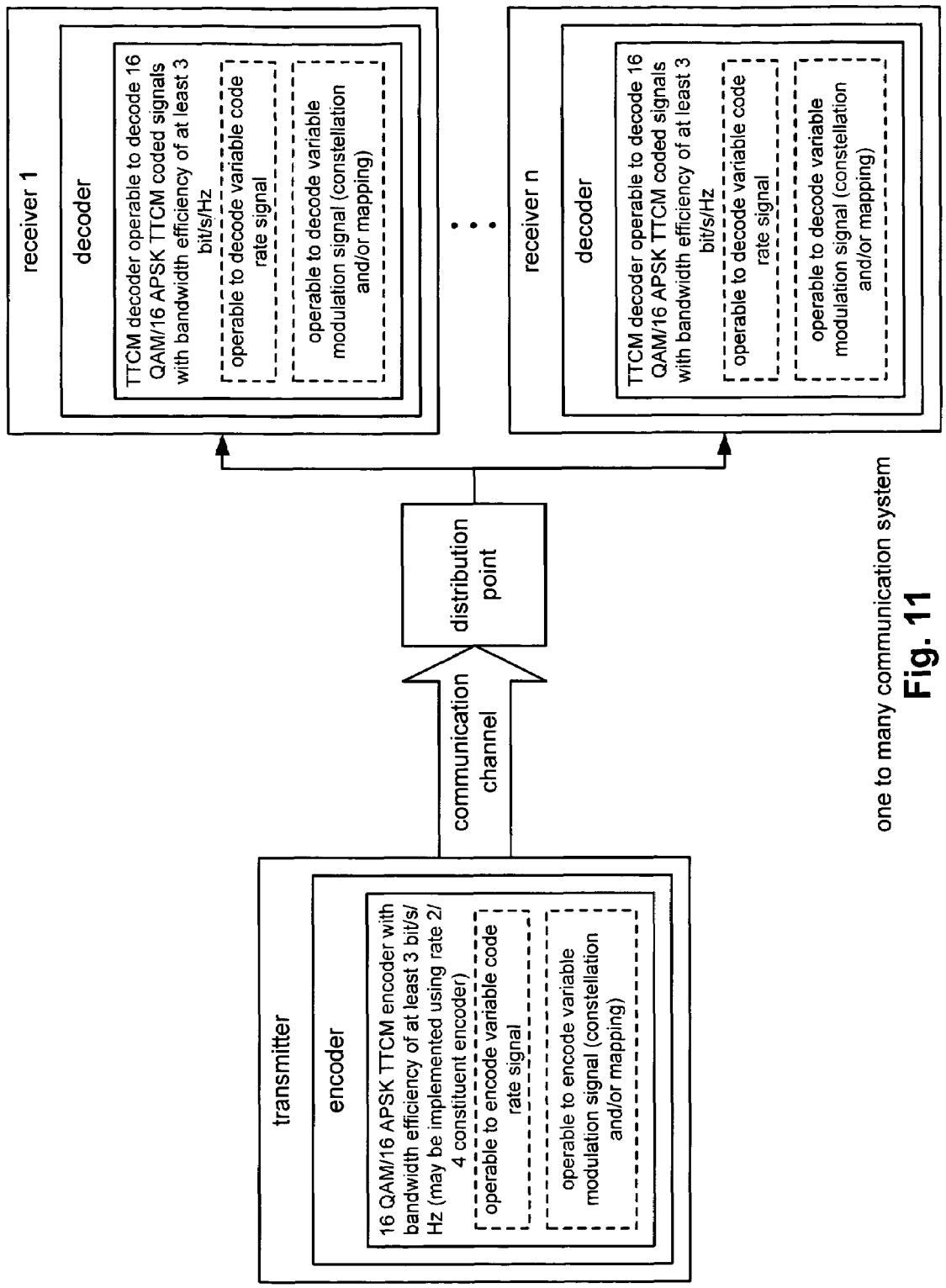
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, . . . , n via a uni-directional communication channel. The uni-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

A distribution point is employed within the one to many communication system to provide the appropriate communication to the receivers 1, . . . , and n. In certain embodiments, the receivers 1, . . . , and n each receive the same communication and individually discern which portion of the total communication is intended for them.

The transmitter is operable to encode information (using an encoder) that is to be transmitted to the receivers 1, . . . , and n; each of the receivers 1, . . . , and n is operable to decode the transmitted signal (using a decoder).

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoders of any of the receivers 1, . . . , and n may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 11 shows yet another embodiment where one or more of the various aspects of the invention may be found.

Figure 12:
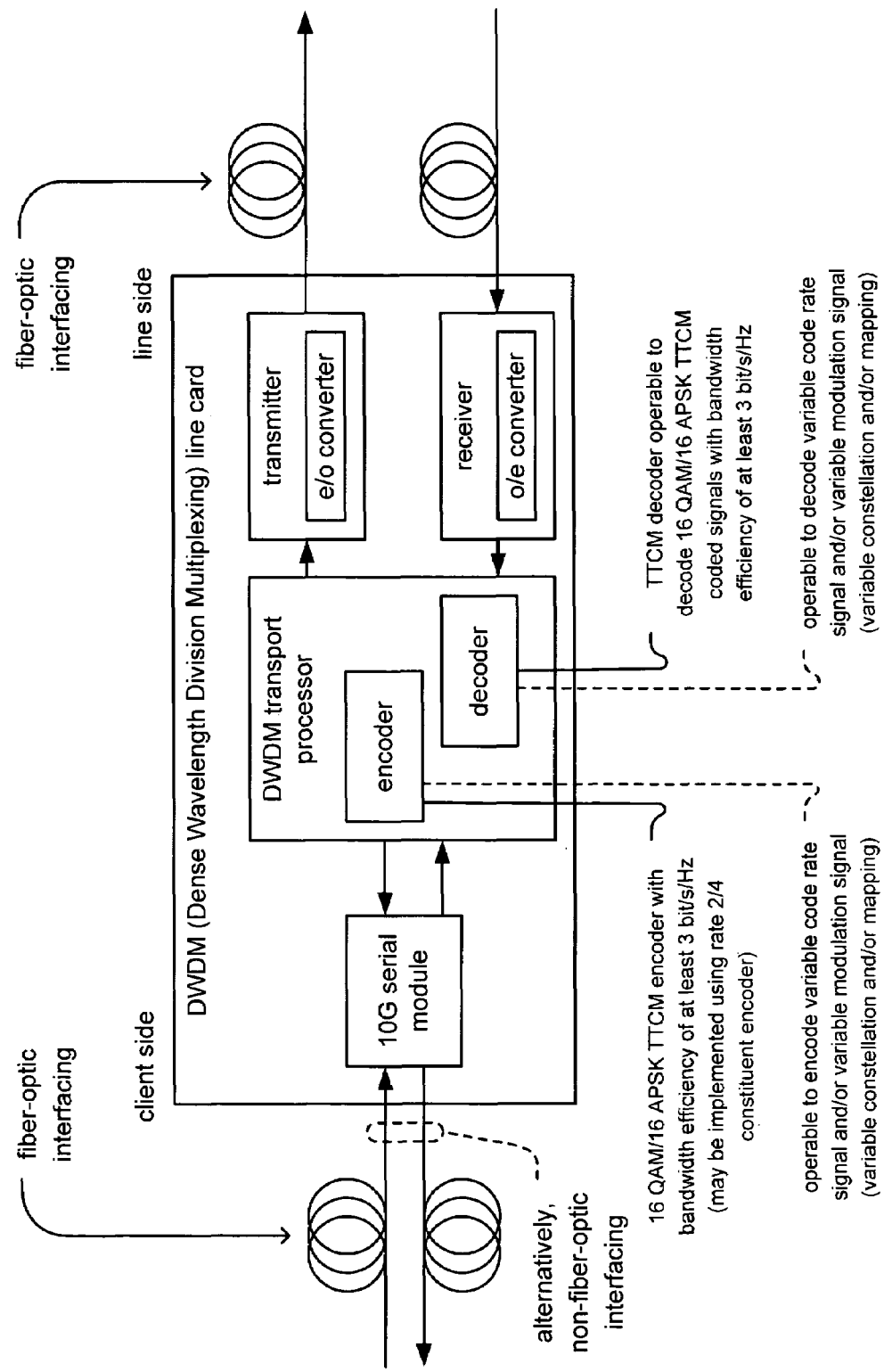
FIG. 12 is a system diagram illustrating an embodiment of a fiber-optic communication system that is built according to the invention.

FIG. 12 is a system diagram illustrating an embodiment of a fiber-optic communication system that is built according to the invention. The fiber-optic communication system may be implemented to support TTCM encoding to generate a signal whose code rate and/or modulation may vary as frequently as on a symbol by symbol basis. In addition, the fiber-optic communication system may be implemented to support TTCM decoding that may also be implemented to accommodate decoding processing of a signal whose code rate and/or modulation may vary as frequently as on a symbol by symbol basis.

The fiber-optic communication system includes a DWDM (Dense Wavelength Division Multiplexing (within the context of fiber optic communications)) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth efficiency perspective, some of the most compelling technical advantage of DWDM can be summarized as follows:

The transparency of DWDM: Because DWDM is a PHY (physical layer) architecture, it can transparently support both TDM (Time Division Multiplexing) and data formats such as ATM (Asynchronous Transfer Mode), Gigabit Ethernet, ESCON, and Fibre Channel with open interfaces over a common physical layer.

The scalability of DWDM: DWDM can leverage the abundance of dark fiber in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10 G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder may be implemented to perform encoding using TTCM coding, and the TTCM encoding may be performed to generate a signal whose code rate and/or modulation may vary as frequently as on a symbol by symbol basis. The encoder may be implemented to perform encoding using 16 QAM/16 APSK TTCM encoding that provides a bandwidth efficiency of at least 3 bit/s/Hz. Again, this TTCM encoding of the signal is supported using a rate control sequence having 1 or more RCs arranged in a period, and a single rate control sequence may include RCs corresponding to different modulations such as 16 QAM (or 16 APSK) and QPSK.

The decoder may be implemented to perform decoding of these TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period). The FIG. 12 shows yet another embodiment where one or more of the various aspects of the invention may be found.

Figure 13:
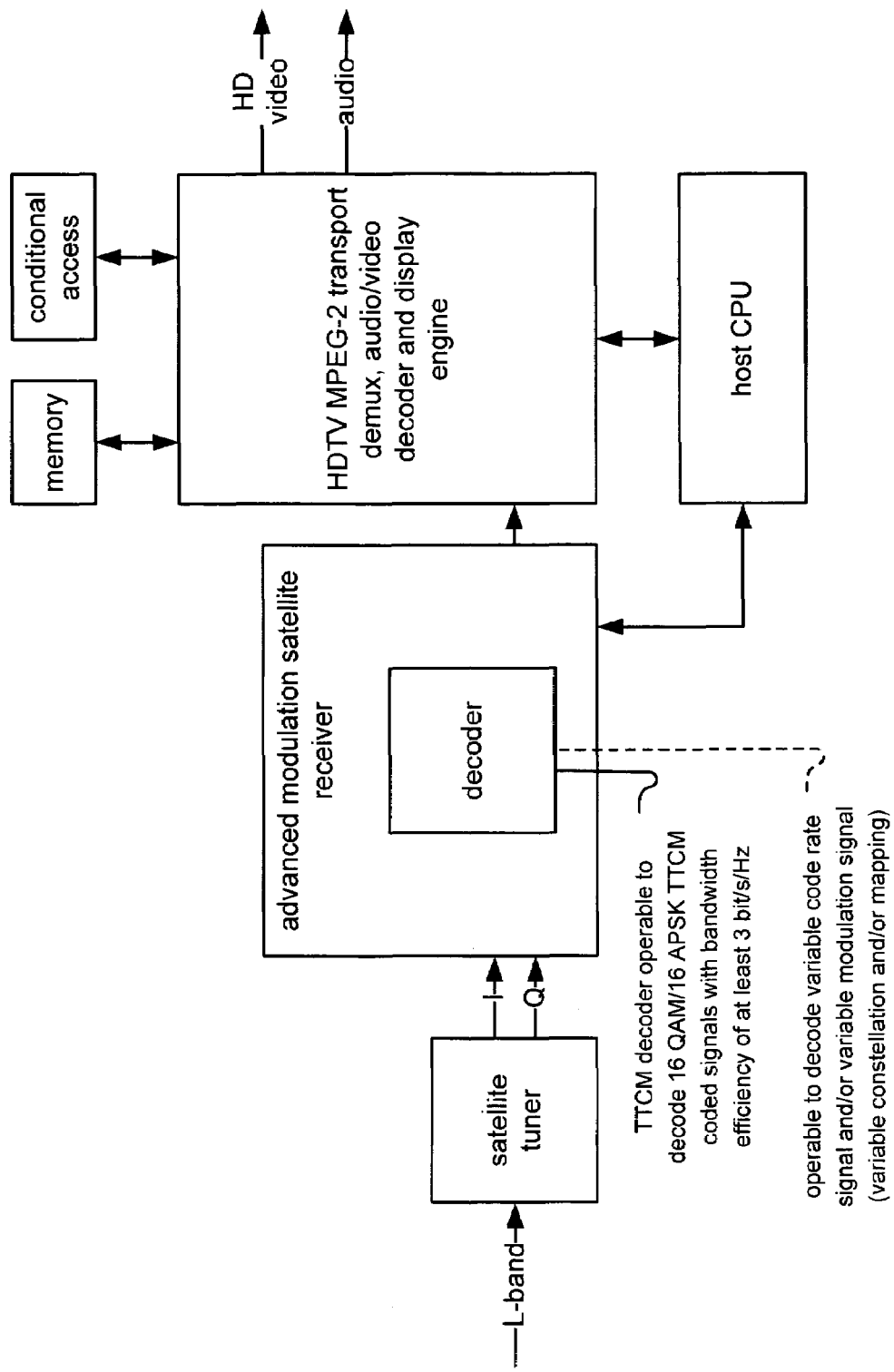
FIG. 13 is a system diagram illustrating an embodiment of a satellite receiver STB (Set Top Box) system that is built according to the invention.

FIG. 13 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band. The satellite tuner extracts I,Q (in-phase and quadrature) components from a signal received from the L-band and provides them to the advanced modulation satellite receiver. The advanced modulation satellite receiver includes a decoder.

As within other embodiments that employ a decoder, the decoder may be implemented to perform decoding of TTCM coded signals. In addition, this TTCM decoding may also be implemented to accommodate decoding processing of a signal whose code rate and/or modulation may vary as frequently as on a symbol by symbol basis (again directed according to the rate control sequence including 1 or more RCs arranged in a period).

The advanced modulation satellite receiver may be implemented to communicatively couple to an HDTV MPEG-2 (Motion Picture Expert Group 2 Standard—compressed video at 4–9 Mbps (Mega-bits per second)) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that performs decoding of TTCM coded signals according to the invention. The advanced modulation satellite receiver is operable to receive communication provided to it from a transmitter device that includes an encoder as well.

In addition, several of the following Figures describe particular embodiments that may be used to implement some of the various aspects of the TTCM encoding and/or TTCM decoding according to the invention. This may involve processing signals whose code rate and/or modulation may vary as frequently as on a symbol by symbol basis. Details of these various aspects are provided below.

Figure 14:
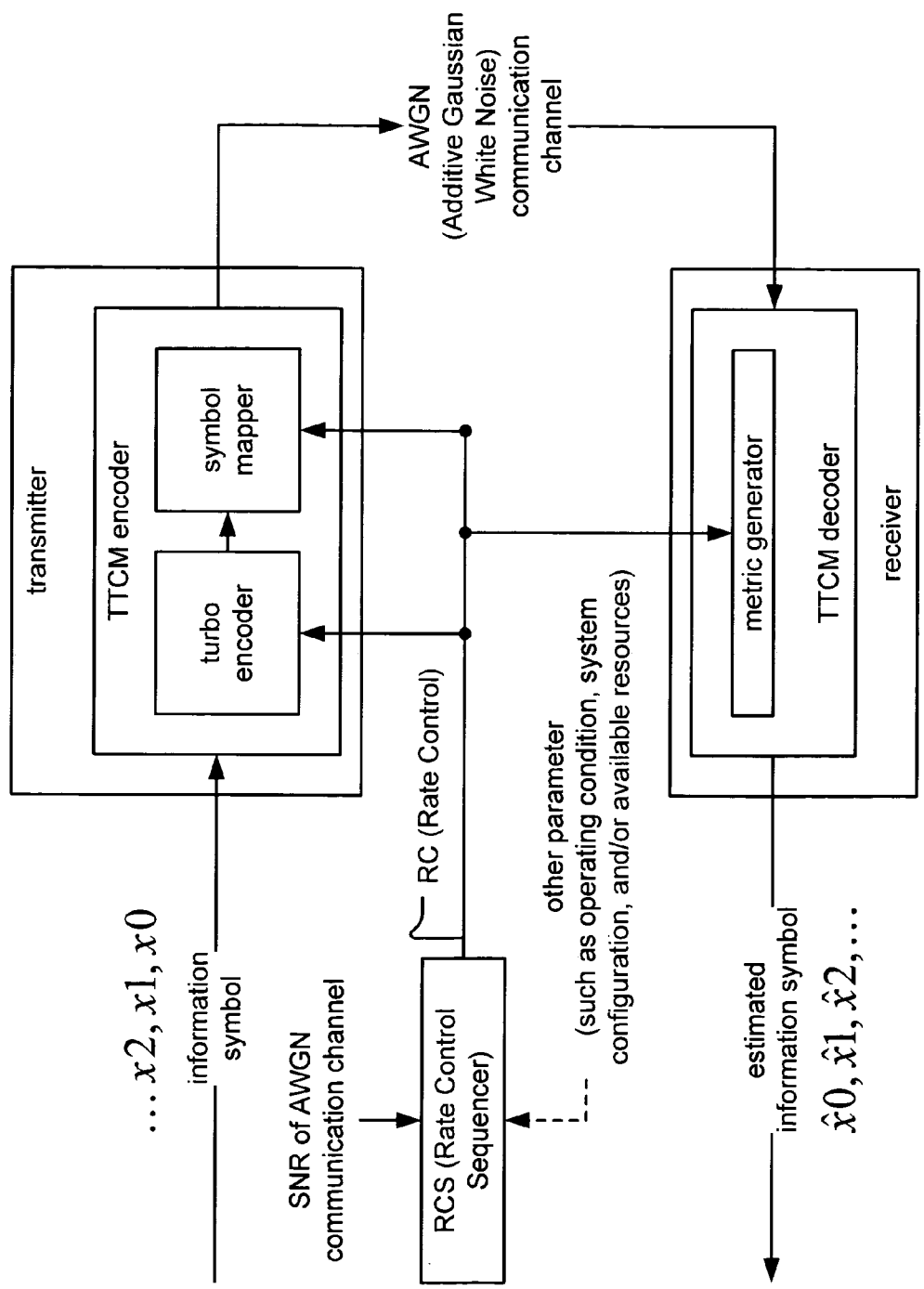
FIG. 14 is a system diagram illustrating an embodiment of a TTCM (Turbo Trellis Coded Modulation) communication system that is built according to the invention.

FIG. 14 is a system diagram illustrating an embodiment of a TTCM (Turbo Trellis Coded Modulation) communication system that is built according to the invention. The TTCM communication system includes a transmitter and a receiver that are communicatively coupled to one another via a communication channel that introduces AWGN (Additive White Gaussian Noise) to the signal. The communication channel may be wireline or wireless according to the invention. The AWGN communication channel may be viewed as being a relatively noisy communication channel in some embodiments.

The transmitter includes a TTCM encoder that encodes one or more information symbols and then modulates those encoded symbols. Those encoded symbols may also undergo symbol mapping (sometimes referred to as modulation encoding) to map those symbols to a constellation and an associating mapping. The transmitter then prepares this signal for transmission across the communication channel. At the other end of the communication channel, the receiver includes a TTCM decoder that receives and estimates the encoded symbols that have been transmitted across the communication channel. Further details of the operation of the various functional blocks contained within the TTCM encoder and the TTCM decoder are also described in more detail below.

Generally speaking, within the TTCM encoder, a turbo encoder performs symbol encoding and the symbol mapper maps those encoded symbols to an appropriate modulation (including a constellation and a corresponding mapping) as directed by a rate control sequence (including 1 or more RCs) as provided by a rate control sequencer. Similarly, generally speaking within the TTCM decoder, the TTCM decoder performs calculations, beginning by using the metrics calculated by a metric generator, that are employed to perform decoding of the received symbols.

In some embodiments, the particular rate control sequences provided by the rate control sequencer (or the individual RCs within the rate control sequence) may be modified adaptively in response to various parameters. Examples of these parameters may include the SNR of the AWGN communication channel, an operating condition, a system configuration, and/or the available resources of the devices employed within the communication system.

It is also understood that a variety of means of modulation, transmission, receipt, and demodulation may be performed to generate the analog signals to be transmitted across the communication channel without departing from the scope and spirit thereof. Each and any such means may be practiced according to the invention while performing the TTCM encoding/decoding described herein.

Figure 15:
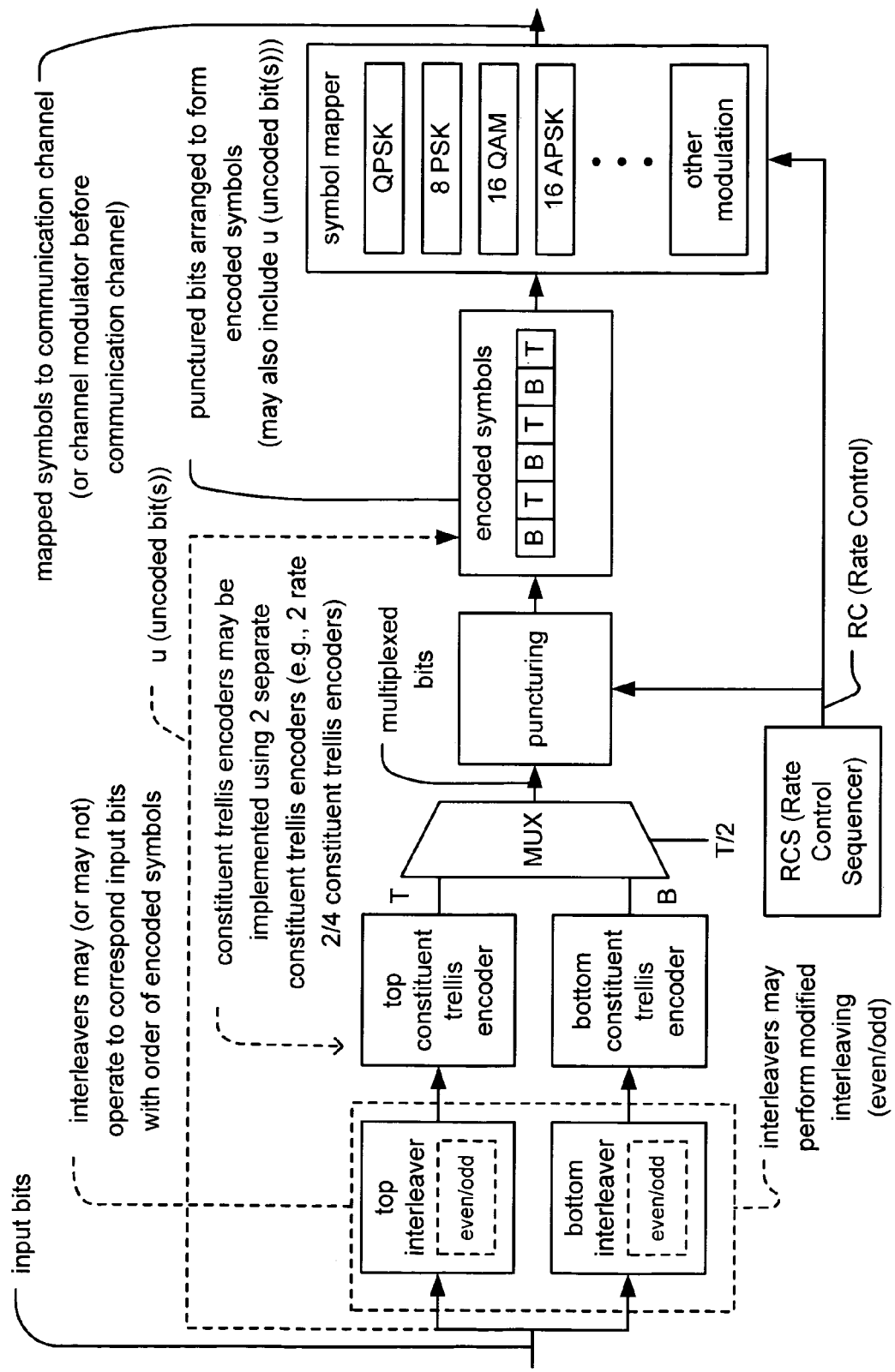
FIG. 15 is a diagram illustrating an embodiment of a dual interleaver embodiment of a TTCM (Turbo Trellis Coded Modulation) encoder that is built according to the invention.

FIG. 15 is a diagram illustrating an embodiment of a dual interleaver embodiment of a TTCM (Turbo Trellis Coded Modulation) encoder that is built according to the invention. Input bits are provided simultaneously to a top path and a bottom path. The top path includes a top interleaver communicatively coupled to a top constituent trellis encoder, and the bottom path includes a bottom interleaver communicatively coupled to a bottom constituent trellis encoder.

It is also noted here that these top and bottom interleavers may be implemented such that they operate to correspond the order of the input bits with the order in which the encoded symbols are output from this embodiment of the TTCM encoder. That is to say, the first output symbol (e.g., encoded and symbol mapped output symbol) that is output from the TTCM encoder corresponds to the first group of input bits (or first input symbol) that is provided to the TTCM encoder. Similarly, the second output symbol corresponds to the second group of input bits (or second input symbol) that is provided to the TTCM encoder. Alternatively, the interleaver may be implemented such that corresponding the order of the input bits (or symbols) need not necessarily correspond to the output order of the encoded symbols to the input order of the groups of input bits (or input symbols).

The input bits are simultaneously provided to the top and bottom path where two separate pluralities of encoded bits are generated (that correspond to the top and bottom paths, respectively). The outputs from the top and bottom paths are provided to a MUX (Multiplexor) whose selection is provided by a clock signal that is clocked at ½ the rate at which the input bits are provided to the top and bottom paths. This way, the output of the MUX will alternatively select the outputs from the top and bottom paths thereby generating two separate pluralities of multiplexed bits.

It is noted as well that a variety of interleaves may be performed for each of the top interleaver and the bottom interleaver as selected for the particular application. The following example shows one embodiment of how the interleaving may be performed for the top interleaver and the bottom interleaver.

This embodiment described an even/odd interleaving where the odd positions input bits and the even positions input bits are each treated differently. For each of the top interleaver and the bottom interleaver, we let $\pi_0$ and $\pi_1$ be the interleaves for each bit within the two bit input symbol, $i_0 i_1$. According to this approach, the interleavers may be viewed as being implemented as modified interleavers (e.g., each of the top interleaver and bottom interleaver) within the encoding process; these modified interleavers are each variants of the interleaver, $\pi_I$, as defined below. There are, in effect, two interleaves that are functionally performed within the top interleaver, and also two interleaves that are functionally performed within the bottom interleaver in this approach. A total of four interleaves are performed when considering both the top interleaver and bottom interleaver in this embodiment. These interleaves are performed independently for each bit within the two bit input symbol, $i_0 i_1$. The decoding process, described in more detail below, may employ the modified interleaving/de-interleaving shown here during initialization; however, when performing actual decoding of a received symbol's bits, it only employs the non-modified interleaver, $\pi_I$, and the de-interleaver, $\pi_I^{-1}$. Within this dual interleaver embodiment of the TTCM encoder, the modified interleaving may be performed as follows:

top interleaver=i for i mod 2=0 (for even positions)
top interleaver=$\pi_I^{-1}$ (i) for i mod 2=1 (for odd positions)
bottom interleaver=$\pi_I$ (i) for i mod 2=0
bottom interleaver=i for i mod 2=1
Where, l=0,1 for two bit input symbol, $i_0 i_1$.

This modified interleaving is performed to ensure the following: when we input a symbol sequence, $S_1 S_2 S_3 S_4$, then the encoded corresponding output from those symbols is in the same order. More specifically, the output from the TTCM encoder will be the encoded output for $S_1$, followed by the encoded output for $S_2$, followed by the encoded output for $S_3$, and finally followed by the encoded output for $S_4$. The output encoded symbol sequence, shown as BTBTBT, maintains this sequential order (based on the order of the input symbols) because of the modified interleaving performed herein.

In other words, the input symbols (or input bits) come into the encoder according to a particular sequence, and the encoded symbols that are output from the TTCM encoder leave according to that same sequence.

Again, this approach to interleaving shows just one of the examples of how interleaving may be performed according to the invention. Other interleaves may also be designed for a particular application. This particular interleaving is used to illustrate the functionality of the invention in several embodiments of the invention in the various Figures and written description.

These output bits, after having undergone interleaving and encoding, are then output to a puncturing functional block. In addition, 1 or more uncoded bits (shown as u) may be provided to the puncturing functional block for use to form an encoded symbol. In certain embodiments, no puncturing is performed on the bits output from the MUX. For example, no puncturing need be performed on the groups of multiplexed bits selected by the MUX. However, in other embodiments, puncturing is performed according to a rate control sequence (that includes 1 or more RCs arranged in a period) provided by the rate control sequencer. A variety of encoded symbols may then be generated according to the outputs from the top and bottom paths. These now punctured bits are then arranged to form an encoded symbol. This arrangement of the bits that remain after puncturing may include re-ordering the bits. For example, in an embodiment where 4 bits remain after puncturing (e.g., $ub_0 b_1 b_4$), then those bits may be re-ordered a $b_4 ub_1 b_0$ to form a 4 bit symbol for use in 16 QAM or 16 APSK modulation encoding. Clearly, a large variety of types of re-ordering of these bits may be performed without departing from the scope and spirit of the invention.

These encoded symbols are then passed to a symbol mapper where the encoded symbols are mapped according to the appropriate modulation (constellation and mapping) as governed by the particular RC of the rate control sequence (provided by the rate control sequencer) that corresponds to that encoded symbol. Any number of modulations may be employed, including QPSK, 8 PSK, 16 QAM, and/or 16 APSK, among other types of modulations. Again, each modulation may have a particular shaped constellation and corresponding mapping of the constellation points included therein. The dual interleaver embodiment of the TTCM encoder shows yet another of the many embodiments in which TTCM encoding may be performed. It is noted that other TTCM encoding embodiments (and/or other turbo encoding embodiments) are also envisioned within the scope and spirit of the invention to support the variable code rate and/or variable modulation functionality described herein.

Figure 16A:
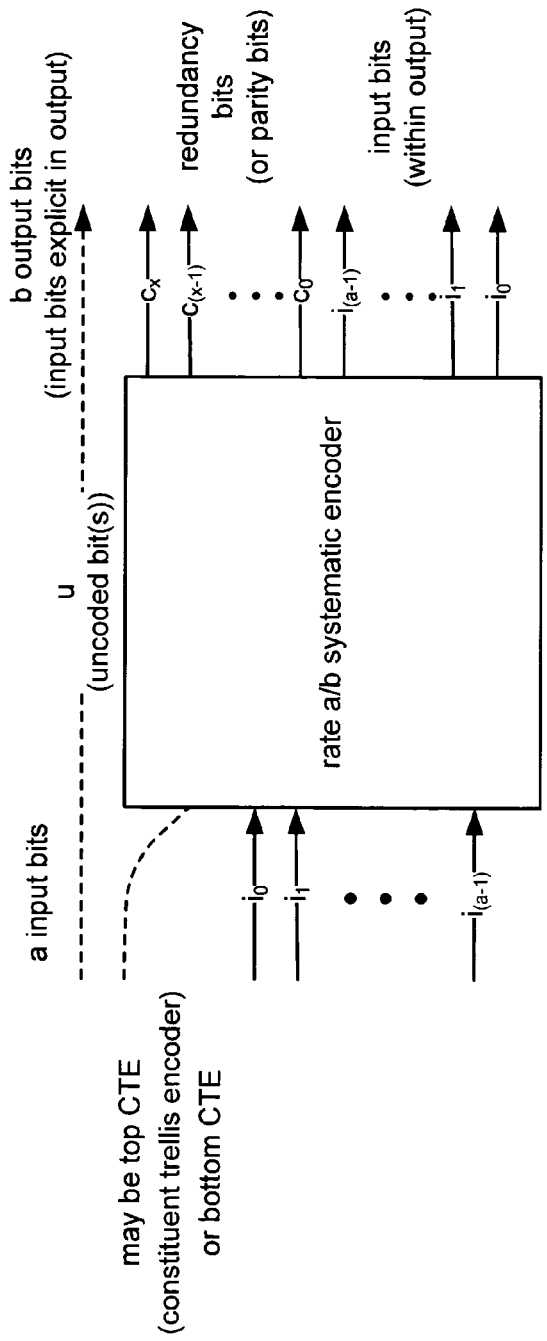
FIG. 16A is a diagram illustrating an embodiment of a systematic constituent encoder that is built according to the invention.

FIG. 16A is a diagram illustrating an embodiment of a systematic constituent encoder that is built according to the invention. In general terms, the systematic constituent encoder shows an encoder that encodes "a" input bits (shown as $i_0, i_1, \ldots,$ and $i_{(a-1)}$). The systematic constituent encoder is a rate a/b encoder where "a" input bits are provided and "b" output bits are output. The "b" output bits include "x" number of redundancy bits (or parity bits) (shown as $c_x, c_{(x-1)}, \ldots,$ and $c_0$) that are coded as a function of one or more of the "a" input bits as well as each of the "a" input bits themselves. A systematic constituent encoder may be viewed as being an encoder where the input bits are explicitly represented and available in the output of the constituent encoder. In addition, one or more uncoded bits u may be provided as output of the constituent encoder without having undergone any encoding at all. It is noted that sum of the total number of coded bits "x" and the "a" input bits is equal to the number of output bits "b" in this rate a/b encoder.

It is also noted that one or both of the top constituent trellis encoder and the bottom constituent trellis encoder described within the various embodiments of TTCM encoders may be implemented using the systematic constituent encoder shown in this embodiment. It is also noted that non-systematic encoding is also included within the scope and spirit of the invention. A non-systematic constituent encoder may be viewed as being an encoder where the input bits are not explicitly represented and available in the output of the encoder.

Figure 16B:
FIG. 16B is a diagram illustrating an embodiment of a rate 2/4 constituent encoder that is built according to the invention.

FIG. 16B is a diagram illustrating an embodiment of a rate 2/4 constituent encoder that is built according to the invention. This embodiment is a particular implementation of a rate a/b constituent encoder (namely, where a=2 and b=4). Two input bits (shown as $i_{k,m},i_{k,l}$) are provided to the rate 2/4 constituent encoder. In addition, one or more uncoded bits (shown as $u_k$) may be provided as output of the constituent encoder without having undergone any encoding at all. Four encoded bits are output from the rate 2/4 constituent encoder (shown as $i_{k,m},i_{k,l},r_{k,l},r_{k,ml}$). Within the output of the rate 2/4 constituent encoder, the redundancy (or parity) bits are shown as $r_{k,l},r_{k,ml}$. This embodiment shows just one specific example of a rate 2/4 encoder, and other code rate encoders may similarly be implemented in accordance with invention.

Figure 17A:
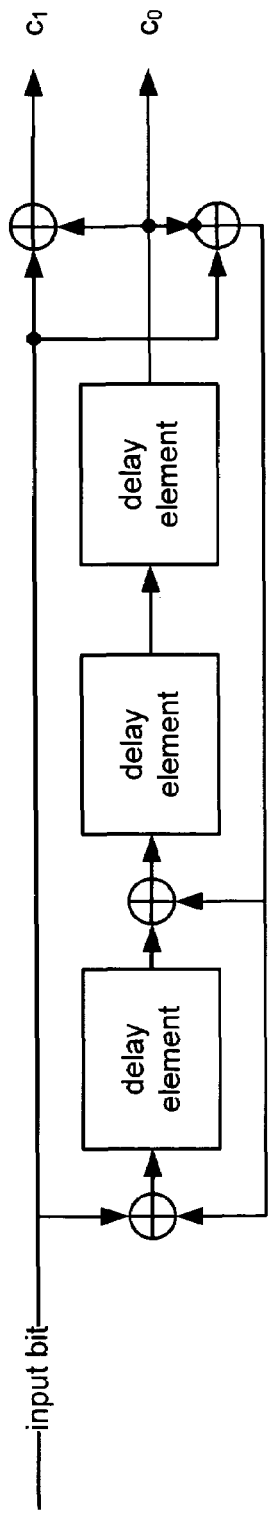
FIG. 17A is a diagram illustrating an embodiment of a rate 1/2 recursive convolutional encoder with non-systematic output that is built according to the invention.

FIG. 17A is a diagram illustrating an embodiment of a rate 1/2 recursive convolutional encoder with non-systematic output that is built according to the invention. The rate is 1/2 as there is one input information bit and two output encoded bits. The encoder receives a single input bit and generates two encoded bits ($c_1$, $c_0$). The recursive operation of the encoder may be viewed as follows. The input bit is selectively summed with delayed versions of itself to generate the two encoded bits.

This encoder circuit represents one way to encode an input bit to generate two encoded bits. Clearly, the invention envisions other embodiments and types of encoders as well. This particular example of the rate 1/2 recursive convolutional encoder with non-systematic output is used to illustrate the scalability and extendibility of the invention across a number of encoding schemes. This rate 1/2 recursive convolutional encoder with non-systematic output may be used as one building block to generate a rate 2/4 constituent encoder according to the invention.

Figure 17B:
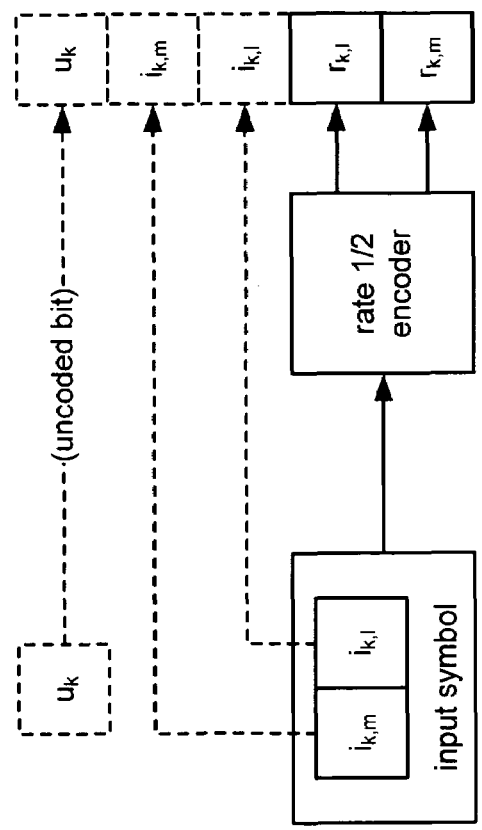
FIG. 17B is a diagram illustrating an embodiment of a rate 2/4 prototype encoder that is built according to the invention.

FIG. 17B is a diagram illustrating an embodiment of a rate 2/4 prototype encoder that is built according to the invention. Two bits are provided at a time as an input symbol (having input bits $i_{k,m},i_{k,l}$) to the rate 2/4 prototype encoder. These two bits may be provided to the rate 2/4 prototype encoder serially, or alternatively, in a parallel manner. The input of the rate 2/4 prototype encoder includes both of these input bits. Each of the bits of the input symbol is provided as output of the encoder, $i_{k,m},i_{k,l}$, and because both input bits $i_{k,m},i_{k,l}$ are available in the form in which they are provided, the encoder may be viewed as a systematic encoder. In certain situations as will be seen below, an uncoded bit (shown as $u_k$) may also be employed during the encoding. The output of the rate 2/4 prototype encoder is shown as being $i_{k,m},i_{k,l},r_{k,l},r_{k,ml}$.

Figure 18:
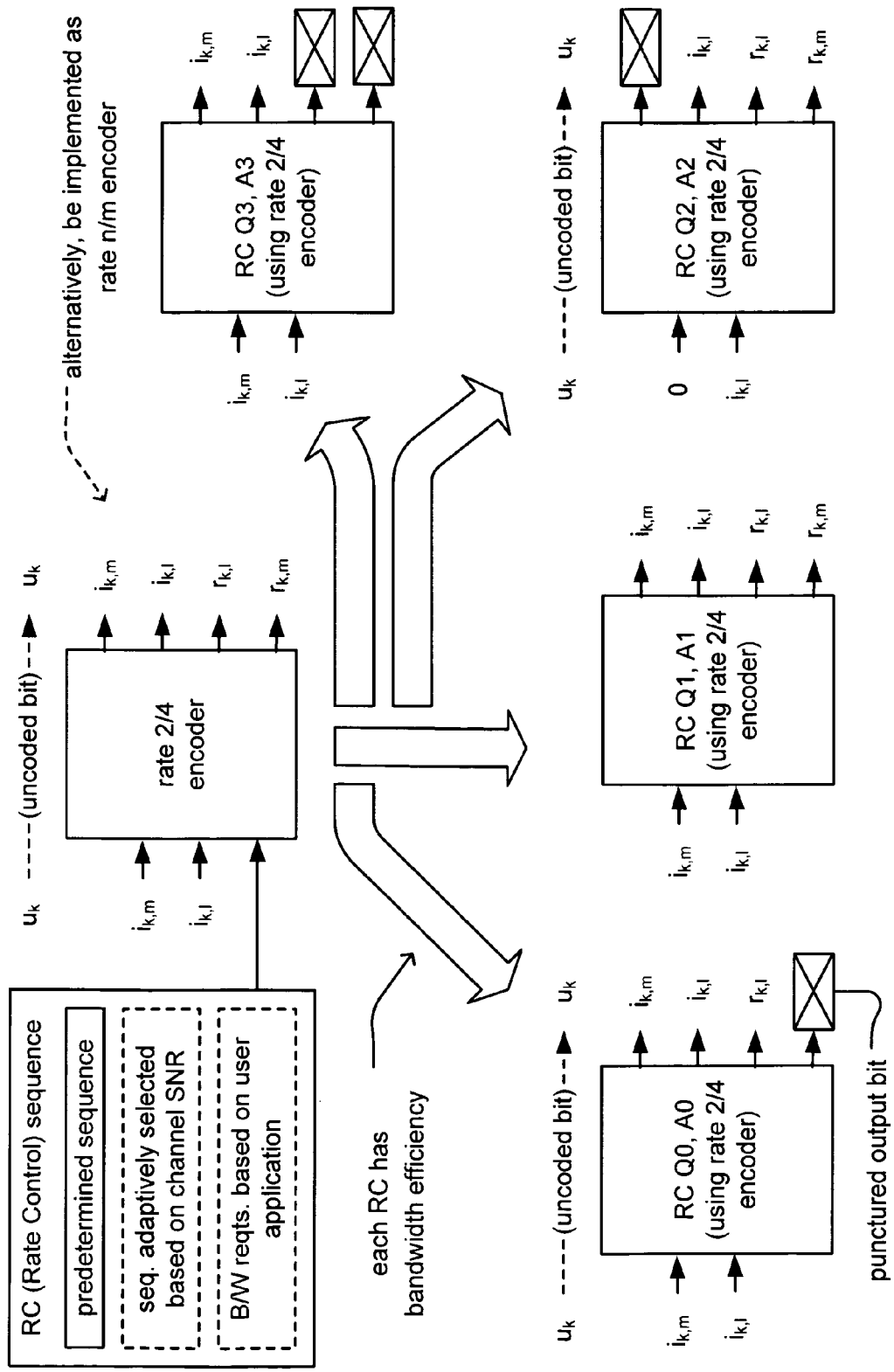
FIG. 18 is a diagram illustrating an embodiment of a rate 2/4 prototype encoder supporting multiple encoders according to the invention.

FIG. 18 is a diagram illustrating an embodiment of a rate 2/4 prototype encoder supporting multiple encoders according to the invention. Here, the rate 2/4 prototype encoder is implemented to perform the functionality of multiple encoders. Puncturing is performed on the output bits of the encoder to generate the various options of encoded symbols that include encoded bits and/or uncoded bits. The variable code rate functionality of the invention, shown in the context of the rate 2/4 prototype encoder may cycle through a number of RCs arranged in a period to form a rate control sequence. Each of these RCs has a particular bandwidth efficiency. Cooperatively, the bandwidth efficiencies of the individual RCs in a rate control sequence provide an average bandwidth efficiency across that entire rate control sequence.

The rate control sequencer may cycle through a predetermined rate control sequence; it may adaptively select one or more new rate control sequences based on operating conditions such as a communication channel's SNR, bandwidth requirements based on various user applications, or according to some other consideration as well.

The encoding supported by the rate 2/4 prototype encoder may be for some exemplary RCs as described as follows:

Within the rate 2/4 prototype encoder as implemented according to RC Q0 or A0, an overall rate 2/4 encoder is achieved. Two information bits ($i_{k,m},i_{k,l}$) as well as one uncoded bit, $u_k$, are input to the rate 2/4 prototype encoder for the RC Q0 or A0. The output of encoding punctures the encoded bit $r_{k,ml}$, leaving $i_{k,m},i_{k,l},r_{k,l}$ as well as the uncoded bit $u_k$. These remaining bits are then used to generate a 4 bit encoded symbol that will be mapped according to a 4 bit symbol modulation (constellation and mapping) as defined by RC Q0 or A0 (corresponding to 16 QAM or 16 APSK, respectively).

Within the rate 2/4 prototype encoder as implemented according to RC Q1 or A1, an overall rate 2/4 encoder is again achieved. Two information bits ($i_{k,m},i_{k,l}$), but no uncoded bit, are input to the rate 2/4 prototype encoder for the RC Q1 or A1. The output of encoding does not puncture any of the encoded bits $r_{k,ml}$, leaving $i_{k,m},i_{k,l},r_{k,l},r_{k,ml}$. These remaining bits are then used to generate a 4 bit encoded symbol that will be mapped according to a 4 bit symbol modulation (constellation and mapping) as defined by RC Q1 or A1 (corresponding to 16 QAM or 16 APSK, respectively).

Within the rate 2/4 prototype encoder as implemented according to RC Q2 or A2, an overall rate 2/4 encoder is achieved. One information bits ($i_{k,m,ik,l}=0,i_{k,l}$) as well as one uncoded bit, $u_k$, are input to the rate 2/4 prototype encoder for the RC Q1 or A1. The output of encoding punctures the $i_{k,m}$ bit (which has a 0 value), leaving $i_{k,l},r_{k,l},r_{k,ml}$, as well as the uncoded bit $u_k$. These remaining bits are then used to generate a 4 bit encoded symbol that will be mapped according to a 4 bit symbol modulation (constellation and mapping) as defined by RC Q2 or A2 (corresponding to 16 QAM or 16 APSK, respectively).

Within the rate 2/4 prototype encoder as implemented according to RC Q3 or A3, an overall rate 2/2 encoder is achieved. Two information bits ($i_{k,m},i_{k,l}$), but no uncoded bit, are input to the rate 2/4 prototype encoder for the RC Q3 or A3. The output of encoding punctures the encoded bits $r_{k,l},r_{k,ml}$, leaving $i_{k,m},i_{k,l}$. These remaining bits are then used to generate a 2 bit encoded symbol that will be mapped according to a 2 bit symbol modulation (constellation and mapping) as defined by RC Q3 or A3 (corresponding to 2 different QPSK modulations, respectively).

This embodiment shows how the same rate 2/4 prototype encoder may be implemented, as directed by various RCs, to support encoding for 16 QAM, 16 APSK, and QPSK. Clearly, another RC could be implemented to support encoding for 8 PSK (where 3 bits are remaining after any possible puncturing). In addition, other, higher order modulations could also be supported. It is also noted that the remaining bits, for any of these RCs as well as other RCs, may be re-ordered as described above.

Each of the individual RCs may be viewed as being functionality supported by distinct encoders, yet a single device is operable to support all of these encoders according to the variable code rate and/or variable modulation functionality described herein.

Figure 19:
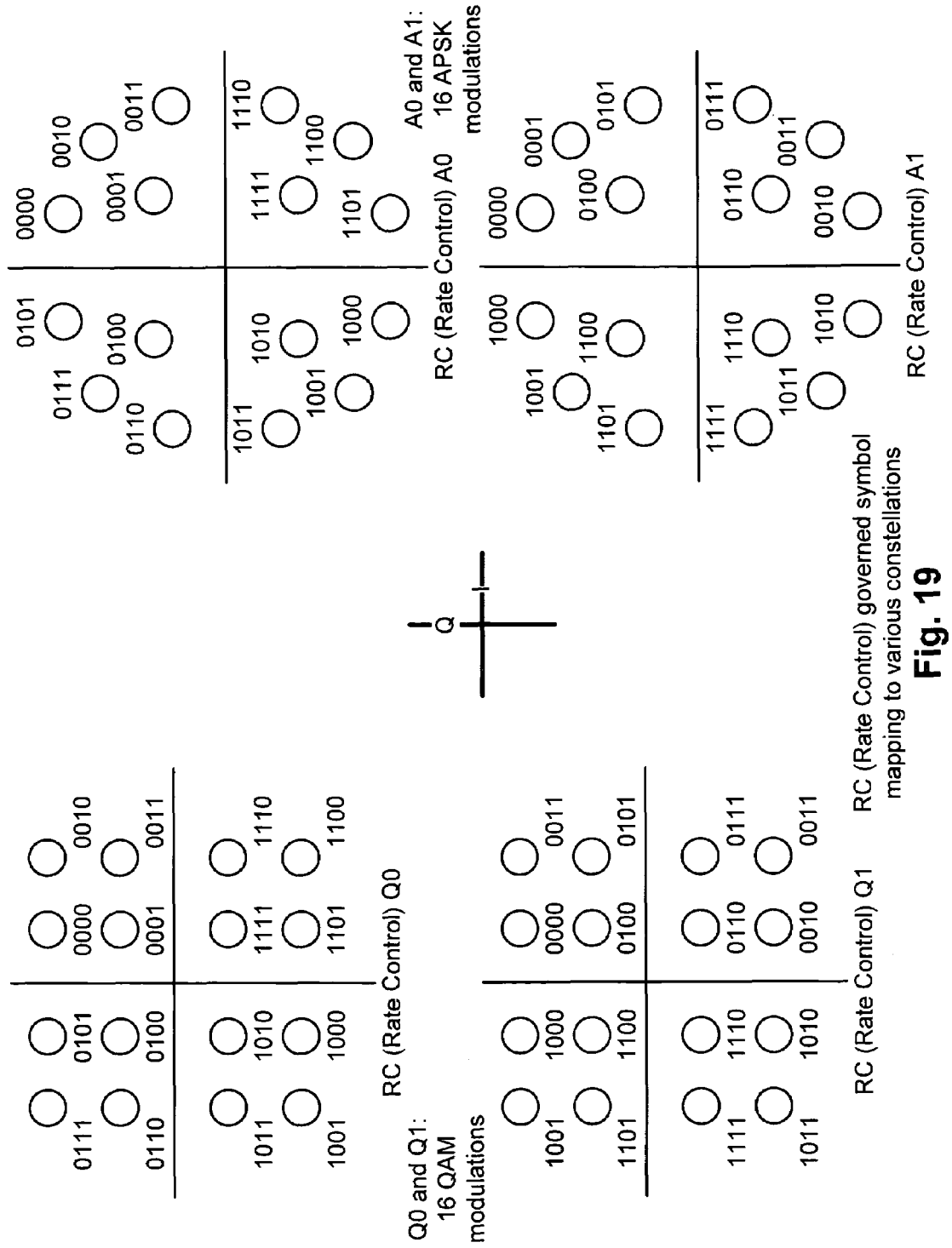
FIG. 19 and FIG. 20 are diagrams illustrating various embodiments of RC (Rate Control) governed symbol mapping to various constellations according to the invention.
Figure 20:
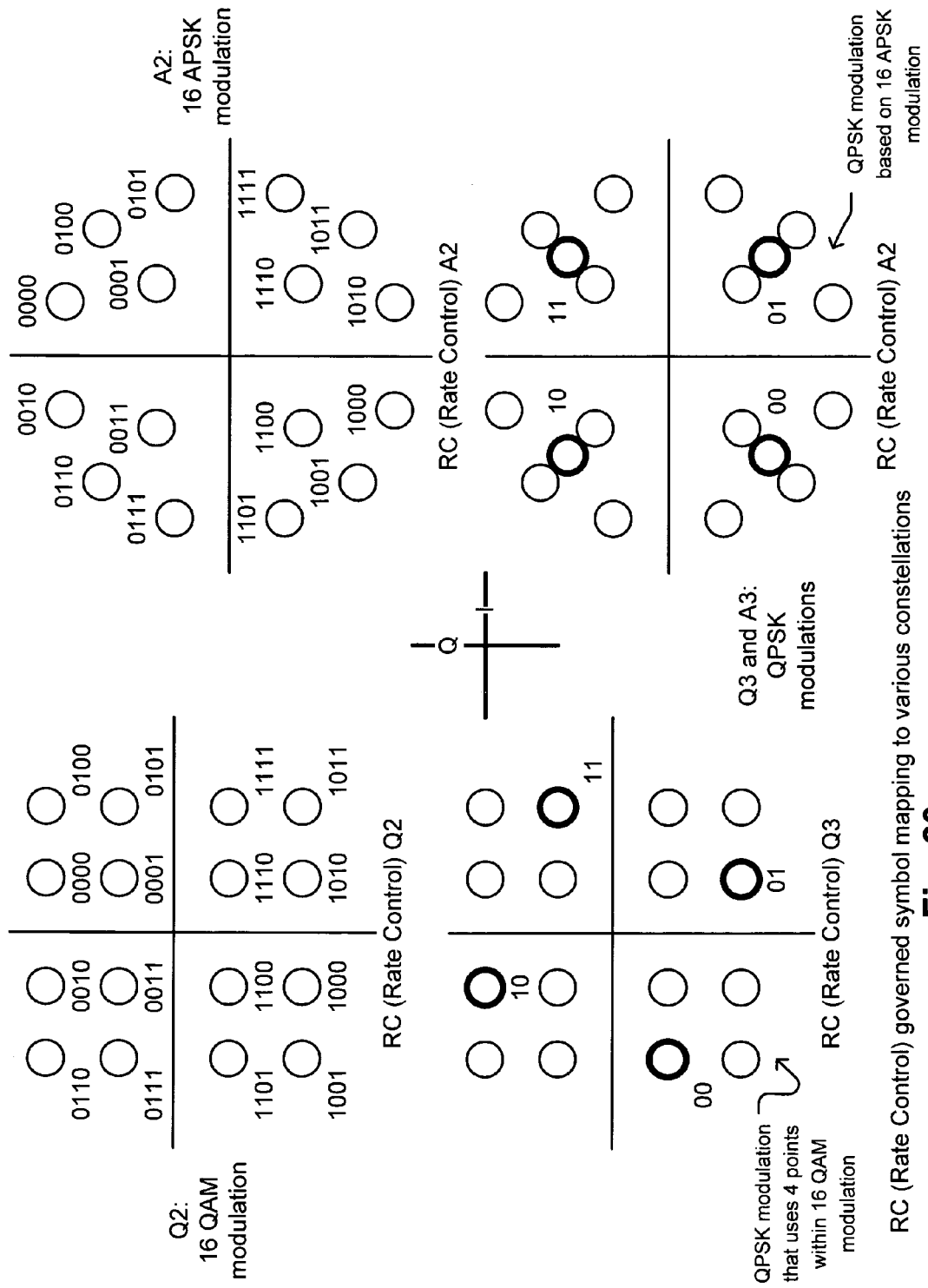

FIG. 19 and FIG. 20 are diagrams illustrating various embodiments of RC (Rate Control) governed symbol mapping to various constellations according to the invention.

Referring to the FIG. 19, 2 separate 16 QAM modulations (including 16 QAM shaped constellation and corresponding mappings) are shown for the RCs Q0 and Q1, respectively. In addition, 2 separate 16 APSK modulations (including 16 APSK shaped constellation and corresponding mappings) are shown for the RCs A0 and A1, respectively. For each of the modulations, the 4 bit encoded symbols are appropriately mapped to the corresponding constellation points within the respective constellation.

Referring to the FIG. 20, a 16 QAM modulation (including a 16 QAM shaped constellation and corresponding mapping) is shown for the RC Q2, and a 16 APSK modulation (including a 16 APSK shaped constellation and corresponding mapping) is shown for the RC A2. For each of the modulations, the 4 bit encoded symbols are appropriately mapped to the corresponding constellation points within the respective constellation.

In addition, a QPSK modulation (including a QPSK shaped constellation and corresponding mapping) is shown for the RC Q3. For this modulation, the 2 bit encoded symbols are appropriately mapped to the corresponding constellation points within the respective constellation. The 4 constellation points of this QPSK modulation may be viewed as being 4 particular constellation points selected from a 16 QAM shaped constellation. Such an implementation may allow savings in memory, in that, the appropriate selected coefficients employed from the 16 QAM constellation may also be employed to perform coding for this QPSK modulation.

A different APSK modulation (including a different APSK shaped constellation and corresponding mapping) is shown for the RC A3. For each of the modulations, the 2 bit encoded symbols are appropriately mapped to the corresponding constellation points within the respective constellation. Again within this modulation, the 2 bit encoded symbols are appropriately mapped to the corresponding constellation points within the respective constellation. The 4 constellation points of this QPSK modulation may be viewed as being referenced to 4 particular constellation points within a 16 APSK shaped constellation. For example, the 4 QPSK constellation points within this QPSK modulation lie in between the two concentric circles that connect the 4 inner constellation points and the 12 outer inner constellation points of the 16 APSK constellation. Such an implementation may allow savings in memory, in that, appropriately modified and selected coefficients employed from the 16 APSK constellation may also be employed to perform coding for this QPSK modulation.

Figure 21A:
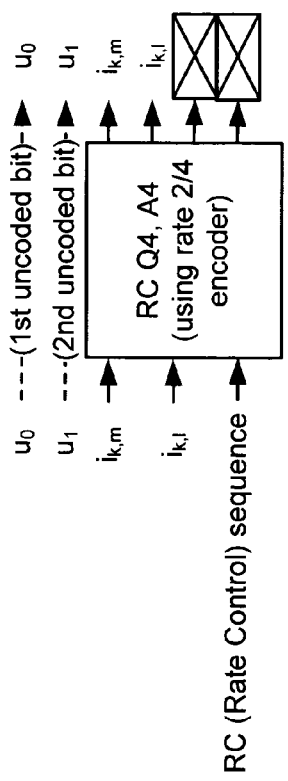
FIG. 21A is a diagram illustrating an embodiment of a rate 2/4 prototype encoder supporting RCs Q4, A4 (each having 2 uncoded bits) according to the invention.

FIG. 21A is a diagram illustrating an embodiment of a rate ⅔ prototype encoder supporting RCs Q4, A4 (each having 2 uncoded bits) according to the invention. These new RCs Q4 and A4 correspond to 16 QAM and 16 APSK TTCM, respectively. In these RC signals, all four bits are information bits. However, there are 2 coded bits which go through the encoder and thus are protected by the following redundancy bits. In addition, there are other two uncoded bits which only can be protected by the distance of the signals.

Within the rate ⅔ prototype encoder as implemented according to RC Q4 or A4, an overall rate ⅔ encoder is achieved. Two information bits $(i_{k,m}, i_{k,l})$ as well as 2 uncoded bits, $u_0, u_1$, are input to the rate ⅔ prototype encoder for the RC Q4 or A4. The output of encoding punctures the encoded bits $r_{k,1}, r_{k,ml}$, leaving $i_{k,m}, i_{k,l}$ as well as the 2 uncoded bits $u_0, u_1$. These remaining bits are then used to generate a 4 bit encoded symbol that will be mapped according to a 4 bit symbol modulation (constellation and mapping) as defined by RC Q4 or A4 (corresponding to 16 QAM or 16 APSK, respectively).

Figure 21B:
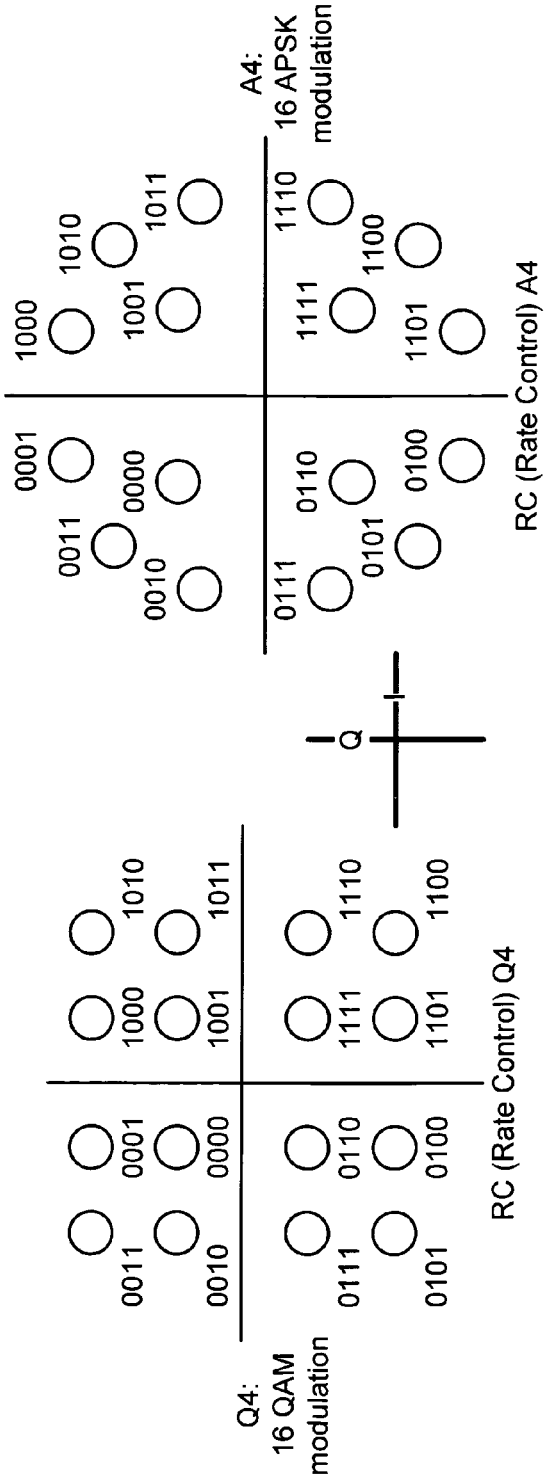
FIG. 21B is a diagram illustrating various embodiments of RC (Rate Control) governed symbol mapping to various constellations according to the invention.

FIG. 21B is a diagram illustrating various embodiments of RC (Rate Control) governed symbol mapping to various constellations according to the invention. A 16 QAM modulation (including a 16 QAM shaped constellation and corresponding mapping) is shown for the RC Q4, and a 16 APSK modulation (including a 16 APSK shaped constellation and corresponding mapping) is shown for the RC A4. For each of the modulations, the 4 bit encoded symbols are appropriately mapped to the corresponding constellation points within the respective constellation.

FIG. 22A is a diagram illustrating an embodiment of periodic RC (Rate Control) sequences of TTCM supporting bandwidths bandwidth efficiencies of at least 3 bit/s/Hz according to the invention. Each of the rate control sequences shown in this embodiment include 3 RCs arranged in a period. After encoding 3 symbols, the period is repeated to encode the next 3 symbols, and so on until the end of the data frame or the end of the information sequence that is to be encoded.

More specifically, for the rate control sequence including RCs Q0 Q0 Q4, three successive symbols are generated according to these 3 RCs. More specifically, a first symbol is generated according to the RC Q0, a second symbol is generated according to the RC Q0, and a third symbol is generated according to the RC Q4.

Analogously, for the rate control sequence including RCs A0 A0 A4, three successive symbols are generated according to these 3 RCs. More specifically, a first symbol is generated according to the RC A0, a second symbol is generated according to the RC A0, and a third symbol is generated according to the RC A4.

In terms of operation, this successive coding is applicable to all of the various rate control sequences shown and described herein (with the exception, of course, that the encoding is performed according to the particular RCs included therein).

The encoding using the rate control sequence including the RCs Q0 Q0 Q4 (as well as those rate control sequences including the RCs A0 A0 A4) is able to generate an encoded signal having a bandwidth efficiency that is greater than approximately 3 bit/s/Hz (bits per second per Hertz). More specifically, these rate control sequences are able to generate an encoded signal having a bandwidth efficiency that is approximately 3.33 bit/s/Hz. Other rate control sequences are operable to generate encoded signals having even greater bandwidth efficiencies.

Encoding using the rate control sequence including the RCs Q0 Q0 Q4 Q4 (as well as those rate control sequences including the RCs A0 A0 A4 A4) is able to generate an encoded signal having a bandwidth efficiency that is approximately 3.5 bit/s/Hz.

FIG. 22B is a diagram illustrating an embodiment of a TTCM decoder system that is built according to the invention. A received signal (shown as Rx signal) is provided to an I,Q extraction functional block that extracts the I,Q (In-phase, Quadrature) components from the received signal that are mapped according to a RC as determined by the rate control sequencer. This may be viewed as being receiver pre-processing. The I,Q is then mapped according to the modulation's appropriate constellation and mapping (as directed by the appropriate RC).

Then, the mapped I,Q is passed to a metric generator that also receives the RC input from the rate control sequencer. The metric generator generates the appropriate metrics that are measured from the received I,Q to the constellation points within the modulation's appropriate constellation and mapping as directed by the RC for that symbol. The metrics are indexed by the mapping of the constellation points within the modulation. These metrics may be viewed as being the scaled Euclidian distances from the location of the actual received symbol to the expected constellation point locations within the modulation's constellation.

In the event that an uncoded bit needs to be decoded, the metric associated with each uncoded bit having a value of 0 (e.g., u=0) is compared with the metric associated with that uncoded bit having a value of 2 (e.g., u=1), and the smaller metric value is selected. For embodiments including more than 1 uncoded bit, the various combinations of possible uncoded bit values are considered as well. The smaller metric value is deemed a higher likelihood than the larger metric value according to this embodiment's convention. Alternatively, a larger metric value may be deemed a higher likelihood than the smaller metric value according to another embodiment's convention.

In addition, the value of u is selected based upon which metric has the smaller value. The possible value of the uncoded bit u, being either 1 or 0 is determined by which of the associated metrics has the smaller value (metric associated with uncoded bit (u=0) or the metric associated with uncoded bit (u=1)). In certain embodiments, min* processing may be performed that includes a logarithmic correction in selecting the smaller metric. Alternatively, max* processing may be performed that includes a logarithmic correction in selecting a larger metric. It is noted that various embodiments of the invention may be implemented using the max* operations in lieu of the min* operation when preferred in a given implementation.

The min* calculation may be expressed as follows:

$$\min^*(A, B) = \min(A, B) - \ln(1 + e^{-|A-B|})$$

The max* calculation may be expressed as follows:

$$\max^*(A, B) = \max(A, B) + \ln(1 + e^{-|A-B|})$$

As an example of this operation, the RC Q0 is considered whose punctured encoder output is in the form of $u_k, i_{k,m} i_{k,l}, r_{k,l}$. Then, the value of the uncoded bit is set to u=1 and then u=0 for every combination (looking at $i_{k,m} i_{k,l} r_{k,l} = 111$ as an example), and the coding deals with the two possible values for $u_k, i_{k,m} i_{k,l}, r_{k,l} = 0111$ and $u_k, i_{k,m} i_{k,l}, r_{k,l} = 1111$. The location of the received symbol is then compared, as being mapped within the constellation, to the two constellation points indexed by 0111 and 1111. From these two constellation points indexed by 0111 and 1111, the constellation point having the smaller valued metric is selected. So, in the RC Q0 example used here, the total number of 16 metrics is reduced down to 8 metrics. These 8 metric values and the 8 possible uncoded bit values (indexed by the metrics indices for each symbol in a received frame) are stored for subsequent use in decoding the uncoded bit after having decoded the input bits, $i_{k,m}, i_{k,l}$. After decoding the input bits, $i_{k,m}, i_{k,l}$, it is known with certainty what the bits $i_{k,m} i_{k,l}, r_{k,l}$ are, and then the uncoded bit value u is determined based on these 8 possible uncoded bit values that have been stored.

Continuing on with the decoding process and functionality, the metrics that are calculated by the metric generator are then provided to a top (even) SISO (Soft-In Soft-Out decoder) and simultaneously to a bottom (odd) SISO. Each of these SISOs calculates forward metrics (alphas) and backward metrics (betas), and extrinsic values according to the trellis employed within the TTCM coding. The calculation of these alphas, betas, and extrinsics according to the trellis is performed within the TTCM decoder. These alphas, betas, and extrinsics are all calculated for each symbol within a frame that is to be decoded. These calculations of alphas, betas, and extrinsics are all based on the trellis and according to the RC provided by the rate control sequencer. Starting with the top SISO, after the extrinsic values have been calculated, they are passed to an interleaver after which it is passed to the bottom SISO as APP "a priori probability" information. Similarly, after extrinsic values have been calculated within the bottom SISO, they are passed to an interleaver after which it is passed to the top SISO as APP information. It is noted that a single decoding iteration, within the iterative decoding process of the TTCM decoder system consists of performing two SISO operations; that is to say, the iterative decoding process must pass through both the top (even) SISO and through the bottom (odd) SISO.

After a significant level of confidence has been achieved and a solution is being converged upon, or after a predetermined number of decoding iterations have been performed, then the output from the bottom (odd) SISO is passed as output to an output processor. The operation of the SISOs may generally be referred to as calculating soft symbol decisions of the symbol contained within the received symbol. These soft symbol decisions may be performed on a true bit level in certain embodiments. The output processor uses these soft symbol decisions to generate hard symbol decisions for the input bits $i_{k,m}, i_{k,l}$ of the input symbol and to provide decoded output data.

Moreover, in the situation where 1 or more uncoded bits result from the coding of the input bits, $i_{k,m} i_{k,l}$ then the as many as 8 possible uncoded bit values (indexed by the metrics indices) are also needed, so that the value of the uncoded bit can be directly determines. Even greater detail is provided below in the discussion associated with this example embodiment of RC Q0.

It is also noted that the APP sequence for the top (even) SISO must be initialized before beginning the iterative decoding. The notation for the APP sequence app[i][j][k] is as follows:

1. i represents the possible binary value of the estimated bit

2. The positions of the estimated bit are denoted as follows: (j=0 refers the first bit into the encoder and j=1 refers the second bit into the encoder)

3. k is the index of the symbol's location within the data block (or frame).

More specifically, k represents the symbol index of the symbols in a frame of data, j is the bit index (j=0 for bit $i_1$ and j=1 for bit $i_0$), and i is the bit value (i=0 or 1). For example, app[1][0][50] represents the APP for bit $i_1$ of the $50^{th}$ symbol being a value of 1.

At least two ways to initialize app[i][j][k] are described below:

1. app[i][j][k]=0.0,i,j ∈{0,1},k ∈ {0, . . . , N−1}. Each and every TTCM coding, using any of the possible combination of RCs for a rate control sequence may use this initialization.

2. The TTCM coding with one particular RC (e.g., RC 8) can have different initialization defined as follows.
app[0][1][k]=0.0
app[1][1][k]=MAX, for all possible k.
app[0][0][k]=0.0

For the sequence app[0][0][k], we may first define the sequence based on the rate control sequence using the intermediate variable pP and pP* (which denotes the interleaved version of pP).
pP[1][0][k]=MAX for the one particular RC (e.g., RC 8)
pP[1][0][k]=0.0 otherwise Then, we interleave this sequence with de-interleave $\pi^{-1}$ is employed to generate the sequence pP*[1][0][k]. Finally, we define the initial app[1][0][k] as follows:

app[1][0][k]=pP[1][0][k] if k mod2=0
app[1][0][k]=pP*[1][0][k] if k mod2=1

Moreover, by using the interleaving $\pi$, we can directly define the app[1][0][k] as follows:

app[1][0][k]=MAX if RC [$\hat{\pi}$(k)]=the one particular RC (e.g., RC 8)
app[1][0][k]=0.0 otherwise Further detail of the TTCM decoding functionality and operation is also provided within several of the following Figures.

Figure 23:
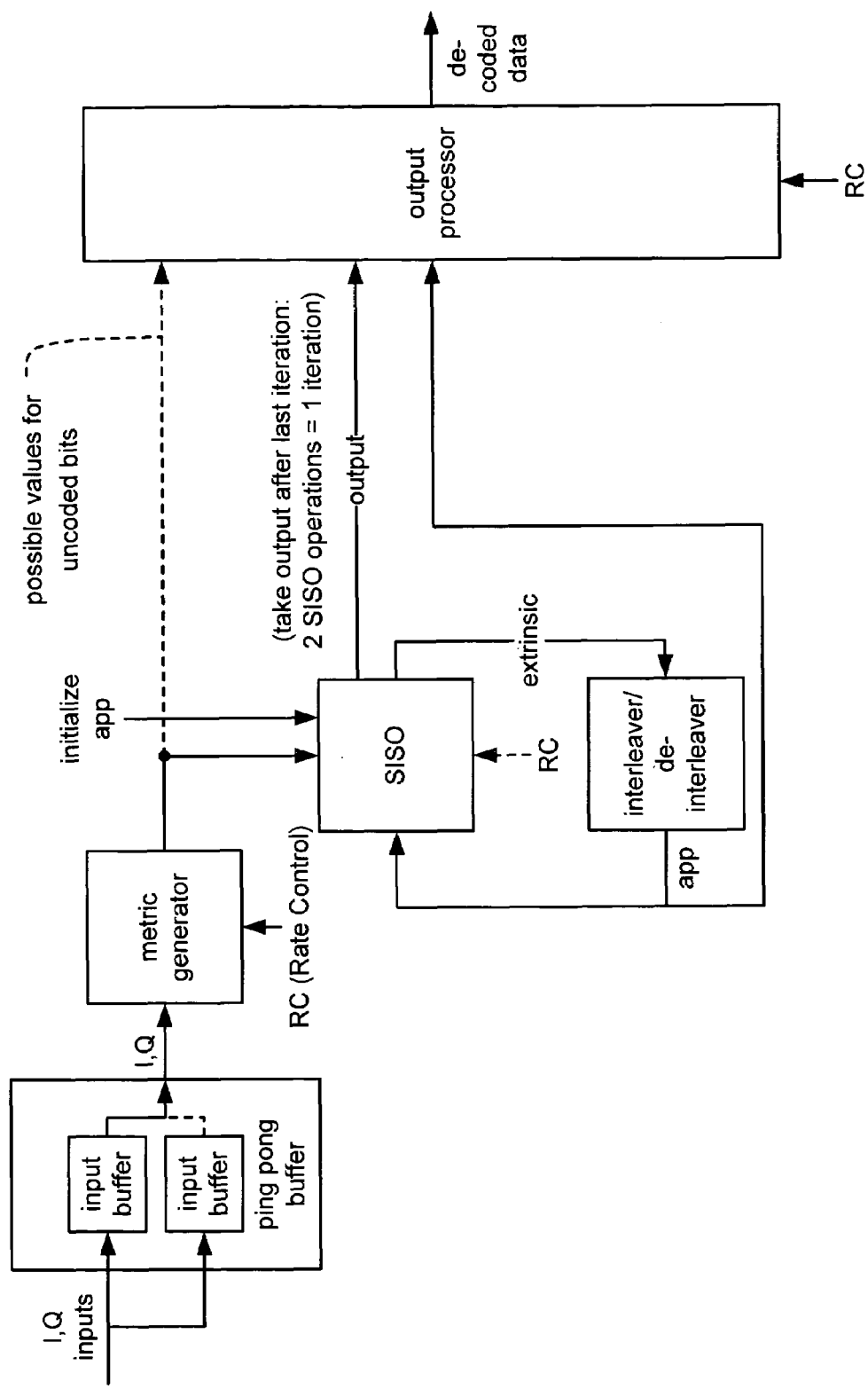
FIG. 23 is a diagram illustrating an alternative embodiment of a TTCM decoder system recycling a single SISO (shown as receiving I,Q inputs) that is built according to the invention.

FIG. 23 is a diagram illustrating an alternative embodiment of a TTCM decoder system recycling a single SISO (shown as receiving I,Q inputs) that is built according to the invention. The alternative TTCM decoder system described in this embodiment receives as input the I,Q from a received signal. Similar to the embodiment described above, an I,Q extraction functional block may also be employed to extract these I,Q inputs when performing receiver pre-processing. A ping pong buffer, employing two input buffers, may be employed for efficient buffering of the I,Q inputs. The I,Q inputs are then passed to the metric generator. The functionality of the metric generator may be similar in both this embodiment as well as the embodiment described above with 2 separate SISOs.

The output of the metric generator is passed to the single SISO; the information necessary to perform decoding of any possible uncoded bits will be passed to the output processor. The SISO calculates forward metrics (alphas), backward metrics (betas), and extrinsic values (exts) according to the trellis employed and provides them to a functional block that is operable to perform both interleaving and de-interleaving (depending upon which SISO operation is being performed). The output of the interleaver/de-interleaver functional block is passed back to the SISO as APP.

Similar to the embodiment described above, it is noted that a single decoding iteration, within the iterative decoding process of the alternative TTCM decoder system consists of performing two SISO operations; that is to say, the iterative decoding process must pass through both the SISO once (when the SISO performs the top SISO functionality) and through the SISO again (when the SISO performs the bottom SISO functionality).

After a significant level of confidence for the soft symbol decisions within the SISO have been achieved and after a solution is being converged upon, or after a predetermined number of decoding iterations have been performed, then the output from the SISO is passed as output to the output processor. These soft symbol decisions may also be performed on a true bit level in certain embodiments. The output processor uses these soft symbol decisions to generate hard symbol decisions and to provide decoded output data. It is also noted that a similar APP initialization may be performed in this embodiment as with the embodiment described above.

Figure 24A:
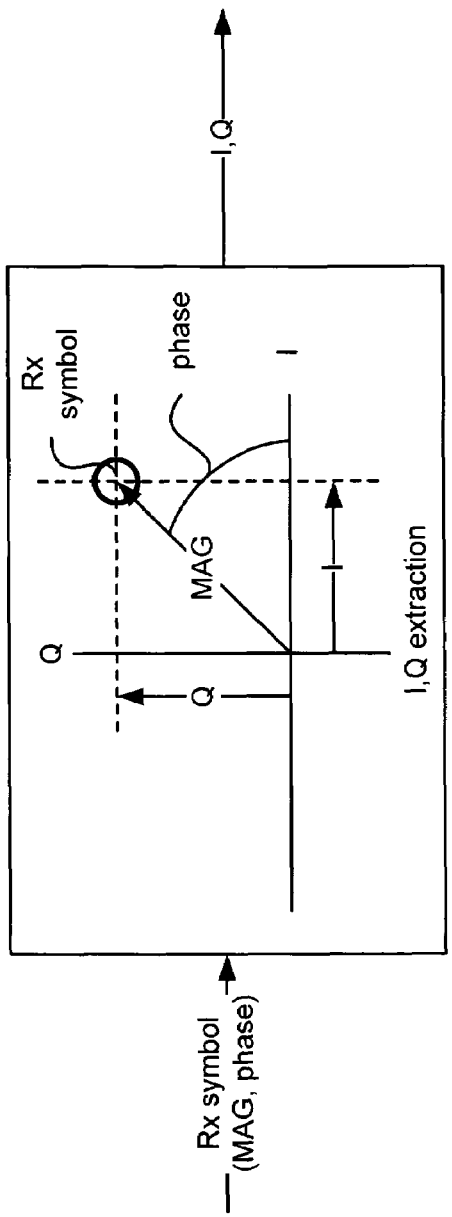
FIG. 24A is a diagram illustrating an embodiment of I,Q (In-phase, Quadrature) extraction according to the invention.

FIG. 24A is a diagram illustrating an embodiment of I,Q (In-phase, Quadrature) extraction according to the invention. A received symbol (shown as Rx symbol), having a magnitude (MAG) and phase (phase) is provided to an I,Q extraction block. This symbol (or signal) is mapped in a two dimensional space having an in-phase and a quadrature component. This in-phase measurement and the quadrature component are provided as output from the I,Q extraction functional block.

Figure 24B:
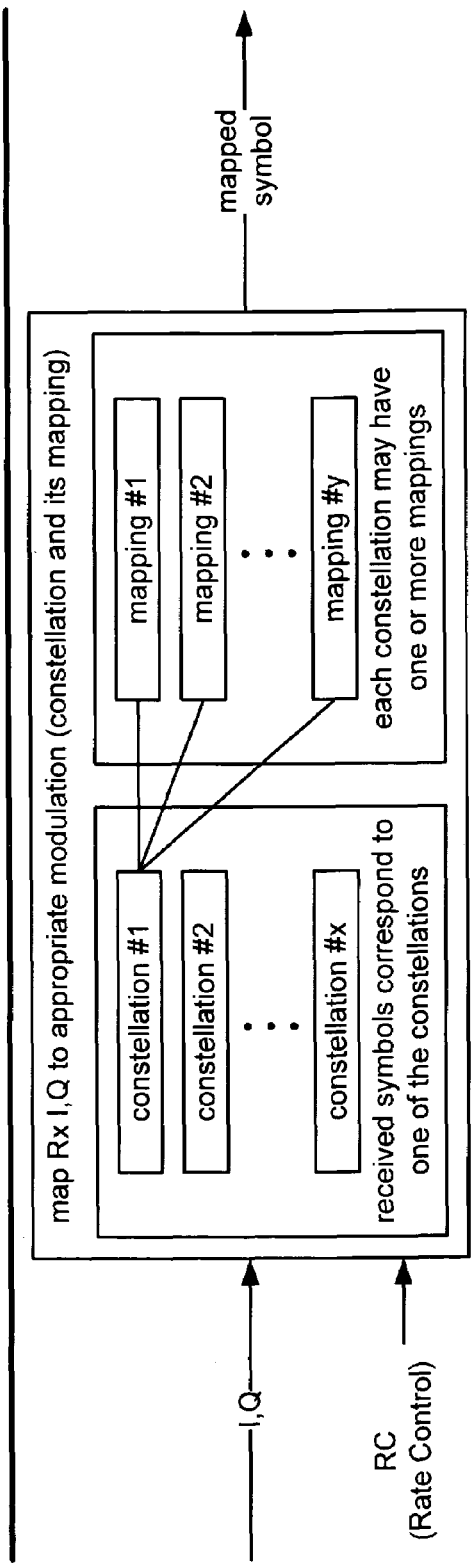
FIG. 24B is a diagram illustrating an embodiment of Rx (received) I,Q mapping based on RC according to the invention.

FIG. 24B is a diagram illustrating an embodiment of Rx (received) I,Q mapping based on RC according to the invention. After the I,Qs are provided, then according to the RC provided by the rate control sequencer, the received I,Q are mapped according to one of the modulation's constellation and mapping corresponding to the RC. More specifically, after the appropriate modulation has been selected based on the corresponding RC, and the constellation and mapping of the RC has been determined based on the RC of the rate control sequence, the I,Q is mapped within the appropriate modulation (with its particular constellation and mapping). Afterwards, a mapped symbol is provided as output.

Figure 25A:
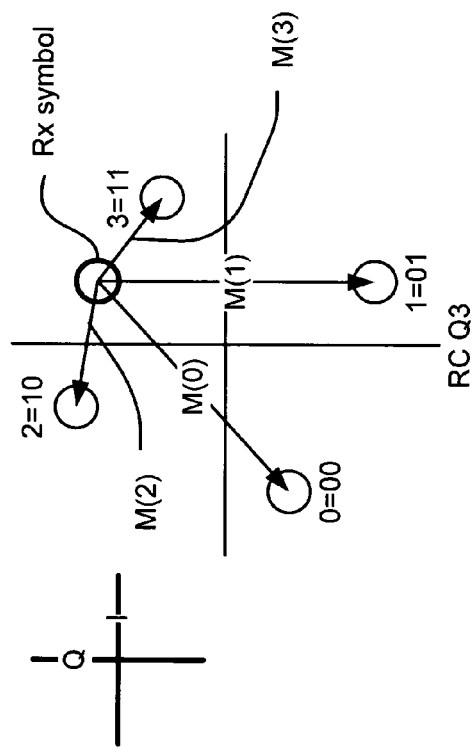
FIG. 25A is a diagram illustrating an embodiment of metric calculation performed by a metric generator (shown for embodiment of RC Q3) according to the invention.

FIG. 25A is a diagram illustrating an embodiment of metric calculation performed by a metric generator (shown for embodiment of RC Q3) according to the invention. A specific example is provided in this diagram using the RC Q3, and it will then be understood how the metric calculation is performed for the other various RCs and their corresponding modulations (constellations and mappings). That is to say, the metric calculation may be performed in a similar manner in the other rate control sequences with their respective RCs.

According to this RC, the received symbol is mapped within this modulation (constellation and mapping). Then, the metric (scaled Euclidian distance) to each of the constellation points, from the received symbol, is calculated and indexed according to the mapping of the respective constellation points. This distance corresponds to the calculation in the metric generator that may be performed as follows:

Metric($U$×2×1×0)=1/(2sigma^2)*[($Rx\_I-I\_$Coef)2+ ($Rx\_Q-Q\_$Coef)2]

Here, the scaling of the distance by [1/(2sigma^2)] (where sigma is the standard deviation of the normalized noise of the received symbol) accommodates for the normalized noise of the received symbol in determining this distance. The I_Coef and the Q_Coef are the expected locations (in terms of I,Q) at which the received symbol is expected to be mapped (constellation point location), and Rx_I and Rx_Q are the actual locations at which the received symbol is mapped.

For example, the metric corresponds to the distance from the received symbol to the constellation point associated with the symbol 1=(01 in binary) is shown as M(1); . . . ; and the metric corresponding to the distance from the received symbol to the constellation point associated with the symbol 3=(11 in binary) is shown as M(3). These metrics are output from the metric generator.

Figure 25B:
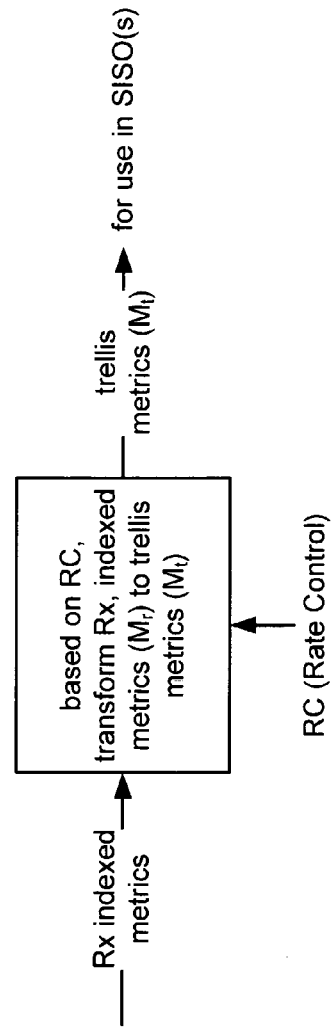
FIG. 25B is a diagram illustrating an embodiment of metric mapping functionality that is supported according to the invention.

FIG. 25B is a diagram illustrating an embodiment of metric mapping functionality that is supported according to the invention. The received symbol metrics (received metric=$M_r$), indexed according to the modulation (constellation and mapping) according to the RC (as provided by the rate control sequencer), are then passed to a functional block that transforms these received metrics to trellis metrics (trellis metric=$M_t$). These trellis metrics are then used to calculate the alphas, betas, and extrinsics within the SISO. These alphas, betas, and extrinsics may be calculated using a min* approach according to the invention. Again, a max* approach may alternatively be used.

Figure 26:
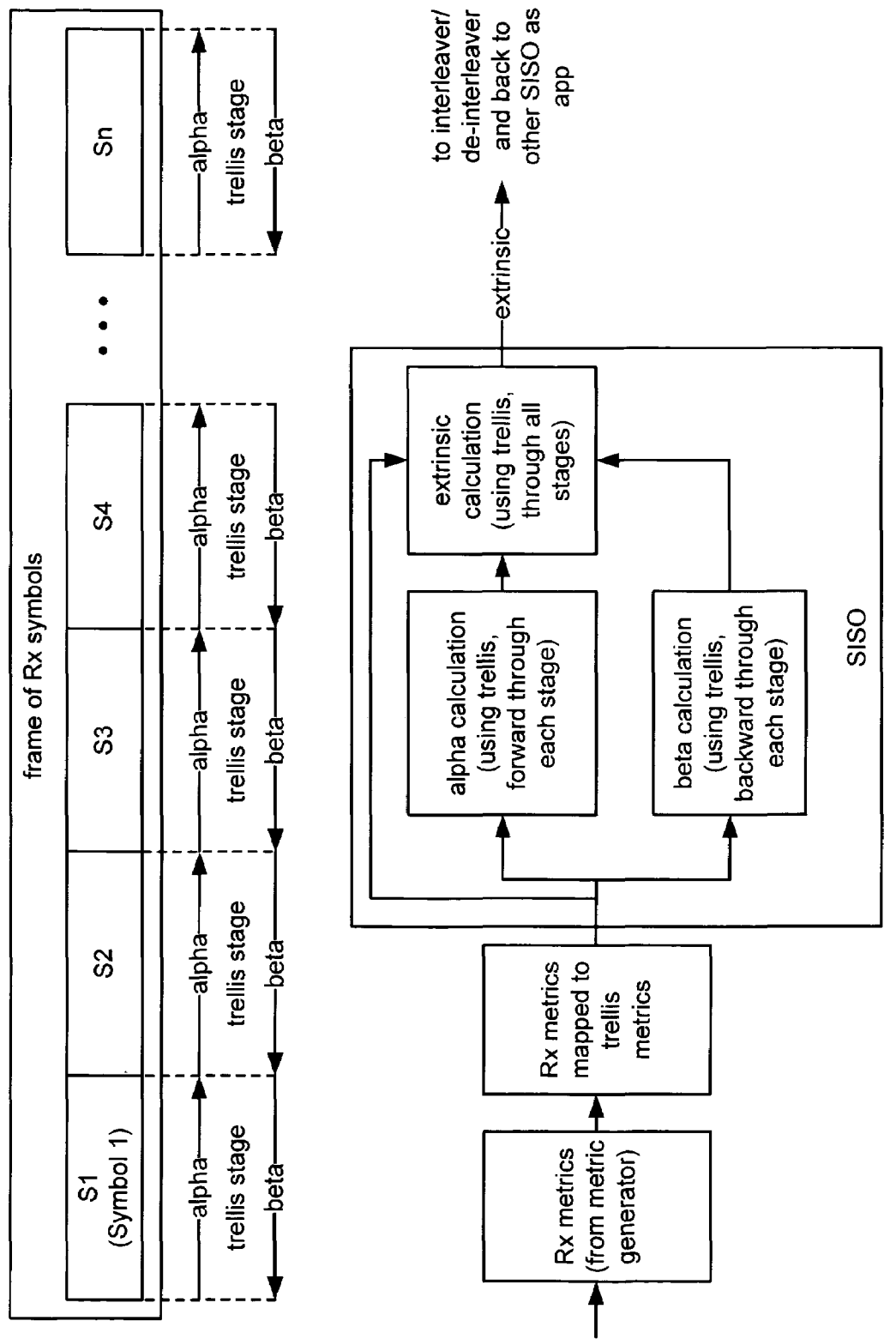
FIG. 26 is a diagram illustrating an embodiment of SISO calculations and operations that are performed according to the invention.

FIG. 26 is a diagram illustrating an embodiment of SISO calculations and operations that are performed according to the invention. For each stage (or each symbol) within a frame of received symbols (or sequence of received symbols), the forward metrics (alphas), the backward metrics (betas), and the extrinsics are calculated. The extrinsics value of a stage is a function of the alphas, betas, metrics, and APPs ("a priori" probabilities) of that stage. The SISO employs these metrics to calculate the alphas, and the betas. Then, the alphas, betas, and metrics are used to calculate the extrinsics that are provided back to the other SISO through the other interleaver/de-interleaver as appropriate in the particular situation. It is noted that the values of metrics, alphas, betas, and extrinsics are all used to perform the TTCM decoding of the information bits that have been encoded by the TTCM encoder.

Figure 27A:
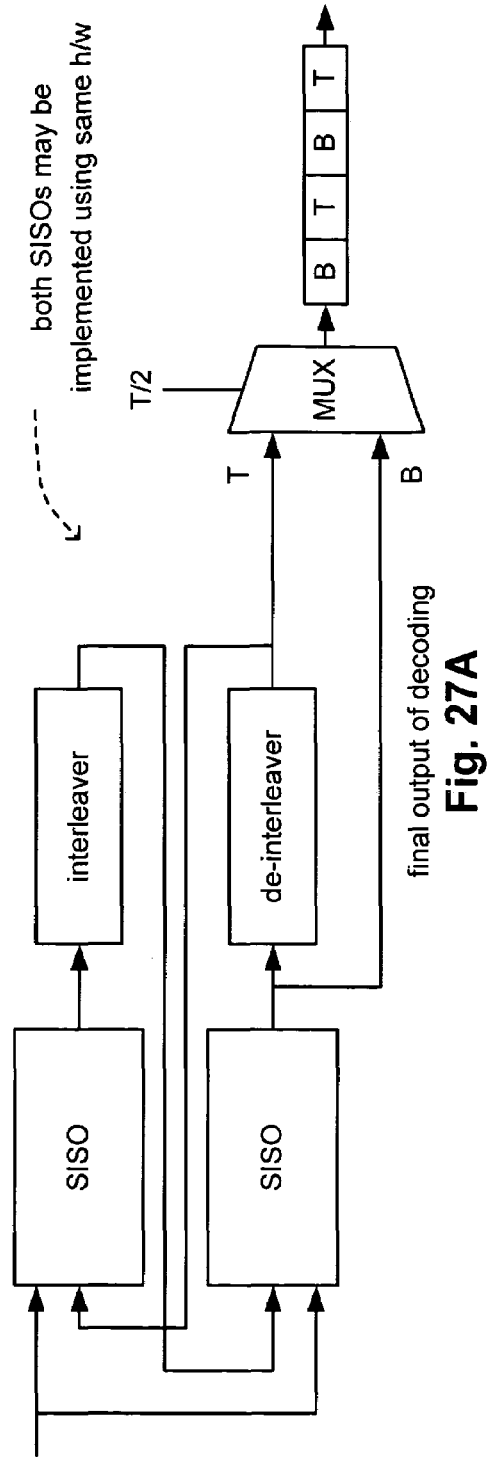
FIG. 27A is a diagram illustrating an embodiment of final output of decoding that is supported according to the invention.

FIG. 27A is a diagram illustrating an embodiment of final output of decoding that is supported according to the invention. In the situation where there may be only one SISO, then the odd symbol should be taken before de-interleave and the even symbol should be taken after de-interleave.

In a similar manner to the ordering in which the encoding may be performed (as described above, for example), the order of the input symbols should be preserved upon decoding. The final output of decoding ensures the following: when a symbol sequence, $S_1S_2S_3S_4$, is input to the encoder, and then when the following encoded symbols ($S_{1-enc}S_{2-enc}S_{3-enc}S_{4-enc}$) are received by the decoder, then the decoded estimates of these received symbols may maintain this sequential order. A MUX whose selection is provided by a clock signal that is clocked at ½ the rate alternatively selects the outputs from the output and input of the de-interleaver that is communicatively coupled to the lower SISO. This MUX may be viewed as being within the output processor within the appropriate embodiments described above. This embodiment of how this may be performed in the final decoding step.

Figure 27B:
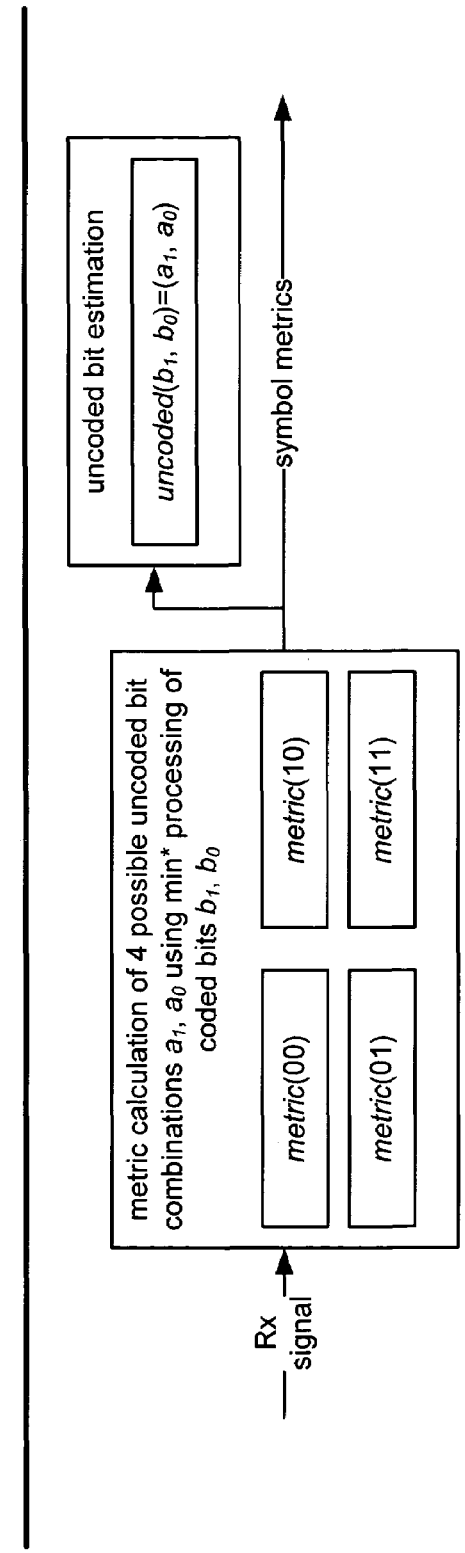
FIG. 27B is a diagram illustrating an embodiment of metric generator computation to accommodate RCs Q4 and A4 according to the invention.

FIG. 27B is a diagram illustrating an embodiment of metric generator computation to accommodate RCs Q4 and A4 according to the invention. To decode the codes with symbols generated according to RC Q4 (or A4), the decoding approaches described above may be used. However, the care must be taken when calculating the symbol metrics for the TTCM decoding processing of a received signal with RC Q4 (or A4).

The squared Euclidean distance, $E^2(x, y)$, and a given coefficient, c, related the channel SNR (Signal to Noise Ratio) are defined. Then, with the received signal, r, the 4 metrics are calculated as follows:

$$\text{metric}(b_1b_0) = \min^*\{cE^2(r, \text{map}(a_1a_0b_1b_0))|(a_1a_0)\in\{00, 01, 10, 11\}\}$$

where $b_0, b_1, \{0,1\}$ and min* may be employed as described above in some of the other various embodiments. Given the 2 uncoded bits, $b_1, b_0$, then the estimate of the uncoded bits, shown as uncoded($b_1b_0$), is given as follows:

uncoded($b_1b_0$) = ($a_1a_0$), such that $E^2(r, \text{map}(a_1a_0b_1b_0)) = \min\{E^2(r, \text{map}(xyc_1c_0))|(xy)\in\{0,1\}\}$.

Since there are 2 uncoded bits in the symbol generated using the RCs Q4 (or A4), then at some stage the performance of the TTCM depends on the decoding of uncoded bits. More specifically, performing more decoding iterations within the decoder does not help significantly to provide for increased performance, and the performance curve has a floor at higher BER (Bit Error Rate). Some diagrams of performance are described in more detail below. However, to avoid this problem of a floor at higher BER, another RC is introduced below that substantially overcomes these deficiencies.

Figure 28A:
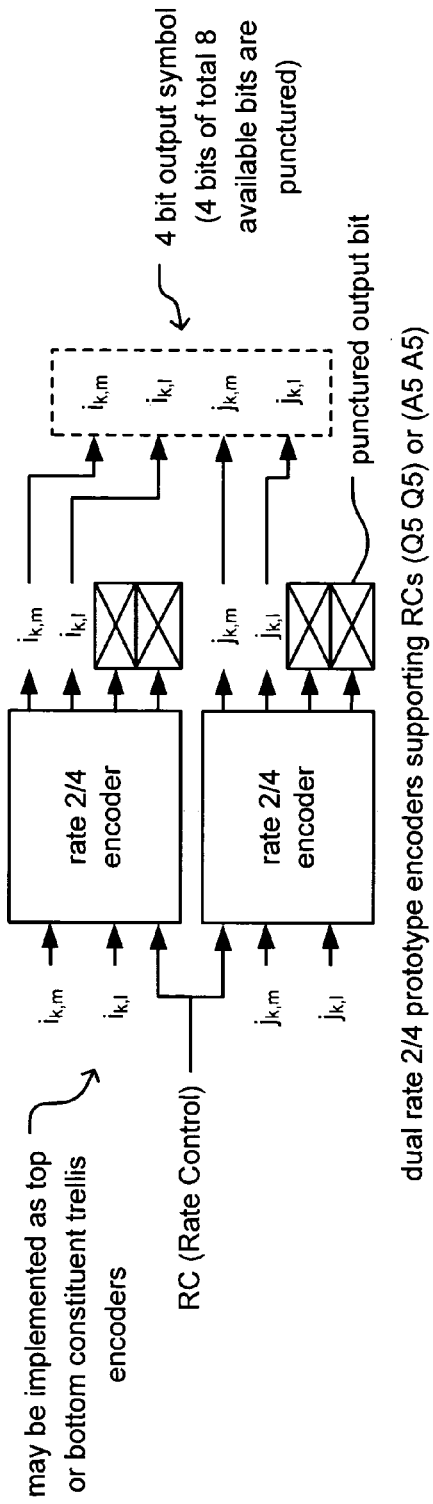
FIG. 28A is a diagram illustrating an embodiment of dual rate 2/4 prototype encoders supporting RCs Q5, A5 according to the invention.

FIG. 28A is a diagram illustrating an embodiment of dual rate ⅔ prototype encoders supporting RCs Q5, A5 according to the invention. A new RC is introduced (shown as Q5 and A5), for 16 QAM and 16 APSK TTCM, respectively. Within signals generated by these RCs, only 2 coded bits are output by each rate ⅔ prototype encoder. To obtain 4 bits per symbol, two separate rate ⅔ prototype encoders are implemented together to form a single constituent encoder; that is to say, 2 separate single constituent encoders are combined and are implemented as 1 constituent encoder—this is referred to as a dual rate ⅔ prototype encoder. Therefore, in a rate control sequence, the RCs (Q5 Q5 (or A5 A5) may be used. This notation, (Q5 Q5), is used to represent the operation of a dual rate ⅔ prototype encoder where each of the individual rate ⅔ prototype encoders output 2 bits; together the 2 rate ⅔ prototype encoders of the dual rate ⅔ prototype encoder output 4 bits.

Since the 4 remaining bits of the generated symbol are all coded bits, the symbol mapping corresponding to symbols generated by these RCs may be defined using Gray mapping. Among all of the possible Gray mappings, one that provides a good performance may be selected.

Figure 28B:
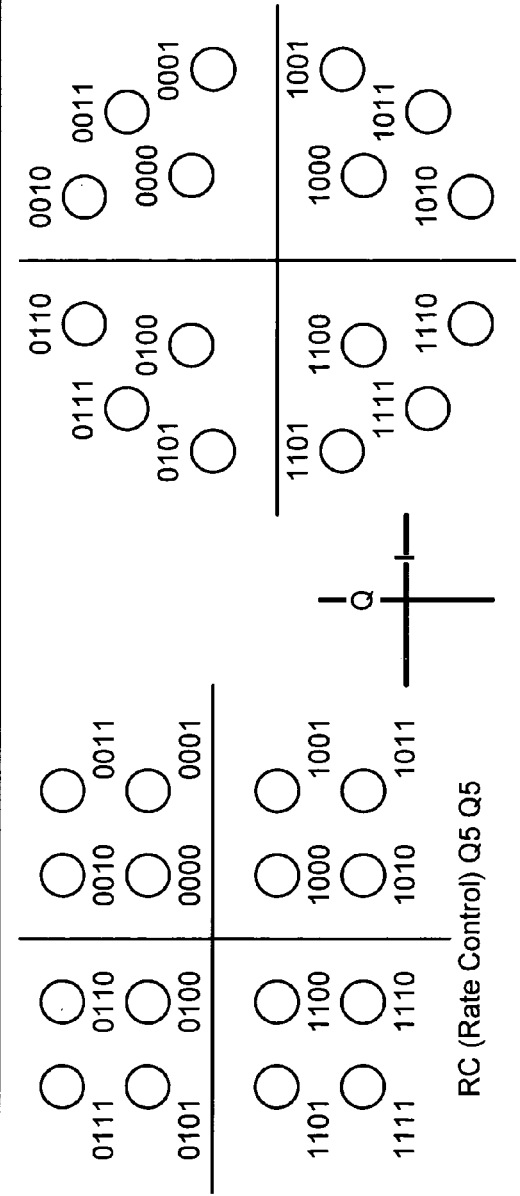
FIG. 28B is a diagram illustrating various embodiments of RC (Rate Control) governed symbol mapping to various constellations according to the invention.

FIG. 28B is a diagram illustrating various embodiments of RC (Rate Control) governed symbol mapping to various constellations according to the invention. As within the other embodiments described above that perform symbol mapping of an encoded symbol to a modulation according to a RC (e.g., symbol mapping of the encoded symbol to the appropriate constellation point within the appropriate constellation).

A 16 QAM modulation (including a 16 QAM shaped constellation and corresponding mapping) is shown for the RC (Q5 Q5), and a 16 APSK modulation (including a 16 APSK shaped constellation and corresponding mapping) is shown for the RC (A5 A5). For each of the modulations, the 4 bit encoded symbols (generated using the dual rate ⅔ prototype encoder) are appropriately mapped to the corresponding constellation points within the respective constellation.

With these symbols and symbol mappings performed for these RCs, a TTCM may be constructed to form an encoded signal having a bandwidth efficiency of more than 3 bit/s/Hz. Several example embodiments of rate control sequences are provided below.

FIG. 29A is a diagram illustrating another embodiment of periodic RC (Rate Control) sequences of TTCM supporting bandwidths bandwidth efficiency of at least 3 bit/s/Hz according to the invention. Each of the rate control sequences shown in this embodiment include 3 RCs arranged in a period. After encoding 3 symbols, the period is repeated to encode the next 3 symbols, and so on until the end of the data frame or the end of the information sequence that is to be encoded.

More specifically, for the rate control sequence including RCs Q0 Q0 (Q5 Q5), three successive symbols are generated according to these 3 RCs. More specifically, a first symbol is generated according to the RC Q0, a second symbol is generated according to the RC Q0, and a third symbol is generated according to the RC (Q5 Q5).

Analogously, for the rate control sequence including RCs A0 A0 (A5 A5), three successive symbols are generated according to these 3 RCs. More specifically, a first symbol is generated according to the RC A0, a second symbol is generated according to the RC A0, and a third symbol is generated according to the RC (Q5 Q5).

The encoding using the rate control sequence including the RCs Q0 Q0 (Q5 Q5) (as well as those rate control sequences including the RCs A0 A0 (A5 A5)) is able to generate an encoded signal having a bandwidth efficiency that is greater than approximately 3 bit/s/Hz (bits per second per Hertz). More specifically, these rate control sequences are able to generate an encoded signal having a bandwidth efficiency that is approximately 3.33 bit/s/Hz. Other rate control sequences are operable to generate encoded signals having even greater bandwidths bandwidth efficiencies.

Encoding using the rate control sequence including the RCs Q0 Q0 (Q5 Q5) (Q5 Q5) (as well as those rate control sequences including the RCs A0 A0 (A5 A5) (A5 A5)) is able to generate an encoded signal having a bandwidth efficiency that is approximately 3.5 bit/s/Hz.

FIG. 29B is a diagram illustrating an embodiment of metric generator computation to accommodate RCs (Q5 Q5) and (A4 A4) according to the invention. To decode the symbols of a signal coded with a rate control sequence having the RCs (Q5 Q5) (or (A5 A5)), the previous decoding approaches may also be employed.

However, care must be taken when calculating the symbol metrics of the symbols of a signal generated using the RCs (Q5 Q5) (or (A5 A5)). Since the (Q5 Q5) (or (A5 A5)) symbol is constructed with two 2 bit symbols from the "top" and "bottom" constituent encoder implemented using the dual rate ⅔ prototype encoder (that includes 2 separate rate ⅔ prototype encoders), respectively, then 2 signal metrics are needed to decode such a signal properly. These 2 metrics are defined as follows:

The received signal, r, the 4 metrics that correspond to the "top" decoder within the dual rate ⅔ prototype encoder are defined as follows:

$\text{metric}_T(b_1 b_0) = \min^*\{cE^2 \quad (r, \text{map}(b_1 b_0 a_1 a_0)) | (a_1 a_0) \in \{00, 01, 10, 11\}\}$ The 4 metrics that correspond to the "bottom" decoder within the dual rate ⅔ prototype encoder are defined as follows:

$\text{metric}_B(b_1 b_0) = \min^*\{cE^2 \quad (r, \text{map}(a_1 a_0 b_1 b_0)) | (a_1 a_0) \in \{00, 01, 10, 11\}\}$ where $b_0, b_1, \{0,1\}$ and min* may be employed as described above in some of the other various embodiments.

The several performance curves described in more detail below may be understood in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR).

Figure 30:
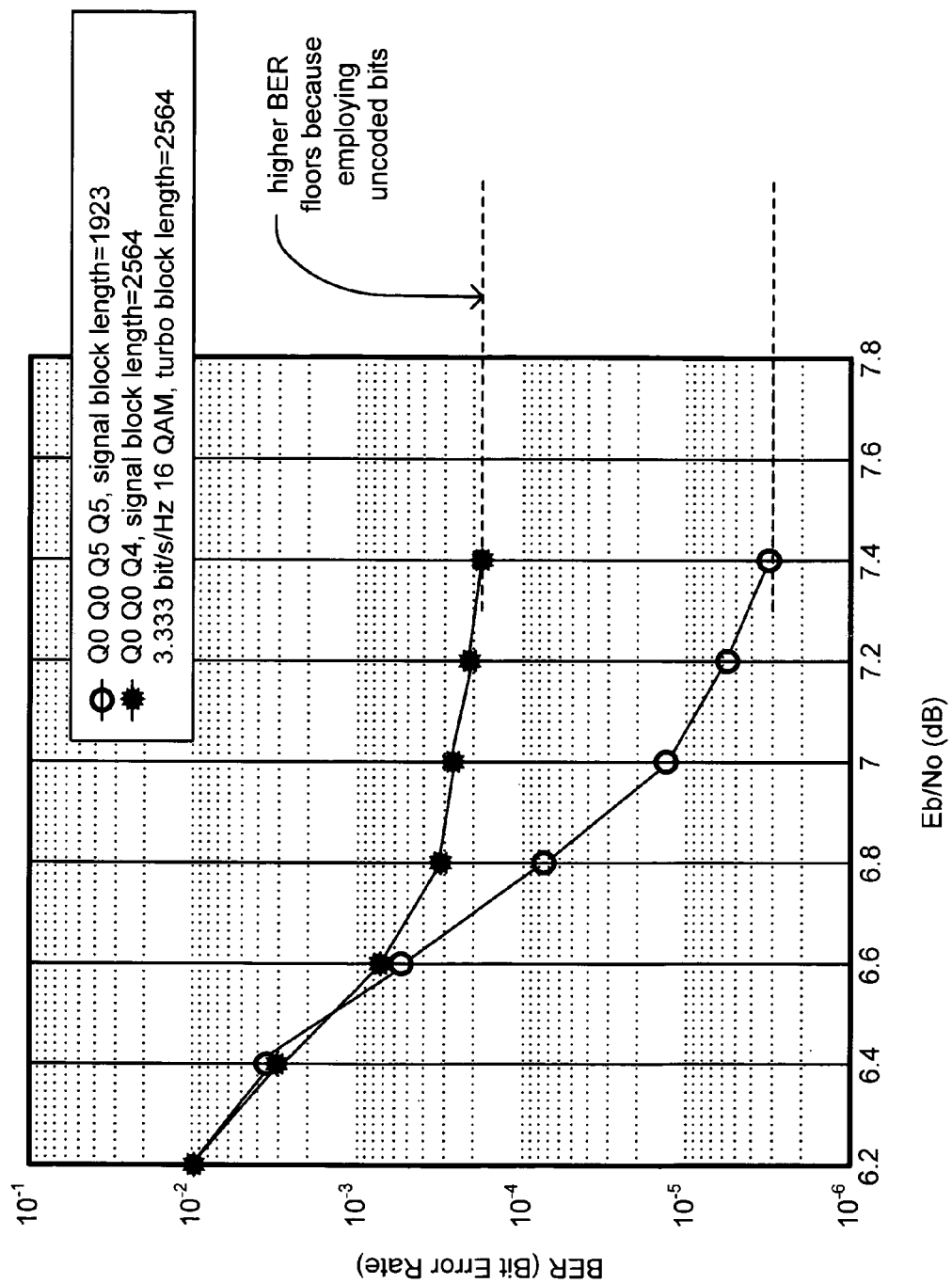
FIG. 30 is a diagram illustrating an embodiment of performance of a 3.33 bit/s/Hz 16 QAM TTCM (shown with 4 decoding iterations) that is supported according to the invention.

FIG. 30 is a diagram illustrating an embodiment of performance of a 3.33 bit/s/Hz 16 QAM TTCM (shown with 4 decoding iterations) that is supported according to the invention. This embodiment corresponds to the performance achieved using the rate control sequence having a period of 3 and including the RCs Q0 Q0 Q4 (or A0 A0 A4).

Figure 31:
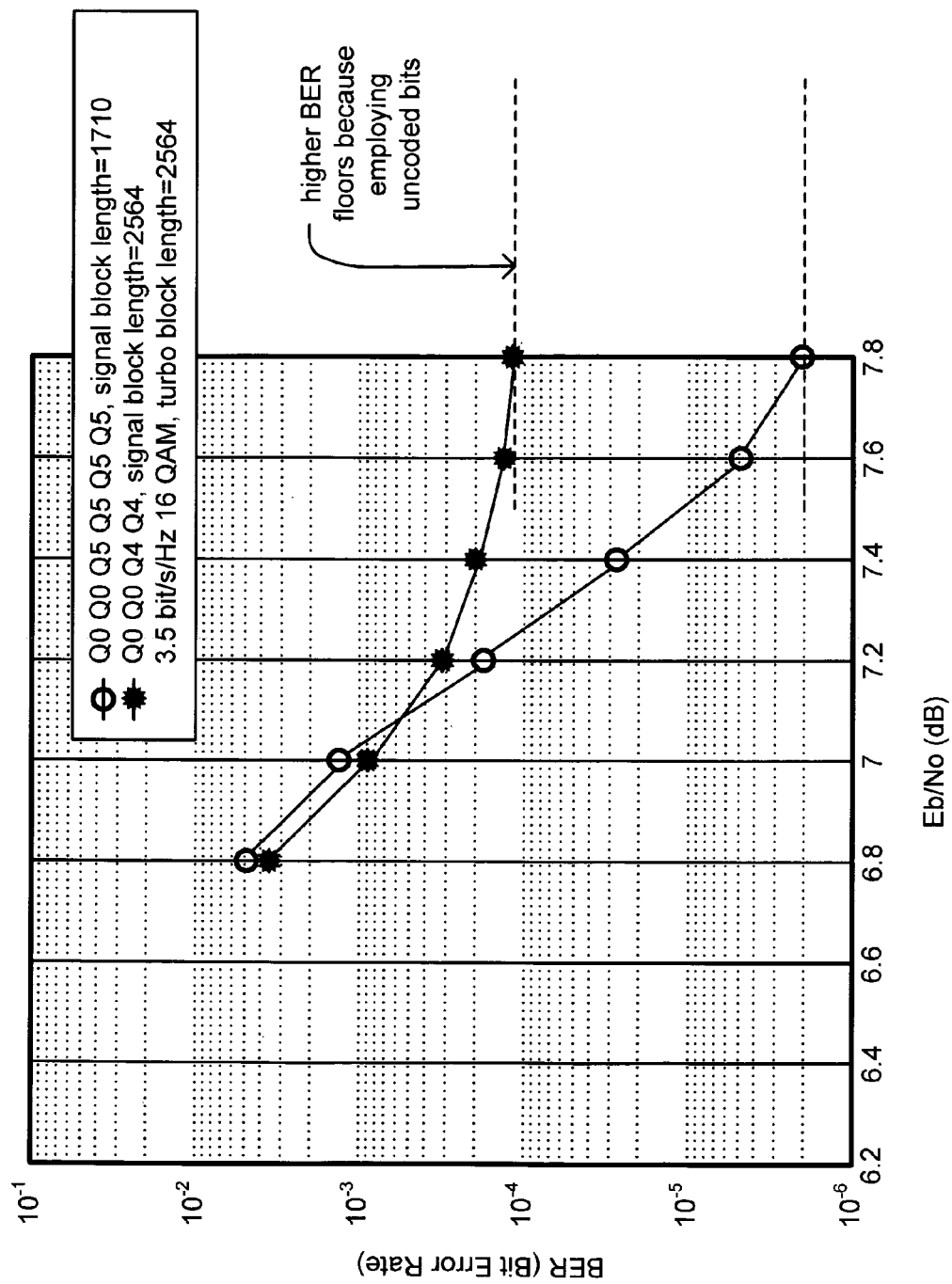
FIG. 31 is a diagram illustrating an embodiment of performance of a 3.5 bit/s/Hz 16 QAM TTCM (shown with 4 decoding iterations) that is supported according to the invention.

FIG. 31 is a diagram illustrating an embodiment of performance of a 3.5 bit/s/Hz 16 QAM TTCM (shown with 4 decoding iterations) that is supported according to the invention. This embodiment corresponds to the performance achieved using the rate control sequence having a period of 3 and including the RCs Q0 Q0 Q4 Q4 (or A0 A0 A4 A4).

Referring to both the FIG. 30 and the FIG. 31, since there are 2 uncoded bits in the symbols generated using the RC Q4 (or A4), at a certain point, the performance of the TTCM code depends on the ability to perform accurate decoding of the uncoded bits. Inherently, the full error correction advantages provided by turbo coding may not be fully realized within these embodiments. For example, more decoding iterations performed by the decoder will not provide for improved performance, and the performance curve will inherently have a floor at a higher BER. This can be seen in both of the performance diagrams of the FIG. 30 and the FIG. 31. The dual rate ⅔ prototype encoder implemented as constituent encoders within a TTCM encoder is presented above to provide the opportunity to capitalize fully on the benefits provided by turbo coding and to provide a floor at a lower BER; the RC that corresponds to the encoding performed by this dual rate ⅔ prototype encoder correspond to RC (Q5 Q5) (or A5 A5).

Since the RC (Q5 Q5) (or A5 A5) has no uncoded bits (e.g., all bits have at least some redundancy, or parity), the error correction coding advantages provided by turbo coding may be fully capitalized within these embodiments. Practically speaking, the floor of the performance curve will occur with a relatively lower BER. This can be seen in both of the FIG. 30 and the FIG. 31.

However, with the same bandwidth efficiency, the redundancy of the codes generated using rate control sequences having the RC (Q5 Q5) (or A5 A5) bears more burden than does that of a code generated using rate control sequences having the RC Q4 (or A4). That is to say, in the waterfall part of the performance curve, the codes that include the RC Q4 (or A4) perform better, as can be seen within the FIG. 30 and the FIG. 31.

FIG. 32 is a diagram illustrating another embodiment of combined modulation periodic RC (Rate Control) sequences of TTCM supporting bandwidth efficiencies of at least 3 bit/s/Hz according to the invention. In some communication system applications, an encoded signal may be generated having symbols whose modulation varies as frequency as on a symbol by symbol basis. In addition, the symbols of the encoded signal may correspond to different modulation types altogether. For example, a signal may include the combination of 16 QAM (or 16 APSK) symbols as well as QPSK symbols. Such a rate control sequence would then include 1 or more RCs that correspond to 16 QAM (or 16 APSK) modulations as well as 1 or more RCs that correspond to QPSK modulations. Clearly, other combinations of RCs (corresponding to different modulations) may also be combined within a single rate control sequence without departing from the scope and spirit of the invention (e.g., RCs corresponding to QPSK and 8 PSK, RCs corresponding to 8 PSK and 16 QAM (or 16 APSK), and so on).

With this kind of application, a TTCM of the sequence with only Q0 (or A0) and other QPSK rate control symbol has a bandwidth efficiency that is always less than approximately 3 bit/s/Hz. However, with the help of symbols generated using the RCs Q4, Q5 (or A4, A5), the bandwidth efficiency can be 3 bit/s/Hz and even greater.

Within this diagram, several possible embodiments of combined modulation periodic RC sequences are shown of TTCM supporting bandwidth efficiencies of at least 3 bit/s/Hz according to the invention. Each of the rate control sequences shown in this embodiment include 9 RCs arranged in a period. After encoding 9 symbols, the period is repeated to encode the next 9 symbols, and so on until the end of the data frame or the end of the information sequence that is to be encoded.

More specifically, for the rate control sequence including RCs Q4 Q0 Q0 Q0 Q0 Q0 Q0 Q0 Q3 (or (Q5 Q5) Q0 Q0 Q0 Q0 Q0 Q0 Q0 Q3), 9 successive symbols are generated according to these 9 RCs. In addition, a rate control sequence having a period of 9 and including the RCs A4 A0 A0 A0 A0 A0 A0 A0 A3 (or (A5 A5) A0 A0 A0 A0 A0 A0 A0 A3) will provide for similar performance. The encoded signals generated using these rate control sequences have a bandwidth efficiency of approximately 3.0 bit/s/Hz.

The coding of symbols is performed in a similar manner as with when using the other rate control sequences described above. As one example (the rate control sequence including RCs Q4 Q0 Q0 Q0 Q0 Q0 Q0 Q0 Q3): a first symbol is generated according to the RC Q4, a second symbol with RC Q0 (as well as a third, fourth, fifth, sixth, seventh, and eight symbol that are all generated according to the RC Q0), and a ninth symbol is generated according to the RC Q3.

In addition, other rate control sequences may be employed. For the rate control sequence including RCs Q4 Q0 Q0 Q0 Q0 Q4 Q0 Q0 Q0 Q3 (or (Q5 Q5) Q0 Q0 Q0 (Q5 Q5) Q0 Q0 Q0 Q3), 9 successive symbols are generated according to these 9 RCs. In addition, a rate control sequence having a period of 9 and including the RCs A4 A0 A0 A0 A4 A0 A0 A0 A3 (or (A5 A5) A0 A0 A0 (A5 A5) A0 A0 A0 A3) will provide for similar performance. The encoded signals generated using these rate control sequences have a bandwidth efficiency of approximately 3.11 bit/s/Hz.

Moreover, other rate control sequences may be employed. For the rate control sequence including RCs Q4 Q4 Q0 Q0 Q4 Q4 Q0 Q0 Q3 (or (Q5 Q5) (Q5 Q5) Q0 Q0 (Q5 Q5) (Q5 Q5) Q0 Q0 Q3), 9 successive symbols are generated according to these 9 RCs. In addition, a rate control sequence having a period of 9 and including the RCs A4 A4 A0 A0 A4 A4 A0 A0 A3 (or (A5 A5) (A5 A5) A0 A0 (A5 A5) (A5 A5) A0 A0 A3) will provide for similar performance. The encoded signals generated using these rate control sequences have a bandwidth efficiency of approximately 3.33 bit/s/Hz.

Figure 33:
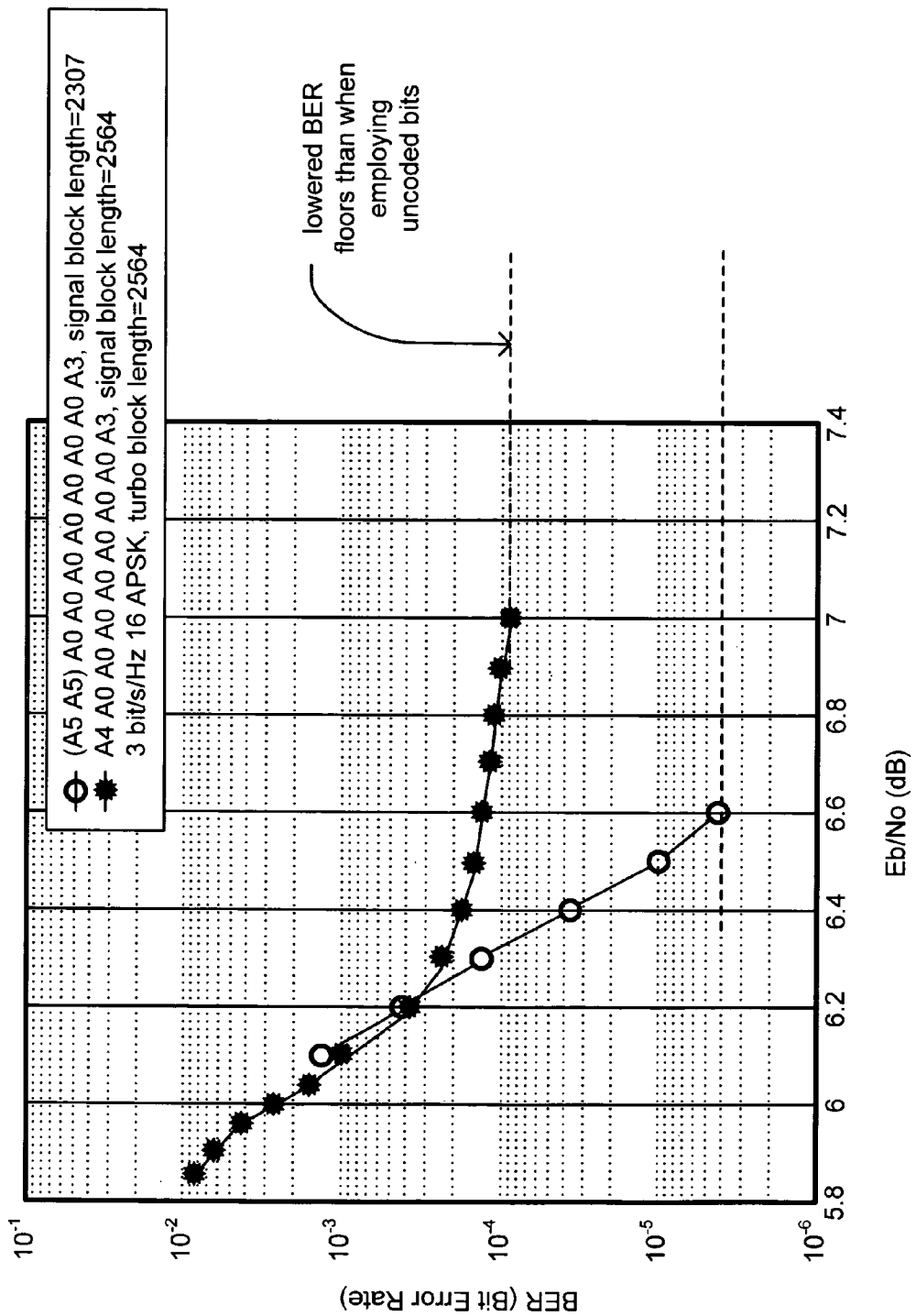
FIG. 33 is a diagram illustrating an embodiment of performance of a 3.0 bit/s/Hz 16 APSK TTCM (shown with 4 decoding iterations) that is supported according to the invention.

FIG. 33 is a diagram illustrating an embodiment of performance of a 3.0 bit/s/Hz 16 APSK TTCM (shown with 4 decoding iterations) that is supported according to the invention. This embodiment corresponds to the performance achieved using the rate control sequence having a period of 9 and including the RCs Q4 Q0 Q0 Q0 Q0 Q0 Q0 Q0 Q3 (or (Q5 Q5) Q0 Q0 Q0 Q0 Q0 Q0 Q0 Q3). Alternatively this embodiment may be viewed as corresponding to the performance achieved using the rate control sequence having a period of 9 and including the RCs A4 A0 A0 A0 A0 A0 A0 A0 A3 (or (A5 A5) A0 A0 A0 A0 A0 A0 A0 A3).

Figure 34:
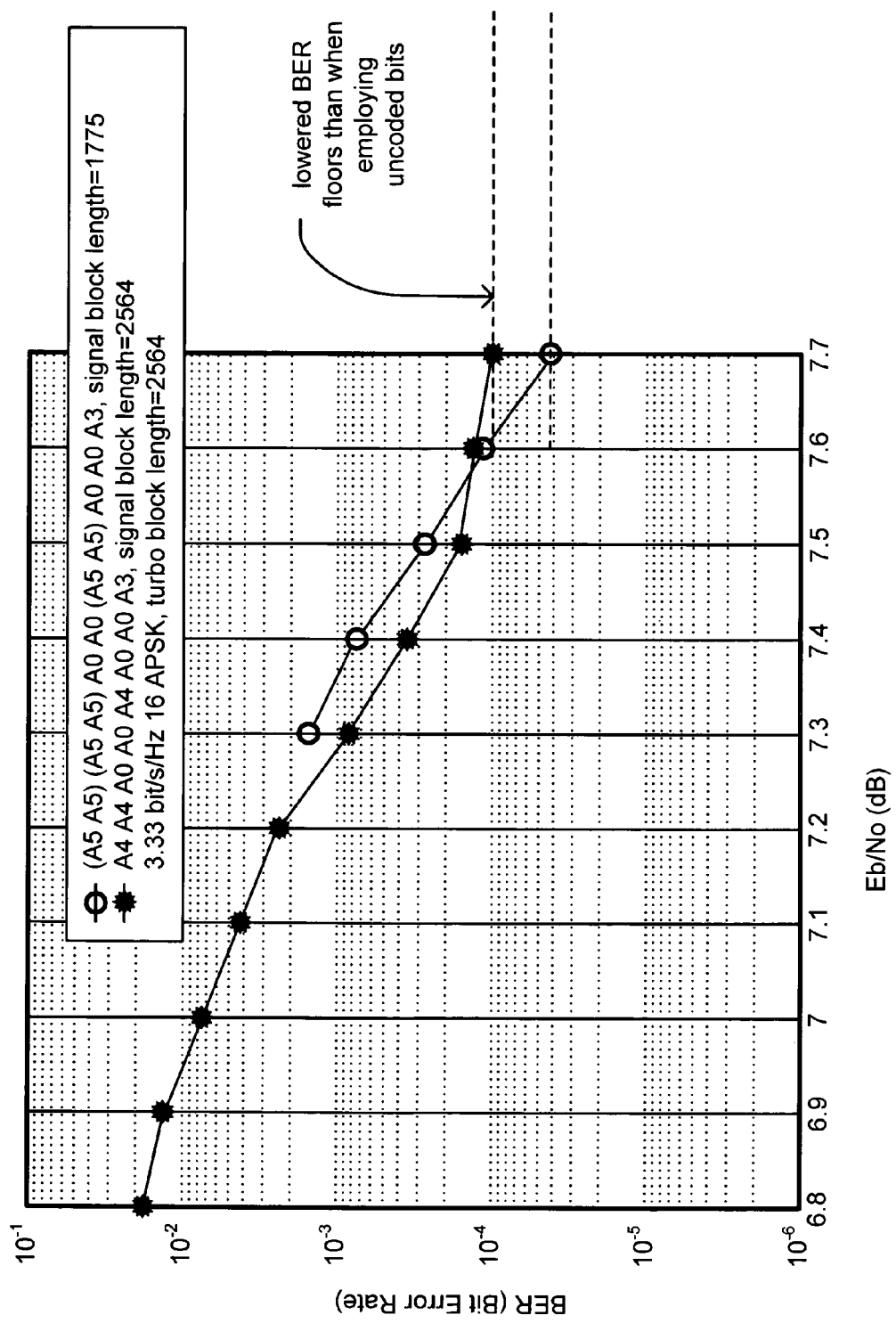
FIG. 34 is a diagram illustrating an embodiment of performance of a 3.33 bit/s/Hz 16 APSK TTCM (shown with 4 decoding iterations) that is supported according to the invention.

FIG. 34 is a diagram illustrating an embodiment of performance of a 3.33 bit/s/Hz 16 APSK TTCM (shown with 4 decoding iterations) that is supported according to the invention. This embodiment corresponds to the performance achieved using the rate control sequence having a period of 9 and including the RCs Q4 Q4 Q0 Q0 Q4 Q4 Q0 Q0 Q3 (or (Q5 Q5) (Q5 Q5) Q0 Q0 (Q5 Q5) (Q5 Q5) Q0 Q0 Q3). Alternatively this embodiment may be viewed as corresponding to the performance achieved using the rate control sequence having a period of 9 and including the RCs A4 A4 A0 A0 A4 A4 A0 A0 A3 (or (A5 A5) (A5 A5) A0 A0 (A5 A5) (A5 A5) A0 A0 A3).

In some of the earlier embodiments, it is pointed out that the rate control sequence having RC Q4 (or A4) has a better performance at the waterfall areas but also has an error floor at higher BERs. It can be seen within the performance curves of the FIG. 33 and the FIG. 34 that rate control sequences that include the RC (Q5 Q5) (or A5 A5) have an error floor at a lower BER.

Clearly, other embodiments of rate control sequences may also be implemented using the various RCs thereby providing for even improved performance without departing from the scope and spirit of the invention.

Figure 35:
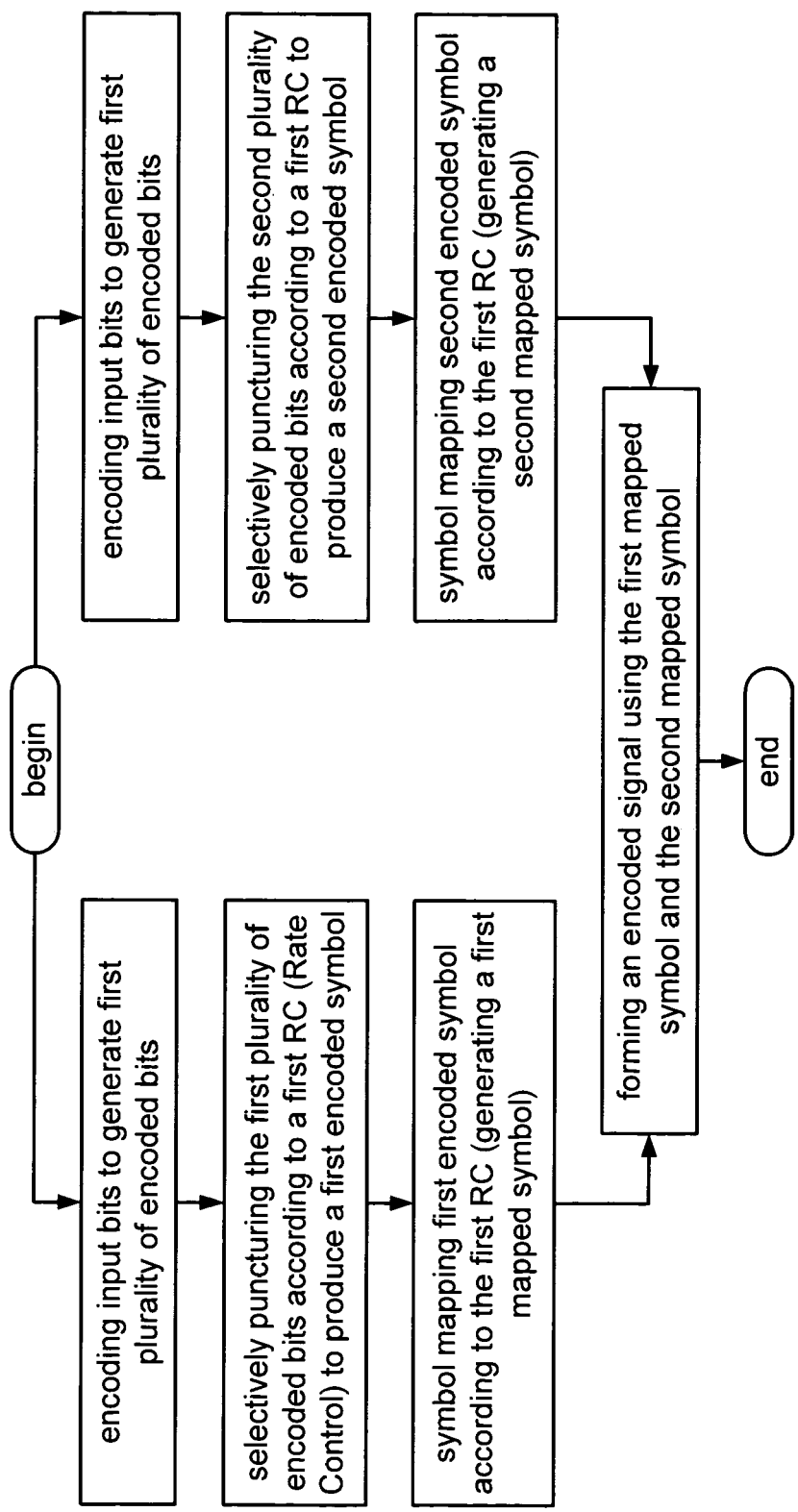
FIG. 35 and FIG. 36 are flowcharts illustrating different embodiments of TTCM (Turbo Trellis Coded Modulation) encoding methods that are performed according to the invention.
Figure 36:
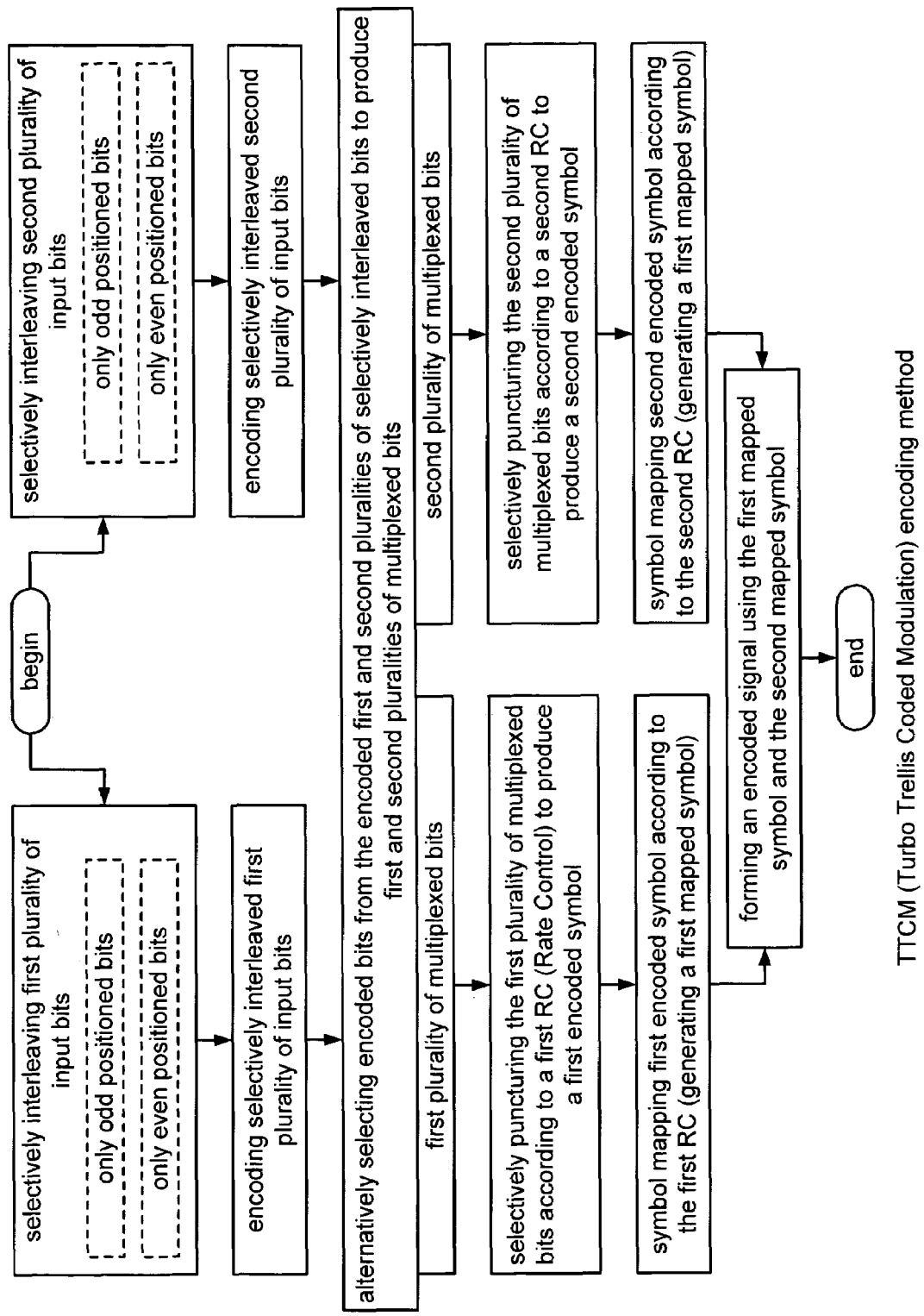

FIG. 35 and FIG. 36 are flowcharts illustrating different embodiments of TTCM (Turbo Trellis Coded Modulation) encoding methods that are performed according to the invention.

Referring to the FIG. 35, the method may be performed by simultaneous, or parallel, operation of several steps. In one of the parallel paths, the method begins by encoding input bits to generate a first plurality of encoded bits. For the first plurality of encoded bits, the method continues by selectively puncturing the first plurality of encoded bits according to a first RC of a rate control sequence to produce a first encoded symbol.

In the other of the parallel paths, the method performs encoding input bits to generate a second plurality of encoded bits. For the second plurality of encoded bits, the method continues by selectively puncturing the second plurality of encoded bits according to a second RC of the rate control sequence to produce a second encoded symbol.

The method finally involves forming an encoded signal using the first mapped symbol and the second mapped symbol such that the encoded signal has a bandwidth efficiency that is greater than approximately 3 bit/s/Hz (bits per second per Hertz).

Referring to the FIG. 36, this method may also be performed by simultaneous, or parallel, operation of several steps. In one of the parallel paths, the method begins by performing selectively interleaving at least some input bits to generate a first plurality of selectively interleaved bits. The method then continues by encoding the first plurality of selectively interleaved bits. In the other parallel path, the method also performs selective interleaving of at least some input bits to generate a second plurality of selectively interleaved bits, and the method continues by encoding the second plurality of selectively interleaved bits.

Now that the method has generated the first plurality of selectively interleaved bits and the second plurality of selectively interleaved bits, the method continues by alternatively selecting encoded bits from the encoded first plurality of selectively interleaved bits and the encoded second plurality of selectively interleaved bits to produce a first plurality of multiplexed bits and a second plurality of multiplexed bits, respectively.

Then, the method continues by performing operations on the first plurality of multiplexed bits and a second plurality of multiplexed bits, respectively. For the first plurality of multiplexed bits, the method continues by selectively puncturing the first plurality of multiplexed bits according to a first RC (Rate Control) of the rate control sequence to produce a first encoded symbol. The first RC of the rate control sequence may correspond to a first modulation that includes a first mapping of either a first 16 QAM (Quadrature Amplitude Modulation) constellation or a first 16 APSK (16 Asymmetric Phase Shift Keying) constellation. The method then continues by performing symbol mapping of the first encoded symbol according to the first RC thereby generating a first mapped symbol.

For the second plurality of multiplexed bits, the method continues by selectively puncturing the second plurality of multiplexed bits according to a second RC of the rate control sequence to produce a second encoded symbol. The second RC of the rate control sequence may correspond to a second modulation that includes a second mapping of either a second 16 QAM constellation or a second 16 APSK constellation. The method then continues by performing symbol mapping of the second encoded symbol according to the second RC thereby generating a second mapped symbol.

The method finally involves forming an encoded signal using the first mapped symbol and the second mapped symbol such that the encoded signal has a bandwidth efficiency that is greater than approximately 3 bit/s/Hz.

It is also noted that the methods described within the preceding figures may also be performed within any of the appropriate system and/or apparatus designs (communication systems, communication transmitters, communication receivers, communication transceivers and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A TTCM (Turbo Trellis Coded Modulation) encoder that encodes a plurality of input bits according to a rate control sequence, the encoder comprising:
a top interleaver operably coupled selectively to interleave at least some input bits of the plurality of input bits;
a top rate ⅔ constituent trellis encoder, communicatively coupled to the top interleaver and operable to receive selectively interleaved bits there from, that is operable to encode the selectively interleaved bits that have been interleaved by the top interleaver;
a bottom interleaver operably coupled selectively to interleave at least some input bits of the plurality of input bits;
a bottom rate ⅔ constituent trellis encoder, communicatively coupled to the bottom interleaver and operable to receive selectively interleaved bits there from, that is operable to encode the selectively interleaved bits that have been interleaved by the bottom interleaver;
a MUX (Multiplexor) that alternatively selects encoded bits that are output from the top rate ⅔ constituent trellis encoder and the bottom rate ⅔ constituent trellis encoder to produce a first plurality of multiplexed bits and a second plurality of multiplexed bits;
a puncturing functional block that is operable selectively to puncture the first plurality of multiplexed bits output from the MUX according to a first RC (Rate Control) of the rate control sequence to produce a first encoded symbol;
wherein the puncturing functional block is operable selectively to puncture the second plurality of multiplexed bits output from the MUX according to a second RC of the rate control sequence to produce a second encoded symbol;
a symbol mapper that maps the first encoded symbol according to the first RC thereby generating a first mapped symbol;
wherein the symbol mapper maps the second encoded symbol according to the second RC thereby generating a second mapped symbol;
wherein the first RC of the rate control sequence corresponds to a first modulation that includes a first mapping of either a first 16 QAM (Quadrature Amplitude Modulation) constellation or a first 16 APSK (16 Asymmetric Phase Shift Keying) constellation;
wherein the second RC of the rate control sequence corresponds to a second modulation that includes a second mapping of either a second 16 QAM constellation or a second 16 APSK constellation;
wherein the first mapped symbol and the second mapped symbol form an encoded signal; and
wherein the encoded signal has a bandwidth efficiency that is greater than approximately 3 bit/s/Hz (bits per second per Hertz).

2. The encoder of claim 1, further comprising:
a rate control sequencer that provides the first RC and the second RC of the rate control sequence to the puncturing functional block and to the symbol mapper.

3. The encoder of claim 1, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 QAM constellation;
the second RC corresponds to the second modulation that includes the second mapping of the second 16 QAM constellation; and
the third RC corresponds to the first modulation that includes the first mapping of the first 16 QAM constellation.

4. The encoder of claim 1, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 QAM constellation;
the second RC corresponds to the second modulation that includes the second mapping of the second 16 QAM constellation; and
the third RC corresponds to a third modulation that includes a first mapping of a first QPSK (Quadrature Phase Shift Key) constellation.

5. The encoder of claim 1, wherein:
the rate control sequence includes a plurality of RCs arranged in a period;
the plurality of RCs arranged in the period includes the first RC, a third RC, the second RC, and a fourth RC;
the first RC corresponds to the first modulation that includes the first mapping of the first 16 QAM constellation;
the second RC corresponds to the second modulation that includes the second mapping of the second 16 QAM constellation;
the third RC corresponds to the first modulation that includes the first mapping of the first 16 QAM constellation; and
the fourth RC corresponds to the second modulation that includes the second mapping of the second 16 QAM constellation.

6. The encoder of claim 1, wherein:
the rate control sequence includes a plurality of RCs arranged in a period;
the first RC corresponds to the first modulation that includes the first mapping of the first 16 APSK constellation;
the second RC corresponds to the second modulation that includes the second mapping of the second 16 APSK constellation; and
the third RC corresponds to the first modulation that includes the first mapping of the first 16 APSK constellation.

7. The encoder of claim 1, wherein:
the rate control sequence includes a plurality of RCs arranged in a period;
the plurality of RCs arranged in the period includes the first RC, a third RC, and the second RC;

the first RC corresponds to the first modulation that includes the first mapping of the first 16 APSK constellation;

the second RC corresponds to the second modulation that includes the second mapping of the second 16 APSK constellation; and the third RC corresponds to a third modulation that includes a first mapping of a first QPSK (Quadrature Phase Shift Key) constellation.

8. The encoder of claim 1, wherein:

the rate control sequence includes a plurality of RCs arranged in a period;

the first RC corresponds to the first modulation that includes the first mapping of the first 16 APSK constellation;

the second RC corresponds to the second modulation that includes the second mapping of the second 16 APSK constellation;

the third RC corresponds to the first modulation that includes the first mapping of the first 16 APSK constellation; and the fourth RC corresponds to the second modulation that includes the second mapping of the second 16 APSK constellation.

9. The encoder of claim 1, wherein:

the first encoded symbol includes 1 uncoded bit; and
the second encoded symbol includes 2 uncoded bits.

10. The encoder of claim 1, wherein:

the top interleaver operably coupled selectively to interleave at least some input bits of the plurality of input bits interleaves only odd positioned bits of the plurality of input bits; and the bottom interleaver operably coupled selectively to interleave at least some input bits of the plurality of input bits interleaves only even positioned bits of the plurality of input bits.

11. The encoder of claim 1, wherein:

the first plurality of multiplexed bits output from the MUX according to the first RC of the rate control sequence includes 4 multiplexed bits;

the puncturing functional block selectively punctures 1 bit of the 4 multiplexed bits; and the puncturing functional block employs the 3 non-punctured bits of the 4 multiplexed bits and 1 uncoded bit to produce the first encoded symbol.

12. The encoder of claim 1, wherein:

the second plurality of multiplexed bits output from the MUX according to the second RC of the rate control sequence includes 4 multiplexed bits;

the puncturing functional block selectively punctures 2 bits of the 4 multiplexed bits; and the puncturing functional block employs the 2 non-punctured bits of the 4 multiplexed bits and 2 uncoded bits to produce the second encoded symbol.

13. The encoder of claim 1, wherein:

the top rate ⅔ constituent trellis encoder is implemented using 2 separate rate ⅔ constituent trellis encoders;

the first plurality of multiplexed bits output from the MUX according to the first RC of the rate control sequence includes 8 multiplexed bits;

the puncturing functional block selectively punctures 4 bits of the 8 multiplexed bits; and the puncturing functional block employs the 4 non-punctured bits of the 8 multiplexed bits to produce the first encoded symbol.

14. The encoder of claim 1, wherein:

the bottom rate ⅔ constituent trellis encoder is implemented using 2 separate rate ⅔ constituent trellis encoders;

the second plurality of multiplexed bits output from the MUX according to the second RC of the rate control sequence includes 8 multiplexed bits;

the puncturing functional block selectively punctures 4 bits of the 8 multiplexed bits; and the puncturing functional block employs the 4 non-punctured bits of the 8 multiplexed bits to produce the second encoded symbol.

15. The encoder of claim 1, wherein:

the encoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, and a fiber-optic communication system.

16. A TTCM (Turbo Trellis Coded Modulation) encoding method that encodes a plurality of input bits according to a rate control sequence, the method comprising:

selectively interleaving at least some input bits of the plurality of input bits to generate a first plurality of selectively interleaved bits;

encoding the first plurality of selectively interleaved bits;

selectively interleaving at least some input bits of the plurality of input bits to generate a second plurality of selectively interleaved bits;

encoding the second plurality of selectively interleaved bits;

alternatively selecting encoded bits from the encoded first plurality of selectively interleaved bits and the encoded second plurality of selectively interleaved bits to produce a first plurality of multiplexed bits and a second plurality of multiplexed bits, respectively;

selectively puncturing the first plurality of multiplexed bits according to a first RC (Rate Control) of the rate control sequence to produce a first encoded symbol, wherein the first RC of the rate control sequence corresponds to a first modulation that includes a first mapping of either a first 16 QAM (Quadrature Amplitude Modulation) constellation or a first 16 APSK (16 Asymmetric Phase Shift Keying) constellation;

selectively puncturing the second plurality of multiplexed bits according to a second RC of the rate control sequence to produce a second encoded symbol, wherein the second RC of the rate control sequence corresponds to a second modulation that includes a second mapping of either a second 16 QAM constellation or a second 16 APSK constellation;

symbol mapping the first encoded symbol according to the first RC thereby generating a first mapped symbol;

symbol mapping the second encoded symbol according to the second RC thereby generating a second mapped symbol; and forming an encoded signal using the first mapped symbol and the second mapped symbol, wherein the encoded signal has a bandwidth efficiency that is greater than approximately 3 bit/s/Hz (bits per second per Hertz).

17. The method of claim 16, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 QAM constellation;
the second RC corresponds to the second modulation that includes the second mapping of the second 16 QAM constellation; and
the third RC corresponds to the first modulation that includes the first mapping of the first 16 QAM constellation.

18. The method of claim 16, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 QAM constellation;
the second RC corresponds to the second modulation that includes the second mapping of the second 16 QAM constellation; and
the third RC corresponds to a third modulation that includes a first mapping of a first QPSK (Quadrature Phase Shift Key) constellation.

19. The method of claim 16, wherein:
the rate control sequence includes a plurality of RCs arranged in a period;
the plurality of RCs arranged in the period includes the first RC, a third RC, the second RC, and a fourth RC;
the first RC corresponds to the first modulation that includes the first mapping of the first 16 QAM constellation;
the second RC corresponds to the second modulation that includes the second mapping of the second 16 QAM constellation;
the third RC corresponds to the first modulation that includes the first mapping of the first 16 QAM constellation; and
the fourth RC corresponds to the second modulation that includes the second mapping of the second 16 QAM constellation.

20. The method of claim 16, wherein:
the rate control sequence includes a plurality of RCs arranged in a period;
the first RC corresponds to the first modulation that includes the first mapping of the first 16 APSK constellation;
the second RC corresponds to the second modulation that includes the second mapping of the second 16 APSK constellation; and
the third RC corresponds to the first modulation that includes the first mapping of the first 16 APSK constellation.

21. The method of claim 16, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 APSK constellation;
the second RC corresponds to the second modulation that includes the second mapping of the second 16 APSK constellation; and
the third RC corresponds to a third modulation that includes a first mapping of a first QPSK (Quadrature Phase Shift Key) constellation.

22. The method of claim 16, wherein:
the rate control sequence includes a plurality of RCs arranged in a period;
the first RC corresponds to the first modulation that includes the first mapping of the first 16 APSK constellation;
the second RC corresponds to the second modulation that includes the second mapping of the second 16 APSK constellation;
the third RC corresponds to the first modulation that includes the first mapping of the first 16 APSK constellation; and
the fourth RC corresponds to the second modulation that includes the second mapping of the second 16 APSK constellation.

23. The method of claim 16, wherein:
the first encoded symbol includes 1 uncoded bit; and
the second encoded symbol includes 2 uncoded bits.

24. The method of claim 16, wherein:
the selectively interleaving of at least some input bits of the plurality of input bits includes interleaving only odd positioned bits of the plurality of input bits; and
the selectively interleaving of at least some input bits of the plurality of input bits includes interleaving only even positioned bits of the plurality of input bits.

25. The method of claim 16, wherein:
the first plurality of multiplexed bits according to the first RC of the rate control sequence includes 4 multiplexed bits;
the selectively puncturing includes puncturing 1 bit of the 4 multiplexed bits; and
employing the 3 non-punctured bits of the 4 multiplexed bits and 1 uncoded bit to produce the first encoded symbol.

26. The method of claim 16, wherein:
the second plurality of multiplexed bits according to the second RC of the rate control sequence includes 4 multiplexed bits;
the selectively puncturing includes puncturing 2 bits of the 4 multiplexed bits; and
employing the 2 non-punctured bits of the 4 multiplexed bits and 2 uncoded bits to produce the second encoded symbol.

27. The method of claim 16, wherein:
the first plurality of multiplexed bits according to the first RC of the rate control sequence includes 8 multiplexed bits;
the selectively puncturing includes puncturing 4 bits of the 8 multiplexed bits; and
employing the 4 non-punctured bits of the 8 multiplexed bits to produce the first encoded symbol.

28. The method of claim 16, wherein:
the second plurality of multiplexed bits according to the second RC of the rate control sequence includes 8 multiplexed bits;
the selectively puncturing includes puncturing 4 bits of the 8 multiplexed bits; and
employing the 4 non-punctured bits of the 8 multiplexed bits to produce the second encoded symbol.

29. The method of claim 16, wherein:
the method is performed within an encoder that is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, and a fiber-optic communication system.

30. A TTCM (Turbo Trellis Coded Modulation) encoder that encodes a plurality of input bits according to a rate control sequence, the encoder comprising:
at least one constituent trellis encoder that is operable to encode the plurality of input bits thereby generating a first plurality of encoded bits and a second plurality of encoded bits;
a puncturing functional block that is operable selectively to puncture the first plurality of encoded bits according to a first RC (Rate Control) of the rate control sequence to produce a first encoded symbol;
wherein the puncturing functional block is operable selectively to puncture the second plurality of encoded bits according to a second RC of the rate control sequence to produce a second encoded symbol;
a symbol mapper that maps the first encoded symbol according to the first RC thereby generating a first mapped symbol;
wherein the symbol mapper maps the second encoded symbol according to the second RC thereby generating a second mapped symbol;
wherein the first RC of the rate control sequence corresponds to a first modulation that includes a first mapping of either a first 16 QAM (Quadrature Amplitude Modulation) constellation or a first 16 APSK (16 Asymmetric Phase Shift Keying) constellation;
wherein the second RC of the rate control sequence corresponds to a second modulation that includes a second mapping of either a second 16 QAM constellation or a second 16 APSK constellation;
wherein the first mapped symbol and the second mapped symbol form an encoded signal; and
wherein the encoded signal has a bandwidth efficiency that is greater than approximately 3 bit/s/Hz (bits per second per Hertz).

31. The encoder of claim 30, further comprising:
a rate control sequencer that provides the first RC and the second RC of the rate control sequence to the puncturing functional block and to the symbol mapper.

32. The encoder of claim 30, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 QAM constellation;
the second RC corresponds to the second modulation that includes the second mapping of the second 16 QAM constellation; and
the third RC corresponds to the first modulation that includes the first mapping of the first 16 QAM constellation.

33. The encoder of claim 30, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 QAM constellation;
the second RC corresponds to the second modulation that includes the second mapping of the second 16 QAM constellation; and
the third RC corresponds to a third modulation that includes a first mapping of a first QPSK (Quadrature Phase Shift Key) constellation.

34. The encoder of claim 30, wherein:
the rate control sequence includes a plurality of RCs arranged in a period;
the plurality of RCs arranged in the period includes the first RC, a third RC, the second RC, and a fourth RC;
the first RC corresponds to the first modulation that includes the first mapping of the first 16 QAM constellation;
the second RC corresponds to the second modulation that includes the second mapping of the second 16 QAM constellation;
the third RC corresponds to the first modulation that includes the first mapping of the first 16 QAM constellation; and
the fourth RC corresponds to the second modulation that includes the second mapping of the second 16 QAM constellation.

35. The encoder of claim 30, wherein:
the rate control sequence includes a plurality of RCs arranged in a period;
the first RC corresponds to the first modulation that includes the first mapping of the first 16 APSK constellation;
the second RC corresponds to the second modulation that includes the second mapping of the second 16 APSK constellation; and
the third RC corresponds to the first modulation that includes the first mapping of the first 16 APSK constellation.

36. The encoder of claim 30, wherein:
the rate control sequence includes a plurality of RCs arranged in a period;
the plurality of RCs arranged in the period includes the first RC, a third RC, and the second RC;
the first RC corresponds to the first modulation that includes the first mapping of the first 16 APSK constellation;
the second RC corresponds to the second modulation that includes the second mapping of the second 16 APSK constellation; and
the third RC corresponds to a third modulation that includes a first mapping of a first QPSK (Quadrature Phase Shift Key) constellation.

37. The encoder of claim 30, wherein:
the rate control sequence includes a plurality of RCs arranged in a period;
the first RC corresponds to the first modulation that includes the first mapping of the first 16 APSK constellation;
the second RC corresponds to the second modulation that includes the second mapping of the second 16 APSK constellation;

the third RC corresponds to the first modulation that includes the first mapping of the first 16 APSK constellation; and the fourth RC corresponds to the second modulation that includes the second mapping of the second 16 APSK constellation.

38. The encoder of claim 30, wherein:

the first encoded symbol includes 1 uncoded bit; and
the second encoded symbol includes 2 uncoded bits.

39. The encoder of claim 30, wherein:

the at least one constituent trellis encoder is a top rate 2/4 constituent trellis encoder;
the first plurality of encoded bits according to the first RC of the rate control sequence includes 4 encoded bits;
the puncturing functional block selectively punctures 1 bit of the 4 encoded bits; and
the puncturing functional block employs the 3 non-punctured bits of the 4 encoded bits and 1 uncoded bit to produce the first encoded symbol.

40. The encoder of claim 30, wherein:

the at least one constituent trellis encoder is a bottom rate 2/4 constituent trellis encoder;
the second plurality of encoded bits according to the second RC of the rate control sequence includes 4 encoded bits;
the puncturing functional block selectively punctures 2 bits of the 4 encoded bits; and
the puncturing functional block employs the 2 non-punctured bits of the 4 encoded bits and 2 uncoded bits to produce the second encoded symbol.

41. The encoder of claim 30, wherein:

the at least one constituent trellis encoder is a top rate 2/4 constituent trellis encoder that is implemented using 2 separate rate 2/4 constituent trellis encoders;
the first plurality of encoded bits according to the first RC of the rate control sequence includes 8 encoded bits;
the puncturing functional block selectively punctures 4 bits of the 8 encoded bits; and
the puncturing functional block employs the 4 non-punctured bits of the 8 encoded bits to produce the first encoded symbol.

42. The encoder of claim 30, wherein:

the at least one constituent trellis encoder is a bottom rate 2/4 constituent trellis encoder that is implemented using 2 separate rate 2/4 constituent trellis encoders;
the second plurality of encoded bits according to the second RC of the rate control sequence includes 8 encoded bits;
the puncturing functional block selectively punctures 4 bits of the 8 encoded bits; and
the puncturing functional block employs the 4 non-punctured bits of the 8 encoded bits to produce the second encoded symbol.

43. The encoder of claim 30, wherein:

the encoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, and a fiber-optic communication system.

44. A TTCM (Turbo Trellis Coded Modulation) encoder that encodes a plurality of input bits according to a rate control sequence, the encoder comprising:

at least one constituent trellis encoder that is operable to encode the plurality of input bits thereby generating a first plurality of encoded bits, a second plurality of encoded bits, and a third plurality of encoded bits;

a puncturing functional block that is operable selectively to puncture the first plurality of encoded bits according to a first RC (Rate Control) of the rate control sequence to produce a first encoded symbol;

wherein the puncturing functional block is operable selectively to puncture the second plurality of encoded bits according to a second RC of the rate control sequence to produce a second encoded symbol;

wherein the puncturing functional block is operable selectively to puncture the third plurality of encoded bits according to a third RC of the rate control sequence to produce a third encoded symbol;

a symbol mapper that maps the first encoded symbol according to the first RC thereby generating a first mapped symbol;

wherein the symbol mapper maps the second encoded symbol according to the second RC thereby generating a second mapped symbol;

wherein the symbol mapper maps the third encoded symbol according to the third RC thereby generating a third mapped symbol;

wherein the first RC of the rate control sequence corresponds to a first modulation that includes a first mapping of either a first 16 QAM (Quadrature Amplitude Modulation) constellation or a first 16 APSK (16 Asymmetric Phase Shift Keying) constellation;

wherein the second RC of the rate control sequence corresponds to a second modulation that includes a second mapping of either a second 16 QAM constellation or a second 16 APSK constellation;

wherein the third RC of the rate control sequence corresponds to a third modulation that includes a first mapping of a first QPSK (Quadrature Phase Shift Key) constellation;

wherein the first mapped symbol, the second mapped symbol, and the third mapped symbol form an encoded signal; and wherein the encoded signal has a bandwidth efficiency that is greater than approximately 3 bit/s/Hz (bits per second per Hertz).

45. The encoder of claim 44, further comprising:

a rate control sequencer that provides the first RC and the second RC of the rate control sequence to the puncturing functional block and to the symbol mapper.

46. The encoder of claim 44, wherein:

the rate control sequence includes 9 RCs arranged in a period;
the 9 RCs arranged in the period include the first RC, 7 occurrences of the second RC, and the third RC;
the first RC corresponds to the first modulation that includes the first mapping of the first 16 QAM constellation;
the second RC corresponds to the second modulation that includes the second mapping of the second 16 QAM constellation; and
the third RC corresponds to the third modulation that includes the first mapping of the first QPSK constellation.

47. The encoder of claim 44, wherein:
the rate control sequence includes 9 RCs arranged in a period;
the 9 RCs arranged in the period include the first RC, 3 occurrences of the second RC, an additional occurrence of the first RC, 3 additional occurrences of the second RC, and the third RC;
the first RC corresponds to the first modulation that includes the first mapping of the first 16 QAM constellation;
the second RC corresponds to the second modulation that includes the second mapping of the second 16 QAM constellation; and
the third RC corresponds to the third modulation that includes the first mapping of the first QPSK constellation.

48. The encoder of claim 44, wherein:
the rate control sequence includes 9 RCs arranged in a period;
the 9 RCs arranged in the period include 2 occurrences of the first RC, 2 occurrences of the second RC, 2 additional occurrences of the first RC, 2 additional occurrences of the second RC, and the third RC;
the first RC corresponds to the first modulation that includes the first mapping of the first 16 QAM constellation;
the second RC corresponds to the second modulation that includes the second mapping of the second 16 QAM constellation; and
the third RC corresponds to the third modulation that includes the first mapping of the first QPSK constellation.

49. The encoder of claim 44, wherein:
the rate control sequence includes 9 RCs arranged in a period;
the 9 RCs arranged in the period include the first RC, 7 occurrences of the second RC, and the third RC;
the first RC corresponds to the first modulation that includes the first mapping of the first 16 APSK constellation;
the second RC corresponds to the second modulation that includes the second mapping of the second 16 APSK constellation; and
the third RC corresponds to the third modulation that includes the first mapping of the first QPSK constellation.

50. The encoder of claim 44, wherein:
the rate control sequence includes 9 RCs arranged in a period;
the 9 RCs arranged in the period include the first RC, 3 occurrences of the second RC, an additional occurrence of the first RC, 3 additional occurrences of the second RC, and the third RC;
the first RC corresponds to the first modulation that includes the first mapping of the first 16 APSK constellation;
the second RC corresponds to the second modulation that includes the second mapping of the second 16 APSK constellation; and
the third RC corresponds to the third modulation that includes the first mapping of the first QPSK constellation.

51. The encoder of claim 44, wherein:
the rate control sequence includes 9 RCs arranged in a period;
the 9 RCs arranged in the period include 2 occurrences of the first RC, 2 occurrences of the second RC, 2 additional occurrences of the first RC, 2 additional occurrences of the second RC, and the third RC;
the first RC corresponds to the first modulation that includes the first mapping of the first 16 APSK constellation;
the second RC corresponds to the second modulation that includes the second mapping of the second 16 APSK constellation; and
the third RC corresponds to the third modulation that includes the first mapping of the first QPSK constellation.

52. The encoder of claim 44, wherein:
the first encoded symbol includes 1 uncoded bit; and
the second encoded symbol includes 2 uncoded bits.

53. The encoder of claim 44, wherein:
the at least one constituent trellis encoder is a top rate $2/4$ constituent trellis encoder;
the first plurality of encoded bits according to the first RC of the rate control sequence includes 4 encoded bits;
the puncturing functional block selectively punctures 1 bit of the 4 encoded bits; and
the puncturing functional block employs the 3 non-punctured bits of the 4 encoded bits and 1 uncoded bit to produce the first encoded symbol.

54. The encoder of claim 44, wherein:
the at least one constituent trellis encoder is a bottom rate $2/4$ constituent trellis encoder;
the second plurality of encoded bits according to the second RC of the rate control sequence includes 4 encoded bits;
the puncturing functional block selectively punctures 2 bits of the 4 encoded bits; and
the puncturing functional block employs the 2 non-punctured bits of the 4 encoded bits and 2 uncoded bits to produce the second encoded symbol.

55. The encoder of claim 44, wherein:
the at least one constituent trellis encoder is a top rate $2/4$ constituent trellis encoder that is implemented using 2 separate rate $2/4$ constituent trellis encoders;
the first plurality of encoded bits according to the first RC of the rate control sequence includes 8 encoded bits;
the puncturing functional block selectively punctures 4 bits of the 8 encoded bits; and
the puncturing functional block employs the 4 non-punctured bits of the 8 encoded bits to produce the first encoded symbol.

56. The encoder of claim 44, wherein:
the at least one constituent trellis encoder is a bottom rate $2/4$ constituent trellis encoder that is implemented using 2 separate rate $2/4$ constituent trellis encoders;
the second plurality of encoded bits according to the second RC of the rate control sequence includes 8 encoded bits;
the puncturing functional block selectively punctures 4 bits of the 8 encoded bits; and
the puncturing functional block employs the 4 non-punctured bits of the 8 encoded bits to produce the second encoded symbol.

57. The encoder of claim 44, wherein:
the encoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, and a fiber-optic communication system.

* * * * *

UNITED STATES PATENT AND TRADEMARK OFFICE
CERTIFICATE OF CORRECTION

PATENT NO. : 7,062,700 B2
APPLICATION NO. : 10/636008
DATED : June 13, 2006
INVENTOR(S) : Ba-Zhong Shen et al.

It is certified that error appears in the above-identified patent and that said Letters Patent is hereby corrected as shown below:

Column 31, line 5: delete "bandwidths" after "greater"

Signed and Sealed this

First Day of July, 2008

JON W. DUDAS
*Director of the United States Patent and Trademark Office*